(12) United States Patent
Ishisone et al.

(10) Patent No.: US 10,756,286 B2
(45) Date of Patent: Aug. 25, 2020

(54) LIGHT-EMITTING ELEMENT, DISPLAY DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Takahiro Ishisone, Atsugi (JP); Satoshi Seo, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 482 days.

(21) Appl. No.: 15/498,692

(22) Filed: Apr. 27, 2017

(65) Prior Publication Data
US 2017/0324055 A1    Nov. 9, 2017

(30) Foreign Application Priority Data

May 6, 2016 (JP) .................. 2016-093149

(51) Int. Cl.
*H01L 51/50* (2006.01)
*H01L 51/00* (2006.01)

(52) U.S. Cl.
CPC ...... *H01L 51/5028* (2013.01); *H01L 51/5016* (2013.01); *H01L 51/006* (2013.01); *H01L 51/0052* (2013.01); *H01L 51/0058* (2013.01); *H01L 51/0061* (2013.01); *H01L 51/0067* (2013.01); *H01L 51/0072* (2013.01); *H01L 51/0074* (2013.01); *H01L 51/0085* (2013.01);
(Continued)

(58) Field of Classification Search
None
See application file for complete search history.

(56) References Cited

U.S. PATENT DOCUMENTS 6,863,997 B2  3/2005 Thompson et al.
6,869,695 B2  3/2005 Thompson et al.
(Continued)

FOREIGN PATENT DOCUMENTS

EP    1202608 A    5/2002
JP    2005-514754   5/2005
(Continued)

OTHER PUBLICATIONS

T.Sajoto et al., "Temperature Dependence of Blue Phosphorescent Cyclometalated Ir(III) Complexes", J. Am. Chem. Soc. 2009 (Journal of the American Chemical Society), vol. 131, No. 28, pp. 9813-9822.
(Continued)

*Primary Examiner* — Jay Yang
(74) *Attorney, Agent, or Firm* — Robinson Intellectual Property Law Office; Eric J. Robinson

(57) ABSTRACT

A light-emitting element with high luminous efficiency is provided. The light-emitting element contains a first organic compound and a second organic compound. The first and second organic compounds form an exciplex. The first organic compound emits no fluorescence but phosphorescence at a temperature ranging from low temperature to normal temperature. The luminescence quantum yield of the first organic compound is higher than or equal to 0% and lower than or equal to 40% at room temperature. Light emitted from the light-emitting element includes light emitted from an exciplex formed by the first organic compound and the second organic compound.

21 Claims, 48 Drawing Sheets

(52) U.S. Cl.
CPC .......... *H01L 2251/5376* (2013.01); *H01L 2251/5384* (2013.01); *H01L 2251/552* (2013.01); *H01L 2251/556* (2013.01)

(56) References Cited

U.S. PATENT DOCUMENTS

| | | |
|---|---|---|
| 6,951,694 B2 | 10/2005 | Thompson et al. |
| 7,175,922 B2 | 2/2007 | Jarikov et al. |
| 7,183,010 B2 | 2/2007 | Jarikov |
| 7,332,857 B2 | 2/2008 | Seo et al. |
| 7,553,557 B2 | 6/2009 | Thompson et al. |
| 7,597,967 B2 | 10/2009 | Kondakova et al. |
| 7,993,760 B2 | 8/2011 | Komori et al. |
| 8,034,465 B2 | 10/2011 | Liao et al. |
| 8,274,214 B2 | 9/2012 | Ikeda et al. |
| 8,853,680 B2 | 10/2014 | Yamazaki et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,159,942 B2 | 10/2015 | Seo et al. |
| 9,175,213 B2 | 11/2015 | Seo et al. |
| 9,356,250 B2 | 5/2016 | Ohsawa et al. |
| 9,362,517 B2 | 6/2016 | Ohsawa et al. |
| 9,604,928 B2 | 3/2017 | Shitagaki et al. |
| 2003/0175553 A1 | 9/2003 | Thompson et al. |
| 2004/0253478 A1 | 12/2004 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2007/0090756 A1 | 4/2007 | Okada et al. |
| 2012/0217487 A1 | 8/2012 | Yamazaki et al. |
| 2012/0235127 A1 | 9/2012 | Takasu et al. |
| 2014/0034932 A1 | 2/2014 | Seo et al. |
| 2015/0069352 A1 | 3/2015 | Kim et al. |

FOREIGN PATENT DOCUMENTS

| | | |
|---|---|---|
| JP | 2008-288344 A | 11/2008 |
| JP | 2014-045184 | 3/2014 |

OTHER PUBLICATIONS

N.Matsumoto et al., "Exciplex Formations between Tris(8-hydoxyquinolate) aluminum and Hole Transport Materials and Their Photoluminescence and Electroluminescence Characteristics", J. Phys. Chem. C 2008 (Journal of Physical Chemistry C), vol. 112, No. 20, pp. 7735-7741.

Yersin.H et al., Highly Efficient OLEDs with Phosphorescent Materials, 2008, pp. 1-97,283-309.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(plc)(FIrplc):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

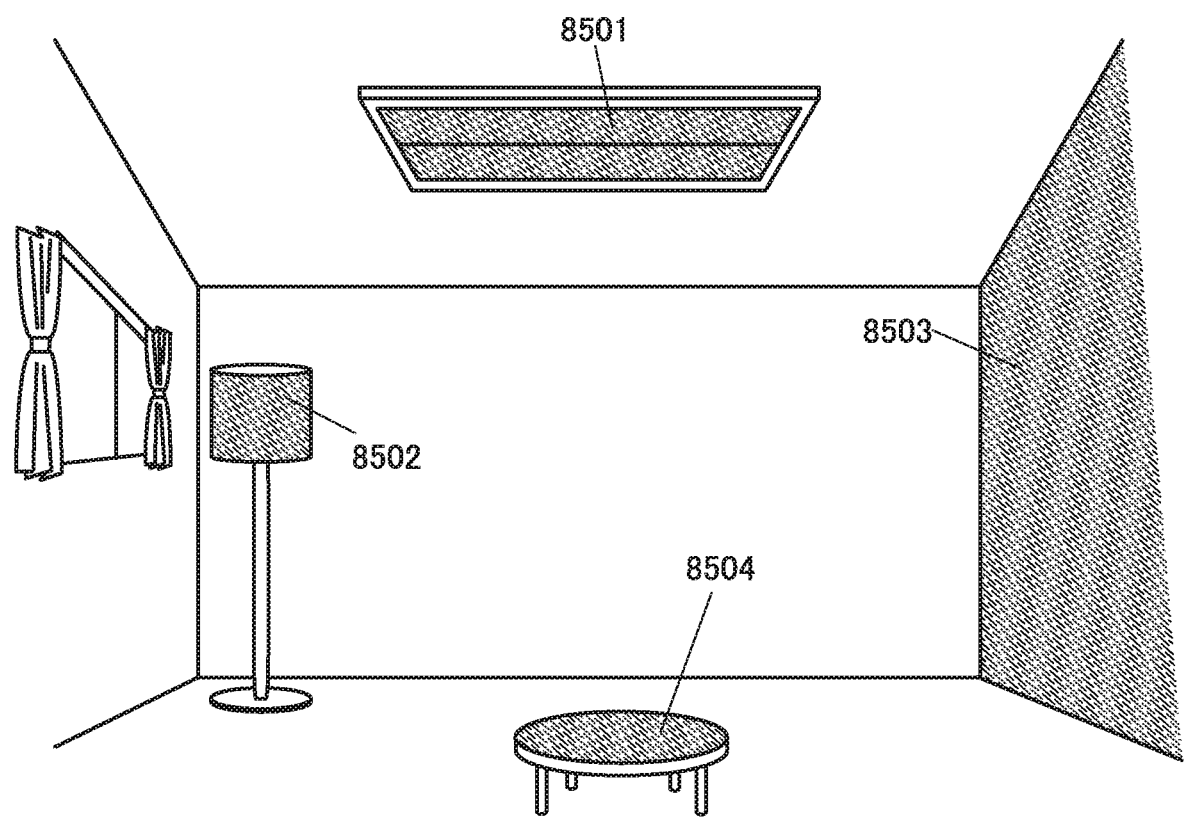

LIGHT-EMITTING ELEMENT, DISPLAY DEVICE, ELECTRONIC DEVICE, AND LIGHTING DEVICE

BACKGROUND OF THE INVENTION

1. Field of the Invention

One embodiment of the present invention relates to a light-emitting element, a display device including the light-emitting element, an electronic device including the light-emitting element, or a lighting device including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

In recent years, research and development of light-emitting elements using electroluminescence (EL) have been actively conducted. In the basic structure of such a light-emitting element, a layer containing a light-emitting substance (an EL layer) is provided between a pair of electrodes. Voltage application between the electrodes of this element can cause light emission from the light-emitting substance.

Since the above light-emitting element is a self-luminous type, a display device using this light-emitting element has advantages such as high visibility, no necessity of a backlight, and low power consumption. The light-emitting element also has advantages in that, for example, it can be manufactured to be thin and lightweight, and has high response speed.

In a light-emitting element (e.g., an organic EL element) whose EL layer contains a light-emitting organic compound as a light-emitting substance and is provided between a pair of electrodes, voltage application between the pair of electrodes causes injection of electrons from a cathode and holes from an anode into the EL layer having a light-emitting property; thus, current flows. By recombination of the injected electrons and holes, the light-emitting organic compound is brought into an excited state to provide emission.

Excited states that can be formed by an organic compound are a singlet excited state (S*) and a triplet excited state (T*). Light emission from the singlet excited state is referred to as fluorescence, and light emission from the triplet excited state is referred to as phosphorescence. The formation ratio of S* to T* in a light-emitting element is 1:3. Thus, a light-emitting element containing a compound that emits phosphorescence (phosphorescent compound) has higher luminous efficiency than a light-emitting element containing a compound that emits fluorescence (fluorescent compound). For this reason, light-emitting elements containing phosphorescent compounds capable of converting triplet excitation energy into light emission have been actively developed in recent years. In Non-Patent Document 1, for example, the temperature dependence of the luminescence quantum yield of an Ir complex, which is a phosphorescent compound, is investigated in detail to find the relationship between the molecular structure of an Ir complex and its luminescence quantum yield and the reason thereof.

As a material capable of partly converting triplet excitation energy into light emission, a thermally activated delayed fluorescent (TADF) material is known in addition to a phosphorescent compound. In a thermally activated delayed fluorescent material, a singlet excited state is generated from a triplet excited state by reverse intersystem crossing, and the singlet excited state is converted into light emission.

Patent Document 1, for example, discloses a method in which an exciplex formed by two kinds of organic compounds is used as a thermally activated delayed fluorescent material because the energy difference between a singlet excited state and a triplet excited state is small.

REFERENCE

Patent Document

[Patent Document 1] Japanese Published Patent Application No. 2014-045184

Non-Patent Document

[Non-Patent Document 1] T. Sajoto and five others, *Journal of American Chemical Society*, vol. 131, 9813 (2009).

SUMMARY OF THE INVENTION

To increase the luminous efficiency of a light-emitting element containing a thermally activated delayed fluorescent material, efficient generation of a singlet excited state from a triplet excited state is preferable. A method for efficiently generating a singlet excited state from a triplet excited state in a light-emitting element in which an exciplex is used as a thermally activated delayed fluorescent material needs to be developed to further improve the luminous efficiency of the light-emitting element.

In view of the above, an object of one embodiment of the present invention is to provide a light-emitting element with high luminous efficiency. Another object of one embodiment of the present invention is to provide a light-emitting element with low driving voltage. Another object of one embodiment of the present invention is to provide a light-emitting element with low power consumption. Another object of one embodiment of the present invention is to provide a highly reliable light-emitting element. Another object of one embodiment of the present invention is to provide a novel light-emitting element. Another object of one embodiment of the present invention is to provide a novel light-emitting device. Another object of one embodiment of the present invention is to provide a novel display device.

Note that the description of the above objects does not preclude the existence of other objects. In one embodiment of the present invention, there is no need to achieve all the objects. Objects other than the above objects will be apparent from and can be derived from the description of the specification and the like.

One embodiment of the present invention is a light-emitting element containing two kinds of organic compounds that form an exciplex. One of the organic compounds has a function of converting triplet excitation energy into light emission.

One embodiment of the present invention is a light-emitting element including a light-emitting layer. The light-emitting layer contains a first organic compound and a second organic compound. A LUMO level of one of the first organic compound and the second organic compound is higher than or equal to a LUMO level of the other of the first organic compound and the second organic compound. A HOMO level of the one of the first organic compound and the second organic compound is higher than or equal to a HOMO level of the other of the first organic compound and the second organic compound. A combination of the first organic compound and the second organic compound is capable of forming an exciplex. The first organic compound is capable of converting triplet excitation energy into light emission at a temperature higher than or equal to 77 K and lower than or equal to 313 K. The first organic compound has a luminescence quantum yield higher than or equal to 0% and lower than or equal to 40% at room temperature. Light emitted from the light-emitting layer includes light emitted from the exciplex.

Another embodiment of the present invention is a light-emitting element including a light-emitting layer. The light-emitting layer contains a first organic compound and a second organic compound. A LUMO level of one of the first organic compound and the second organic compound is higher than or equal to a LUMO level of the other of the first organic compound and the second organic compound. A HOMO level of the one of the first organic compound and the second organic compound is higher than or equal to a HOMO level of the other of the first organic compound and the second organic compound. A combination of the first organic compound and the second organic compound is capable of forming an exciplex. The first organic compound is capable of emitting no fluorescence and emitting phosphorescence at a temperature higher than or equal to 77 K and lower than or equal to 313 K. The first organic compound has a luminescence quantum yield higher than or equal to 0% and lower than or equal to 40% at room temperature. Light emitted from the light-emitting layer includes light emitted from the exciplex.

Another embodiment of the present invention is a light-emitting element including a light-emitting layer. The light-emitting layer contains a first organic compound and a second organic compound. A LUMO level of one of the first organic compound and the second organic compound is higher than or equal to a LUMO level of the other of the first organic compound and the second organic compound. A HOMO level of the one of the first organic compound and the second organic compound is higher than or equal to a HOMO level of the other of the first organic compound and the second organic compound. A combination of the first organic compound and the second organic compound is capable of forming an exciplex. The first organic compound contains Ru, Rh, Pd, Os, Ir, or Pt. The first organic compound has a luminescence quantum yield higher than or equal to 0% and lower than or equal to 40% at room temperature. Light emitted from the light-emitting layer includes light emitted from the exciplex.

In any of the above structures, a lowest triplet excitation energy level of the first organic compound is preferably higher than or equal to a lowest triplet excitation energy level of the second organic compound.

In any of the above structures, the first organic compound preferably contains Ir. The first organic compound preferably includes a ligand coordinated to the Ir. The ligand preferably includes a nitrogen-containing five-membered heterocyclic skeleton.

In any of the above structures, the second organic compound is preferably capable of transporting an electron. The second organic compound preferably includes a π-electron deficient heteroaromatic skeleton.

In any of the above structures, luminous efficiency of the light emitted from the exciplex is preferably higher than luminous efficiency of light emitted from the first organic compound.

Another embodiment of the present invention is a display device including the light-emitting element having any of the above structures and at least one of a color filter and a transistor. Another embodiment of the present invention is an electronic device including the display device and at least one of a housing and a touch sensor. Another embodiment of the present invention is a lighting device including the light-emitting element having any of the above structures and at least one of a housing and a touch sensor. The category of one embodiment of the present invention includes not only a light-emitting device including a light-emitting element but also an electronic device including a light-emitting device. Accordingly, the light-emitting device in this specification refers to an image display device or a light source (including a lighting device). The light-emitting device may include, in its category, a display module in which a connector such as a flexible printed circuit (FPC) or a tape carrier package (TCP) is connected to a light-emitting element, a display module in which a printed wiring board is provided on the tip of a TCP, or a display module in which an integrated circuit (IC) is directly mounted on a light-emitting element by a chip on glass (COG) method.

One embodiment of the present invention can provide a light-emitting element with high luminous efficiency. One embodiment of the present invention can provide a light-emitting element with low driving voltage. One embodiment of the present invention can provide a light-emitting element with low power consumption. One embodiment of the present invention can provide a highly reliable light-emitting element. One embodiment of the present invention can provide a novel light-emitting element. One embodiment of the present invention can provide a novel light-emitting device. One embodiment of the present invention can provide a novel display device.

Note that the description of these effects does not preclude the existence of other effects. One embodiment of the present invention does not necessarily have all the effects described above. Other effects will be apparent from and can be derived from the description of the specification, the drawings, the claims, and the like.

BRIEF DESCRIPTION OF THE DRAWINGS

FIG. 14 illustrates lighting devices of one embodiment of the present invention.

DETAILED DESCRIPTION OF THE INVENTION

Figure 1:
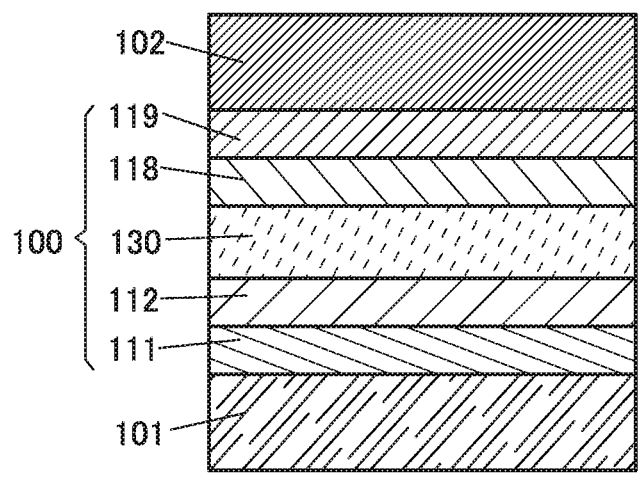
FIG. 1 is a schematic cross-sectional view of a light-emitting element of one embodiment of the present invention.

Embodiments of the present invention will be described in detail below with reference to the drawings. However, the present invention is not limited to the following description, and the mode and details can be variously changed unless departing from the scope and spirit of the present invention. Accordingly, the present invention should not be interpreted as being limited to the content of the embodiments and examples below.

Note that the position, size, range, or the like of each component illustrated in the drawings and the like are not accurately represented in some cases for easy understanding. Therefore, the disclosed invention is not necessarily limited to the position, size, range, or the like as disclosed in the drawings and the like.

Note that the ordinal numbers such as "first," "second," and the like in this specification and the like are used for convenience and do not denote the order of steps or the stacking order of layers. Therefore, for example, description can be made even when "first" is replaced with "second" or "third," as appropriate. In addition, the ordinal numbers in this specification and the like are not necessarily the same as those which specify one embodiment of the present invention.

In the description of modes of the present invention in this specification and the like with reference to the drawings, the same components in different diagrams are denoted by the same reference numeral in some cases.

In this specification and the like, the terms "film" and "layer" can be interchanged with each other. For example, the term "conductive layer" can be changed into the term "conductive film" in some cases. Furthermore, the term "insulating film" can be changed into the term "insulating layer" in some cases.

In this specification and the like, a singlet excited state (S*) refers to a singlet state having excitation energy. An S1 level refers to the lowest level of the singlet excitation energy level, that is, the excitation energy level of the lowest singlet excited state (S1 state). A triplet excited state (T*)

refers to a triplet state having excitation energy. A T1 level refers to the lowest level of the triplet excitation energy level, that is, the excitation energy level of the lowest triplet excited state (T1 state). Note that in this specification and the like, simple expressions "singlet excited state" and "singlet excitation energy level" mean the S1 state and the S1 level, respectively, in some cases. In addition, expressions "triplet excited state" and "triplet excitation energy level" mean the T1 state and the T1 level, respectively, in some cases.

In this specification and the like, a fluorescent compound refers to a compound that emits light in a visible light region when the relaxation from a singlet excited state to a ground state occurs. A phosphorescent compound refers to a compound that emits light in a visible light region at room temperature when the relaxation from a triplet excited state to a ground state occurs. That is, a phosphorescent compound refers to a compound that can convert triplet excitation energy into visible light.

Note that "room temperature" in this specification and the like is a temperature ranging from 0° C. to 40° C.

In this specification and the like, a wavelength range of blue refers to a wavelength range which is greater than or equal to 400 nm and less than 490 nm, and blue light emission has at least one emission spectrum peak in the wavelength range. A wavelength range of green refers to a wavelength range which is greater than or equal to 490 nm and less than 580 nm, and green light emission has at least one emission spectrum peak in the wavelength range. A wavelength range of red refers to a wavelength range which is greater than or equal to 580 nm and less than or equal to 680 nm, and red light emission has at least one emission spectrum peak in the wavelength range.

Embodiment 1

In this embodiment, a light-emitting element of one embodiment of the present invention will be described below with reference to FIG. 1, FIGS. 2A to 2C, FIGS. 3A to 3C, and FIGS. 4A and 4B.

<Structure Example 1 of Light-Emitting Element>

First, the structure of the light-emitting element of one embodiment of the present invention will be described below with reference to FIG. 1.

FIG. 1 is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1 includes functional layers such as a hole-injection layer 111, a hole-transport layer 112, an electron-transport layer 118, and an electron-injection layer 119, in addition to the light-emitting layer 130.

Although description in this embodiment is given assuming that the electrode 101 and the electrode 102 of the pair of electrodes serve as an anode and a cathode, respectively, they are not limited thereto for the structure of the light-emitting element 150. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1, as long as at least one of the hole-injection layer 111, the hole-transport layer 112, the electron-transport layer 118, and the electron-injection layer 119 is included. Alternatively, the EL layer 100 may include a functional layer which has a function of lowering a hole- or electron-injection barrier, improving a hole- or electron-transport property, inhibiting a hole- or electron-transport property, or suppressing quenching by an electrode, for example. Note that the functional layer can be either a single layer or stacked layers.

<Light Emission Mechanism 1 of Light-Emitting Element>

Next, the light emission mechanism of the light-emitting layer 130 will be described below.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, excitons are formed. The ratio (generation probability) of singlet excitons to triplet excitons which are generated by recombination of carriers (electrons and holes) is 1:3 according to the statistically obtained probability. In other words, the generation probability of singlet excitons is 25% and the generation probability of triplet excitons is 75%. Thus, it is important to make the triplet excitons contribute to light emission in order to improve the luminous efficiency of the light-emitting element. For this reason, a material that has a function of converting triplet excitation energy into light emission is preferably used as a light-emitting material for the light-emitting layer 130.

As the material that has a function of converting triplet excitation energy into light emission, a compound that can emit phosphorescence (hereinafter, also referred to as a phosphorescent compound) can be given. A phosphorescent compound in this specification and the like is a compound that emits phosphorescence and no fluorescence at a temperature higher than or equal to a low temperature (e.g., 77 K) and lower than or equal to room temperature (i.e., higher than or equal to 77 K and lower than or equal to 313 K). The phosphorescent compound preferably contains a heavy atom in order to efficiently convert triplet excitation energy into light emission. In the case where the phosphorescent compound contains a heavy atom, intersystem crossing between a singlet state and a triplet state is promoted by spin-orbit interaction (interaction between spin angular momentum and orbital angular momentum of an electron), and transition between a singlet ground state and a triplet excited state of the phosphorescent compound is allowed. This means that the probability of transition between the singlet ground state and the triplet excited state of the phosphorescent compound is increased; thus, the luminous efficiency and the absorption probability which relate to the transition can be increased. Accordingly, the phosphorescent compound preferably contains a metal element with large spin-orbit interaction, specifically, a transition metal element. It is particularly preferable that a platinum group element (ruthenium (Ru), rhodium (Rh), palladium (Pd), osmium (Os), iridium (Ir), or platinum (Pt)), especially iridium, be contained because the probability of direct transition between a singlet ground state and a triplet excited state can be increased.

As the material that has a function of converting triplet excitation energy into light emission, a thermally activated delayed fluorescent (TADF) material can also be given. Note that the thermally activated delayed fluorescent material is a material having a small difference between the T1 level and the S1 level and having a function of converting triplet excitation energy into singlet excitation energy by reverse intersystem crossing. Thus, the thermally activated delayed fluorescent material can upconvert triplet excitation energy into singlet excitation energy (i.e., reverse intersystem crossing) using a little thermal energy and can efficiently exhibit light (fluorescence) emission from a singlet excited state. An exciplex (excited complex) has an extremely small difference between the S1 level and the T1 level and functions as a thermally activated delayed fluorescent material that can convert part of triplet excitation energy into light emission.

In one embodiment of the present invention, an exciplex formed by two kinds of materials is used as the light-emitting material for the light-emitting layer 130. One of the two kinds of materials is a compound that has a function of converting triplet excitation energy into light emission by itself.

The present inventors have found that an exciplex with high luminous efficiency can be formed as long as a compound that has a function of converting triplet excitation energy into light emission by itself is used as one of the compounds that form an exciplex even when the compound has a low luminescence quantum yield. When a compound containing a heavy atom is used as one of the compounds that form an exciplex, intersystem crossing between a singlet state and a triplet state is promoted by spin-orbit interaction (interaction between spin angular momentum and orbital angular momentum of an electron). In other words, reverse intersystem crossing from a triplet excited state to a singlet excited state in an exciplex is promoted; thus, the generation probability of singlet excited states in the exciplex can be increased. As a result, an exciplex that emits light from a singlet excited state efficiently can be formed. The probability of transition from a triplet excited state to a singlet ground state can also be increased; thus, an exciplex that emits light from a triplet excited state efficiently can be formed. There is no limitation on the excited state from which an exciplex emits light (because singlet energy and triplet energy of the exciplex are close to each other). Note that the excitation (emission) lifetime of an exciplex is significantly shorter than that of a normal thermally activated delayed fluorescent material. This allows suppression of deterioration from an excited state, leading to a light-emitting element with an essentially long driving lifetime. To achieve this, one of the compounds that form an exciplex preferably contains a metal element with large spin-orbit interaction, specifically, a transition metal element. It is particularly preferable that a platinum group element (ruthenium (Ru), rhodium (Rh), palladium (Pd), osmium (Os), iridium (Ir), or platinum (Pt)), especially iridium, be contained because intersystem crossing between a singlet excited state and a triplet excited state in the exciplex can be increased.

In the above structure, a material with a high luminescence quantum yield does not need to be used to form an exciplex; accordingly, the design of a material is facilitated and a material can be selected from a wide range of choices. Specifically, in the case where at least one of the compounds that form an exciplex has a function of converting triplet excitation energy into light emission by itself or in the case where at least one of the compounds contains a platinum group element (Ru, Rh, Pd, Os, Ir, or Pt), the luminescence quantum yield of the compound may be higher than or equal to 0% and lower than or equal to 50%, higher than or equal to 0% and lower than or equal to 40%, higher than or equal to 0% and lower than or equal to 25%, higher than or equal to 0% and lower than or equal to 10%, or higher than or equal to 0% and lower than or equal to 1%, at room temperature or normal temperature.

It is difficult for a general host-guest light-emitting element containing a phosphorescent compound to emit light with a desired color at high efficiency. In contrast, since an exciplex is used as a light-emitting material in one embodiment of the present invention, a desired emission color can be obtained and the efficiency can be increased.

Figure 2A:
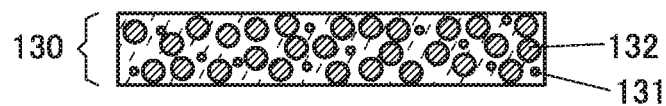
FIG. 2A is a schematic cross-sectional view of a light-emitting layer in a light-emitting element of one embodiment of the present invention.

FIG. 2A is a schematic cross-sectional view illustrating an example of the light-emitting layer 130 in FIG. 1. The light-emitting layer 130 illustrated in FIG. 2A contains a compound 131 and a compound 132. In one embodiment of the present invention, the compound 131 is preferably a phosphorescent compound. Although a structure in which a phosphorescent compound is used as the compound 131 is described below, a compound that does not emit light at room temperature may be used as long as the compound contains a platinum group element.

The compound 131 and the compound 132 contained in the light-emitting layer 130 preferably form an exciplex.

Although it is acceptable as long as the compounds 131 and 132 can form an exciplex, it is preferable that one of them be a compound having a function of transporting holes (a hole-transport property) and the other be a compound having a function of transporting electrons (an electron-transport property). In that case, a donor-acceptor exciplex is easily formed; thus, efficient formation of an exciplex is possible. In the case where the compounds 131 and 132 are a compound having a hole-transport property and a compound having an electron-transport property, the carrier balance can be easily controlled by adjusting the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

In order for the compounds 131 and 132 to efficiently form an exciplex, the highest occupied molecular orbital (also referred to as HOMO) level of one of the compounds 131 and 132 is preferably higher than the HOMO level of the other of the compounds 131 and 132, and the lowest unoccupied molecular orbital (also referred to as LUMO) level of one of the compounds 131 and 132 is preferably higher than the LUMO level of the other of the compounds 131 and 132. Note that the HOMO level of the compound 131 may be equivalent to the HOMO level of the compound 132, or the LUMO level of the compound 131 may be equivalent to the LUMO level of the compound 132.

Note that the LUMO levels and the HOMO levels of the compounds can be derived from the electrochemical characteristics (reduction potentials and oxidation potentials) of the compounds that are measured by cyclic voltammetry (CV).

Figure 2B:
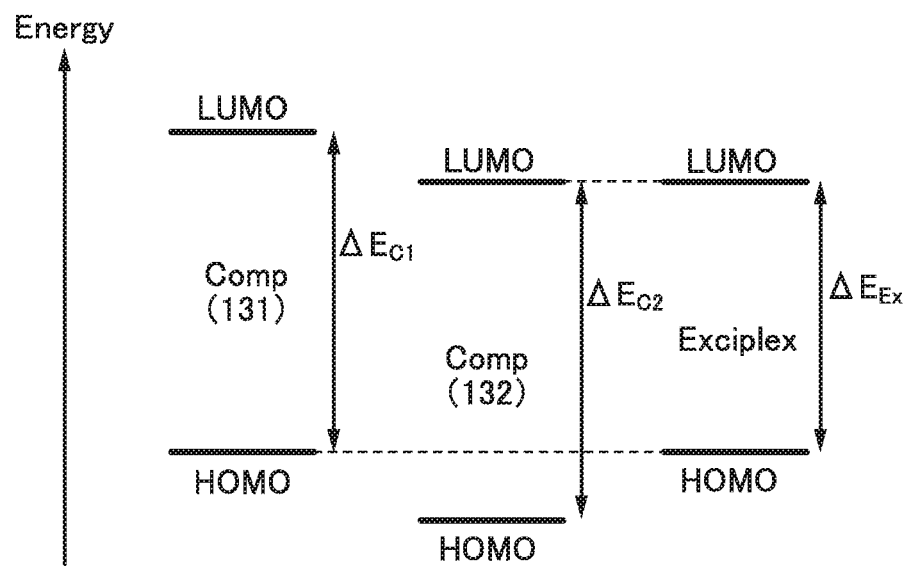
FIGS. 2B and 2C illustrate the correlations of energy levels.

When the compound 131 has a hole-transport property and the compound 132 has an electron-transport property, for example, it is preferable that the HOMO level of the compound 131 be higher than the HOMO level of the compound 132 and the LUMO level of the compound 131 be higher than the LUMO level of the compound 132, as in an energy band diagram in FIG. 2B. Such correlation of energy levels is suitable because electrons and holes, which serve as carriers, from the pair of electrodes (the electrodes 101 and 102) are easily injected into the compound 131 and the compound 132, respectively.

In FIG. 2B, Comp (131) represents the compound 131, Comp (132) represents the compound 132, $\Delta E_{C1}$ represents the energy difference between the LUMO level and the HOMO level of the compound 131, $\Delta E_{C2}$ represents the energy difference between the LUMO level and the HOMO level of the compound 132, and $\Delta E_{Ex}$ represents the energy difference between the LUMO level of the compound 132 and the HOMO level of the compound 131.

The exciplex formed by the compound 131 and the compound 132 has HOMO in the compound 131 and LUMO in the compound 132. The excitation energy of the exciplex substantially corresponds to the energy difference between the LUMO level of the compound 132 and the HOMO level of the compound 131 ($\Delta F_{Ex}$), which is smaller than the energy difference between the LUMO level and the HOMO level of the compound 131 ($\Delta E_{C1}$) and the energy difference between the LUMO level and the HOMO level of the compound 132 ($\Delta E_{C2}$). Thus, when the compound 131 and the compound 132 form an exciplex, an excited state can be formed with lower excitation energy. Having lower excitation energy, the exciplex can form a stable excited state.

Figure 2C:
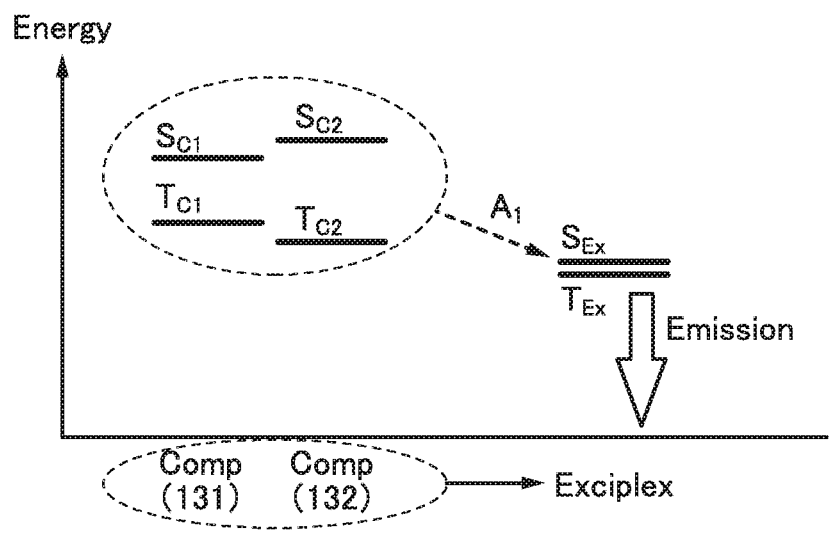

FIG. 2C shows the correlation of the energy levels of the compounds 131 and 132 in the light-emitting layer 130. The following explains what terms and signs in FIG. 2C represent:

Comp (131): the compound 131 (phosphorescent compound);
Comp (132): the compound 132;
$S_{C1}$: the S1 level of the compound 131;
$T_{C1}$: the T1 level of the compound 131;
$S_{C2}$: the S1 level of the compound 132;
$T_{C2}$: the T1 level of the compound 132;
$S_{Ex}$: the S1 level of the exciplex; and
$T_{Ex}$: the T1 level of the exciplex.

In the light-emitting element of one embodiment of the present invention, the compound 131 and the compound 132 contained in the light-emitting layer 130 form the exciplex. The S1 level of the exciplex ($S_{Ex}$) and the T1 level of the exciplex ($T_{Ex}$) are close to each other (see Route $A_1$ in FIG. 2C).

An exciplex is an excited state formed from two kinds of materials and is formed mainly through either of the following two processes.

One of the processes is a formation process of an electroplex. In this specification and the like, an electroplex refers to an exciplex formed by the interaction between the ionized compounds 131 and 132 (in a cation state or an anion state) formed due to carrier injection. Note that the formation process of an electroplex occurs in electrical excitation. In this embodiment, the formation process of an electroplex corresponds to a process in which one of the compounds 131 and 132 accepts holes and the other accepts electrons and the compounds 131 and 132 interact with each other so that an exciplex is formed immediately. In the formation process of an electroplex, an exciplex is formed immediately and an excited state is not formed by the compound 131 or the compound 132 by itself. Thus, the excitation lifetime and the luminescence quantum yields of the compounds (the compounds 131 and 132) that form an exciplex do not affect the formation process of an exciplex. In other words, one embodiment of the present invention can form an exciplex efficiently even when the luminescence quantum yields of the compounds (the compounds 131 and 132) that form an exciplex are low. Note that in this formation process, the S1 level of the compound 131 ($S_{C1}$) may be higher or lower than the S1 level of the compound 132 ($S_{C2}$), and the T1 level of the compound 131 ($T_{C1}$) may be higher or lower than the T1 level of the compound 132 ($T_{C2}$).

The other of the processes is a process for forming an exciplex when one compound that is brought into an excited state by receiving excitation energy interacts with the other compound in a ground state. This formation process of an exciplex may occur in photoexcitation and electrical excitation. In this embodiment, the formation process of an exciplex corresponds to a process in which one of the compounds 131 and 132 receives light or electric energy to be brought into an excited state and interacts with the other in a ground state immediately to form an exciplex. In this formation process of an exciplex, excitation energy can be transferred from the T1 level of the compound 131 ($T_{C1}$) to the T1 level of the compound 132 ($T_{C2}$) even when the compound 131 is brought into an excited state and the deactivation rate of the excited state is fast, as long as the T1 level of the compound 131 ($T_{C1}$) is higher than or equal to the T1 level of the compound 132 ($T_{C2}$). After the excitation energy is transferred from the T1 level of the compound 131 ($T_{C1}$) to the T1 level of the compound 132 ($T_{C2}$), the compound 131 and the compound 132 can form an exciplex. Thus, one embodiment of the present invention can form an exciplex efficiently even when the deactivation rate of the excited state of the compound 131 is fast and the luminescence quantum yield of the compound 131 is low. Note that in this formation process, the S1 level of the compound 131 ($S_{C1}$) may be higher or lower than the S1 level of the compound 132 ($S_{C2}$).

When an exciplex formed through either of the above processes loses excitation energy by light emission or the like to be brought into a ground state, two kinds materials forming the exciplex serve as the original two kinds of materials.

Because the excitation energy levels of the exciplex ($S_{Ex}$ and $T_{Ex}$) are lower than the S1 levels of the materials (the compounds 131 and 132) that form an exciplex ($S_{C1}$ and $S_{C2}$), an excited state can be formed with lower excitation energy. Accordingly, the driving voltage of the light-emitting element 150 can be reduced.

Since the S1 level and the T1 level of an exciplex ($S_{Ex}$ and $T_{Ex}$) are adjacent to each other, the exciplex has a function of emitting thermally activated delayed fluorescence. In other words, the exciplex has a function of converting triplet excitation energy into singlet excitation energy by reverse intersystem crossing (upconversion). Thus, the triplet excitation energy generated in the light-emitting layer 130 is partly converted into singlet excitation energy by the exciplex. In order to cause this conversion, the energy difference between the S1 level and the T1 level of the exciplex ($S_{Ex}$ and $T_{Ex}$) is preferably greater than 0 eV and less than or equal to 0.2 eV, and further preferably greater than 0 eV and less than or equal to 0.1 eV. Note that in order to efficiently cause reverse intersystem crossing, the T1 level of the exciplex ($T_{Ex}$) is preferably lower than the T1 levels of the materials (the compounds 131 and 132) that form an exciplex ($T_{C1}$ and $T_{C2}$). In that case, quenching of the triplet excitation energy of the exciplex formed by the compound 131 and the compound 132 is less likely to occur, leading to efficient reverse intersystem crossing from triplet excitation energy to singlet excitation energy by the exciplex and the subsequent light emission from the singlet excitation energy.

A compound containing a heavy atom is used as one of the compounds that form an exciplex in one embodiment of the present invention, which promotes intersystem crossing between a singlet state and a triplet state. Thus, an exciplex that emits light (phosphorescence) from triplet excitation energy can be formed. Note that it is difficult to clearly distinguish fluorescence and phosphorescence from each other in an emission spectrum in some cases because the S1 level and the T1 level of the exciplex ($S_{Ex}$ and $T_{Ex}$) are adjacent to each other. In that case, fluorescence and phosphorescence can be sometimes distinguished from each other by the emission lifetime.

To make the formation process of an electroplex more likely to occur, when the compound 131 has a hole-transport property and the compound 132 has an electron-transport property, for example, it is preferable that the HOMO level of the compound 131 be higher than the HOMO level of the compound 132 and the LUMO level of the compound 131 be higher than the LUMO level of the compound 132. Specifically, the energy difference between the HOMO levels of the compound 131 and the compound 132 is preferably greater than or equal to 0.1 eV, further preferably greater than or equal to 0.2 eV, and still further preferably greater than or equal to 0.3 eV. Moreover, the energy difference between the LUMO levels of the compound 131 and the compound 132 is preferably greater than or equal to 0.1 eV, further preferably greater than or equal to 0.2 eV, and still further preferably greater than or equal to 0.3 eV. Such energy differences are suitable because electrons and holes, which serve as carriers, from the pair of electrodes (the electrodes 101 and 102) are easily injected into the compound 131 and the compound 132, respectively.

The compound 131 may have an electron-transport property and the compound 132 may have a hole-transport property. In that case, the HOMO level of the compound 132 is preferably higher than the HOMO level of the compound 131 and the LUMO level of the compound 132 is preferably higher than the LUMO level of the compound 131, as in an energy band diagram in FIG. 4A.

The weight ratio of the compound 131 to the compound 132 is preferably low. Specifically, the weight ratio of the compound 131 to the compound 132 is preferably greater than or equal to 0.01 and less than or equal to 0.5, and further preferably greater than or equal to 0.05 and less than or equal to 0.3. A weight ratio within the above range is preferable because the formation process of an electroplex can be more likely to occur than a direct recombination process of carriers in one of the compounds.

<Light Emission Mechanism 2 of Light-Emitting Element>

Next, an example of a structure that is different from that of the light-emitting layer illustrated in FIG. 2A will be described below with reference to FIG. 3A.

Figure 3A:
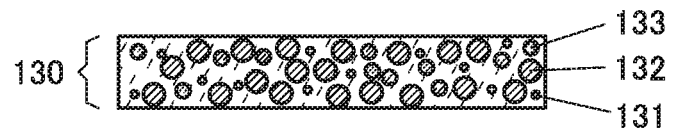
FIG. 3A is a schematic cross-sectional view of a light-emitting layer in a light-emitting element of one embodiment of the present invention.

FIG. 3A is a schematic cross-sectional view illustrating an example of the light-emitting layer 130 in FIG. 1. The light-emitting layer 130 illustrated in FIG. 3A contains the compound 131, the compound 132, and a compound 133.

In the light-emitting layer 130, the compound 132 or the compound 133 is present in the highest proportion by weight, and the compound 131 is dispersed in the compound 132 and the compound 133. Although the compound 131 is preferably a phosphorescent compound, a compound that does not emit light at room temperature may be used as long as the compound contains a platinum group element. The compound 131 and the compound 132 preferably form an exciplex.

To efficiently form an exciplex, one of the compounds 131 and 132 preferably has the highest HOMO level among the materials of the light-emitting layer 130, and the other of the compounds 131 and 132 preferably has the lowest LUMO level among the materials of the light-emitting layer 130. In other words, the HOMO level of one of the compounds 131 and 132 is preferably higher than the HOMO level of the other of the compounds 131 and 132 and the HOMO level of the compound 133, and the LUMO level of the other of the compounds 131 and 132 is preferably lower than the LUMO level of one of the compounds 131 and 132 and the LUMO level of the compound 133. With such correlation of the energy levels, a reaction for forming an exciplex by the compound 132 and the compound 133 can be inhibited.

Figure 3B:
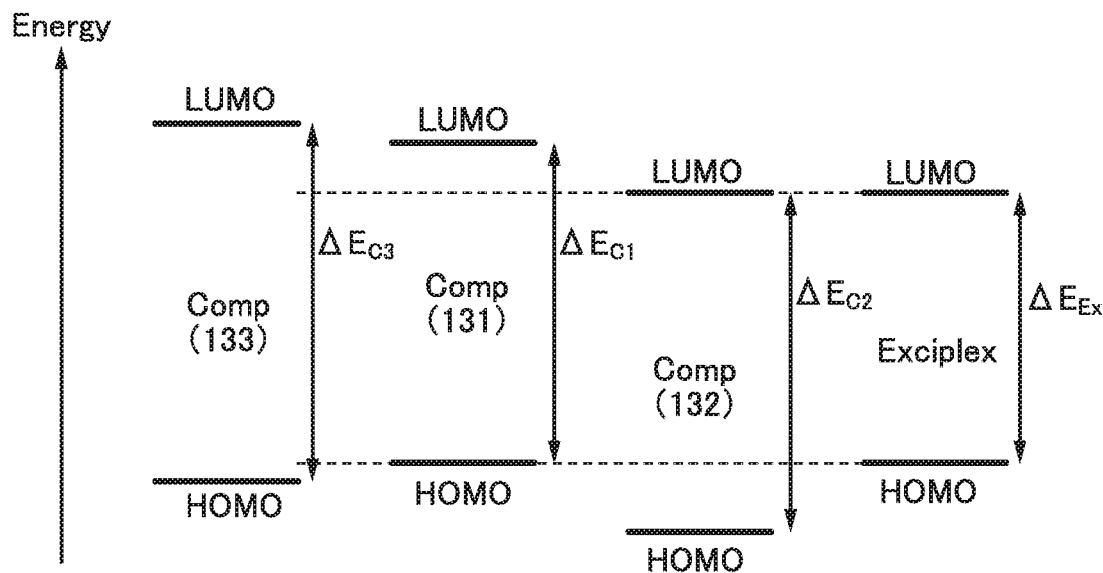
FIGS. 3B and 3C illustrate the correlations of energy levels.

When the compound 131 has a hole-transport property and the compound 132 has an electron-transport property, for example, it is preferable that the HOMO level of the compound 131 be higher than the HOMO levels of the compounds 132 and 133, and the LUMO level of the compound 132 be lower than the LUMO levels of the compounds 131 and 133, as in an energy band diagram in FIG. 3B. The LUMO level of the compound 133 may be higher or lower than the LUMO level of the compound 131. The HOMO level of the compound 133 may be higher or lower than the HOMO level of the compound 132.

In FIG. 3B, Comp (131) represents the compound 131, Comp (132) represents the compound 132, Comp (133) represents the compound 133, $\Delta E_{C1}$ represents the energy difference between the LUMO level and the HOMO level of the compound 131, $\Delta E_{C2}$ represents the energy difference between the LUMO level and the HOMO level of the compound 132, $\Delta E_{C3}$ represents the energy difference between the LUMO level and the HOMO level of the compound 133, and $\Delta F_{Ex}$ represents the energy difference between the LUMO level of the compound 132 and the HOMO level of the compound 131.

The excitation energy of the exciplex formed by the compound 131 and the compound 132 substantially corresponds to the energy difference between the LUMO level of the compound 132 and the HOMO level of the compound 131 ($\Delta E_{Ex}$) and is preferably smaller than the energy difference between the LUMO level and the HOMO level of the compound 133 ($\Delta E_{C3}$).

Figure 3C:
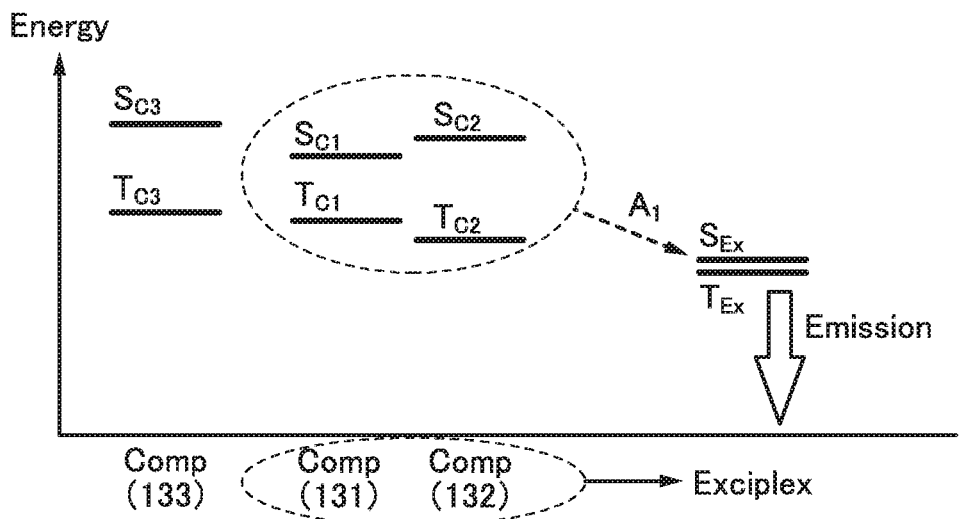
Figure 4A:
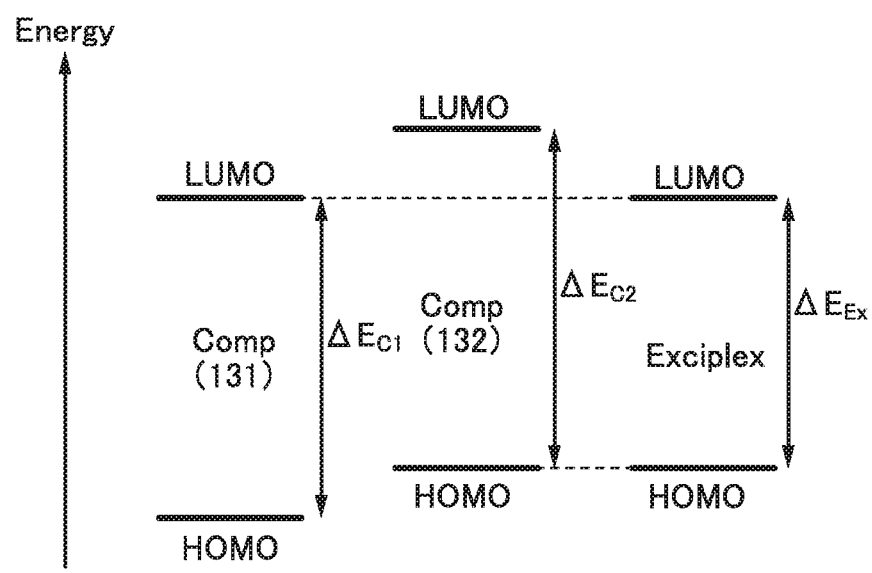
FIGS. 4A and 4B each illustrate the correlation of energy levels in a light-emitting layer in a light-emitting element of one embodiment of the present invention.
Figure 4B:
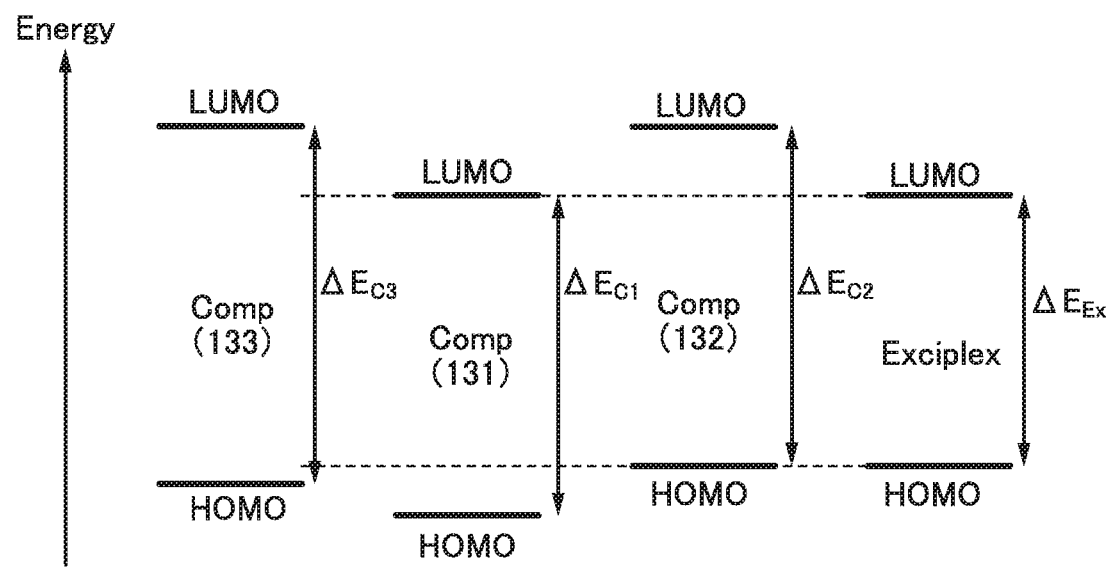

FIG. 3C shows the correlation of the energy levels of the compounds 131, 132, and 133 in the light-emitting layer 130 in FIG. 3A. The following explains what terms and signs in FIG. 3C represent:

Comp (131): the compound 131 (phosphorescent compound);
Comp (132): the compound 132;
Comp (133): the compound 133;
$S_{C1}$: the S1 level of the compound 131;
$T_{C1}$: the T1 level of the compound 131;
$S_{C2}$: the S1 level of the compound 132;
$T_{C2}$: the T1 level of the compound 132;
$S_{C3}$: the S1 level of the compound 133;
$T_{C3}$: the T1 level of the compound 133;
$S_{Ex}$: the S1 level of the exciplex; and
$T_{Ex}$: the T1 level of the exciplex.

In the light-emitting element of one embodiment of the present invention, the compound 131 and the compound 132 contained in the light-emitting layer 130 form the exciplex. The S1 level of the exciplex ($S_{Ex}$) and the T1 level of the exciplex ($T_{Ex}$) are close to each other (see Route $A_1$ in FIG. 3C).

The T1 level of the compound 133 ($T_{C3}$) is preferably higher than or equal to the T1 level of the compound 131 ($T_{C1}$). The T1 level of the compound 131 ($T_{C1}$) is preferably higher than or equal to the T1 level of the exciplex ($T_{Ex}$) formed by the compound 131 and the compound 132. With such correlation of the energy levels, quenching of the excitation energy of the exciplex formed by the compound 131 and the compound 132 is less likely to occur, leading to efficient light emission from triplet excitation energy or efficient reverse intersystem crossing from the triplet excitation energy to singlet excitation energy by the exciplex and the subsequent light emission from the singlet excitation energy.

To make the formation process of an electroplex more likely to occur, it is preferable to add a material other than the compounds 131 and 132 into the light-emitting layer 130 so that the direct recombination process of carriers is less likely to occur in the compound 131. This means that when the light-emitting layer 130 contains the compound 133 in addition to the compounds 131 and 132, an electroplex is likely to be formed by the compound 131 and the compound 132. The weight ratio of the compound 131 to the total amount of the compounds 132 and 133 is preferably low. Specifically, the weight ratio of the compound 131 to the total amount of the compounds 132 and 133 is preferably greater than or equal to 0.01 and less than or equal to 0.5, and further preferably greater than or equal to 0.05 and less than or equal to 0.3.

The compound 131 may have an electron-transport property and the compound 132 may have a hole-transport property. In that case, the HOMO level of the compound 132 is preferably higher than the HOMO levels of the compounds 131 and 133 and the LUMO level of the compound 131 is preferably lower than the LUMO levels of the compounds 132 and 133, as in an energy band diagram in FIG. 4B. The LUMO level of the compound 133 may be higher or lower than the LUMO level of the compound 132. The HOMO level of the compound 133 may be higher or lower than the HOMO level of the compound 131.

<Material>

Next, components of a light-emitting element of one embodiment of the present invention will be described in detail below.

<<Light-Emitting Layer>>

Materials that can be used for the light-emitting layer 130 will be described below.

Although there is no particular limitation on the compound 131 and the compound 132 as long as an exciplex can be formed, it is preferable that one of them have a function of transporting electrons and the other have a function of transporting holes.

In the case where the compound 132 has a function of transporting holes, the compound 132 preferably includes at least one of a π-electron rich heteroaromatic skeleton and an aromatic amine skeleton.

As the π-electron rich heteroaromatic skeleton included in the compound 132, one or more of a furan skeleton, a thiophene skeleton, and a pyrrole skeleton are preferable because of their high stability and reliability. As a furan skeleton, a dibenzofuran skeleton is preferable. As a thiophene skeleton, a dibenzothiophene skeleton is preferable. Note that as a pyrrole skeleton, an indole skeleton, a carbazole skeleton, or a 3-(9-phenyl-9H-carbazol-3-yl)-9H-carbazole skeleton is preferable. Each of these skeletons may further have a substituent.

As the aromatic amine skeleton included in the compound 132, tertiary amine not including an NH bond, in particular, a triarylamine skeleton is preferably used. As an aryl group of a triarylamine skeleton, a substituted or unsubstituted aryl group having 6 to 13 carbon atoms included in a ring is preferably used and examples thereof include a phenyl group, a naphthyl group, and a fluorenyl group.

A structure including a π-electron rich heteroaromatic skeleton and an aromatic amine skeleton, which has an excellent hole-transport property and thus is stable and highly reliable, is particularly preferred. An example of such a structure is a structure including a carbazole skeleton and an arylamine skeleton.

As examples of the above-described π-electron rich heteroaromatic skeleton and aromatic amine skeleton, skeletons represented by the following general formulae (101) to (117) are given. Note that X in the general formulae (115) to (117) represents an oxygen atom or a sulfur atom.

(101)

(102)

(103)

(104)

(105)

(106)

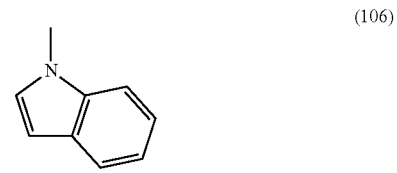

(107)

(108)

(109)

-continued

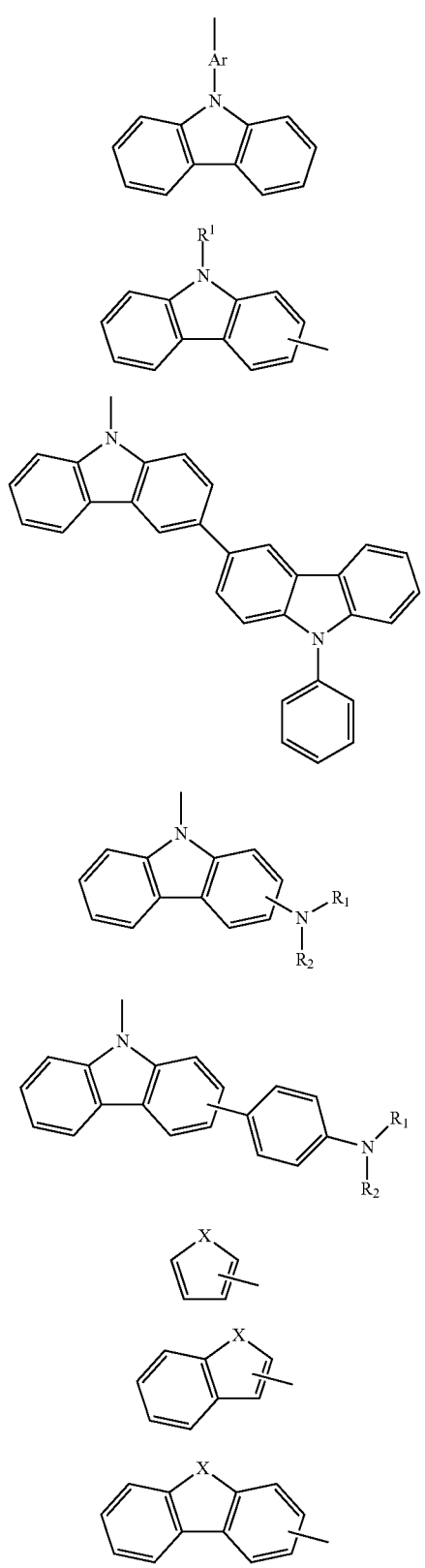

In the case where the compound 132 has a function of transporting electrons, the compound 132 preferably includes a π-electron deficient heteroaromatic skeleton. As the π-electron deficient heteroaromatic skeleton, a pyridine skeleton, a diazine skeleton (a pyrimidine skeleton, a pyrazine skeleton, or a pyridazine skeleton), or a triazine skeleton is preferable; the diazine skeleton or the triazine skeleton is particularly preferable because of its high stability and reliability.

As examples of the above-described π-electron deficient heteroaromatic skeleton, skeletons represented by the following general formulae (201) to (218) are given. Note that X in General Formulae (209) to (211) represents an oxygen atom or a sulfur atom.

(201)

(202)

(203)

(204)

(205)

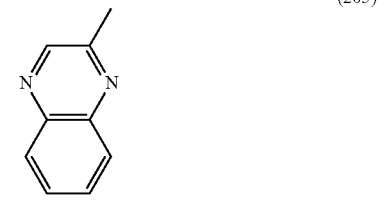
(206)

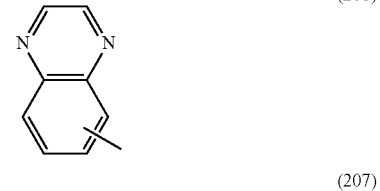
(207)

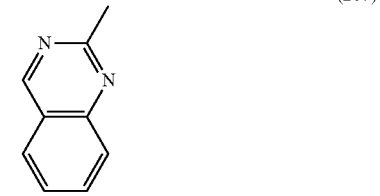
(208)

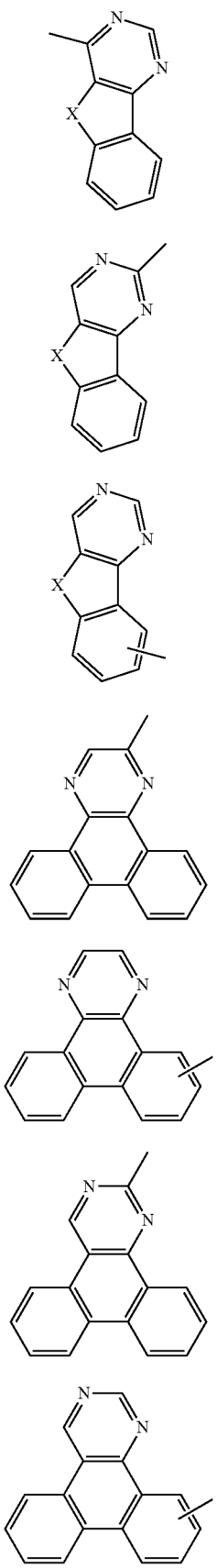

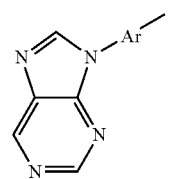
(216)

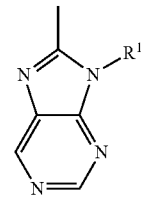
(217)

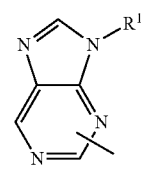
(218)

Alternatively, a compound may be used in which a skeleton having a hole-transport property (e.g., at least one of a π-electron rich heteroaromatic skeleton and an aromatic amine skeleton) and a skeleton having an electron-transport property (e.g., a π-electron deficient heteroaromatic skeleton) are bonded to each other directly or through an arylene group. Examples of the above-described arylene group include a phenylene group, a biphenyldiyl group, a naphthalenediyl group, and a fluorenediyl group.

As examples of a bonding group which bonds the above skeleton having a hole-transport property and the above skeleton having an electron-transport property, groups represented by the following general formulae (301) to (315) are given.

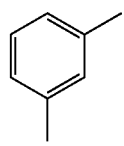
(301)

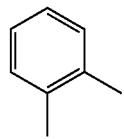
(302)

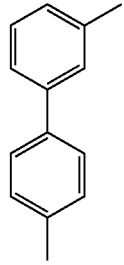
(303)

(304) 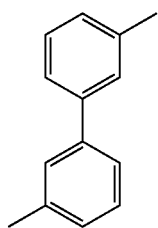
(305) 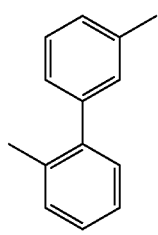
(306) 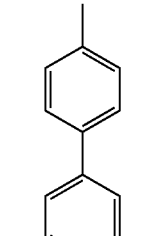
(307) 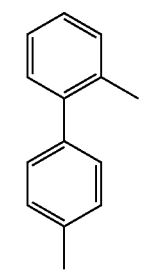
(308) 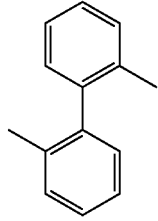
(309) 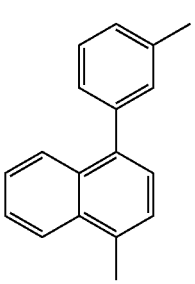
(310) 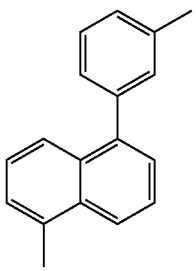
(311) 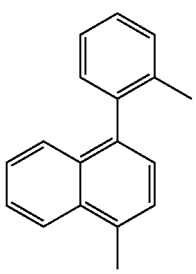
(312) 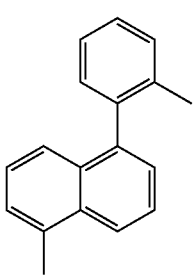
(313) 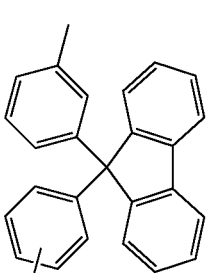
(314) 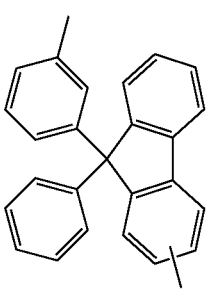

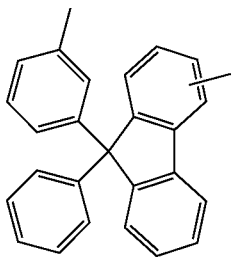
(315)

The above aromatic amine skeleton (e.g., the triarylamine skeleton), the above π-electron rich heteroaromatic skeleton (e.g., a ring including the furan skeleton, the thiophene skeleton, or the pyrrole skeleton), and the above π-electron deficient heteroaromatic skeleton (e.g., a ring including the diazine skeleton or the triazine skeleton) or the above general formulae (101) to (117), (201) to (218), and (301) to (315) may each have a substituent. As the substituent, an alkyl group having 1 to 6 carbon atoms, a cycloalkyl group having 3 to 6 carbon atoms, or a substituted or unsubstituted aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like. The above substituents may be bonded to each other to form a ring. For example, in the case where a carbon atom at the 9-position in a fluorene group has two phenyl groups as substituents, the phenyl groups are bonded to form a spirofluorene skeleton. Note that an unsubstituted group has an advantage in easy synthesis and an inexpensive raw material.

Furthermore, Ar represents a single-bond arylene group or an arylene group having 6 to 13 carbon atoms. The arylene group may include one or more substituents and the substituents may be bonded to each other to form a ring. For example, a carbon atom at the 9-position in a fluorenyl group has two phenyl groups as substituents and the phenyl groups are bonded to form a spirofluorene skeleton. Specific examples of the arylene group having 6 to 13 carbon atoms are a phenylene group, a naphthalenediyl group, a biphenyldiyl group, a fluorenediyl group, and the like. In the case where the arylene group has a substituent, as the substituent, an alkyl group having 1 to 6 carbon atoms, a cycloalkyl group having 3 to 6 carbon atoms, or an aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms are a phenyl group, a naphthyl group, a biphenyl group, and the like.

As the arylene group represented by Ar, for example, groups represented by structural formulae (Ar-1) to (Ar-18) below can be used. Note that the group that can be used as Ar is not limited to these.

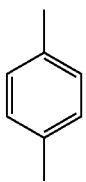
(Ar-1)

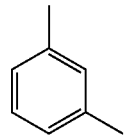
(Ar-2)

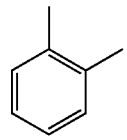
(Ar-3)

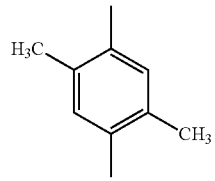
(Ar-4)

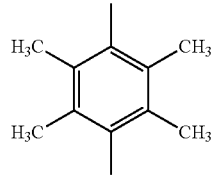
(Ar-5)

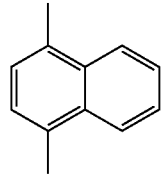
(Ar-6)

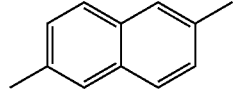
(Ar-7)

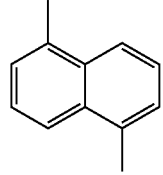
(Ar-8)

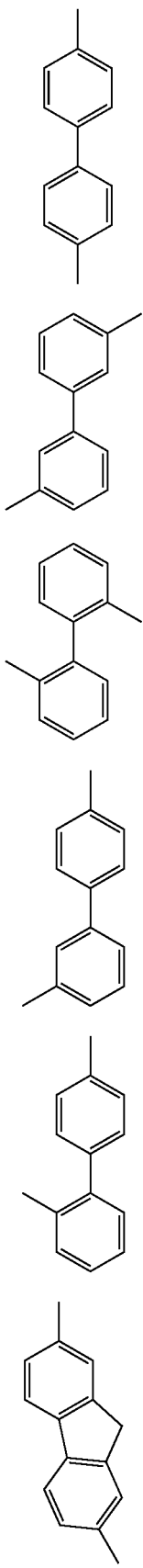
(Ar-9)
(Ar-10)
(Ar-11)
(Ar-12)
(Ar-13)
(Ar-14)

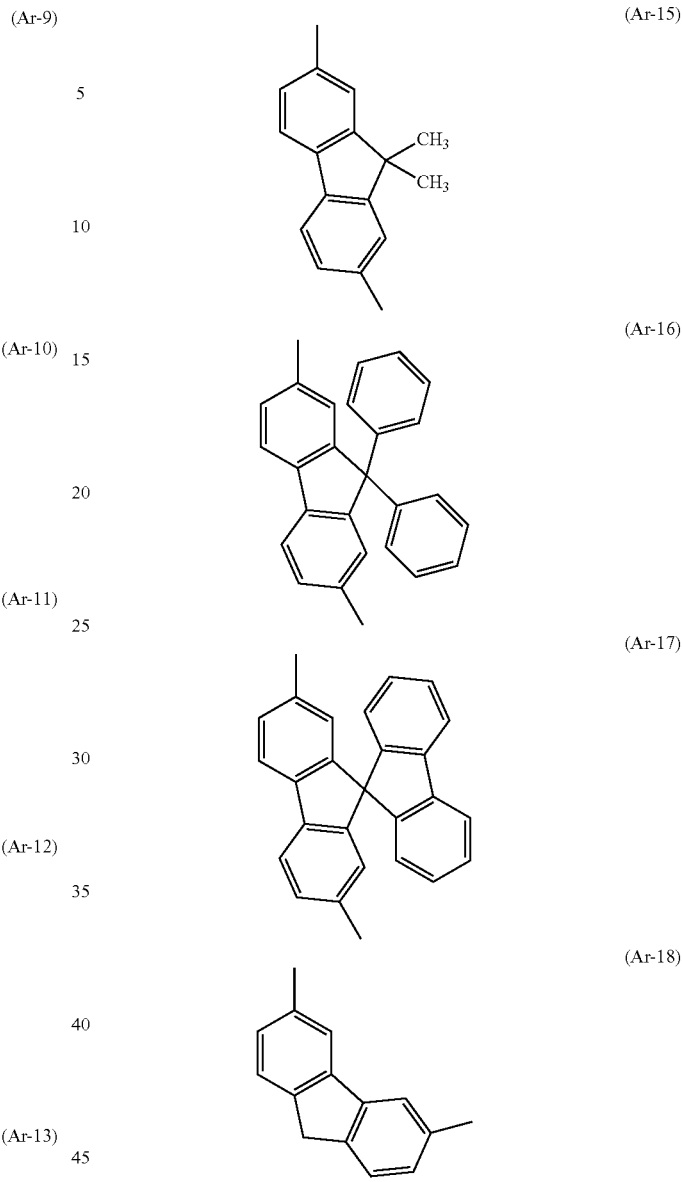
(Ar-15)
(Ar-16)
(Ar-17)
(Ar-18)

Furthermore, $R^1$ and $R^2$ each independently represent any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 13 carbon atoms are a phenyl group, a naphthyl group, a biphenyl group, a fluorenyl group, and the like. The above aryl group or phenyl group may include one or more substituents, and the substituents may be bonded to each other to form a ring. As the substituent, an alkyl group having 1 to 6 carbon atoms, a cycloalkyl group having 3 to 6 carbon atoms, or an aryl group having 6 to 12 carbon atoms can be selected. Specific examples of the alkyl group having 1 to 6 carbon atoms include a methyl group, an ethyl group, a propyl group, an isopropyl group, a butyl group, an isobutyl group, a tert-butyl group, an n-hexyl group, and the like. Specific examples of a cycloalkyl group having 3 to 6 carbon atoms include a cyclopropyl group, a cyclobutyl group, a cyclopentyl group, a cyclohexyl group, and the like. Specific examples of the aryl group having 6 to 12 carbon atoms include a phenyl group, a naphthyl group, a biphenyl group, and the like.

For example, groups represented by structural formulae (R-1) to (R-29) below can be used as the alkyl group or aryl group represented by $R^1$ and $R^2$. Note that the groups which can be used as an alkyl group or an aryl group are not limited thereto.

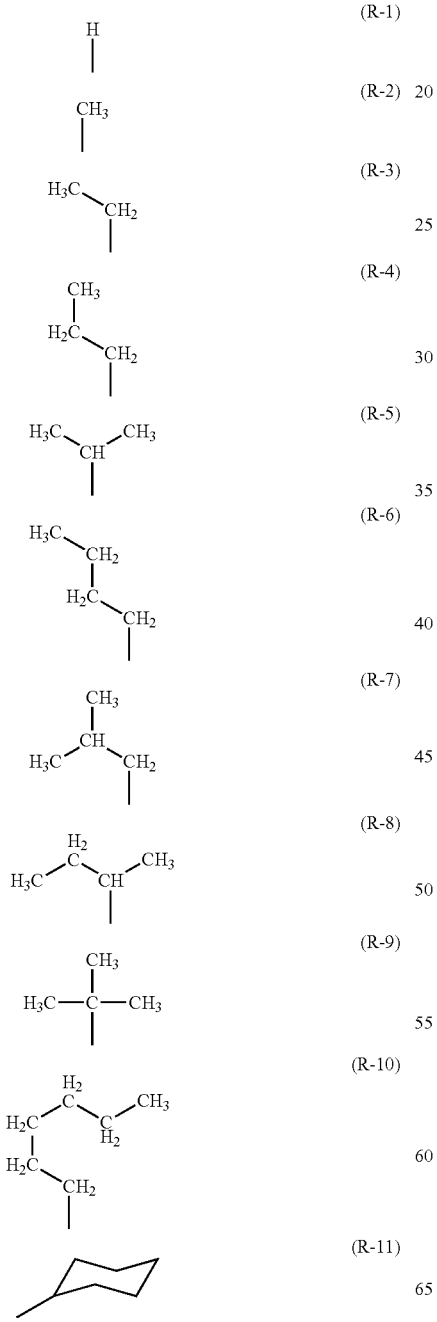

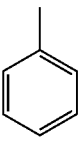

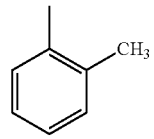

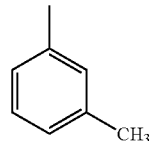

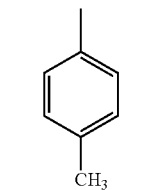

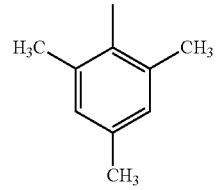

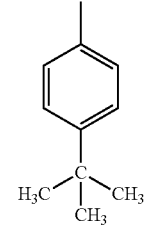

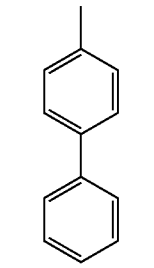

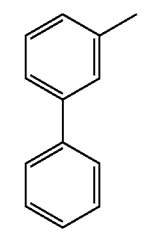

(R-20) 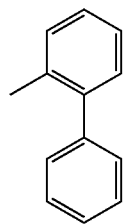

(R-21) 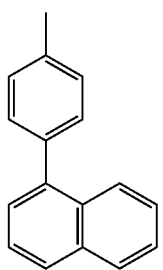

(R-22) 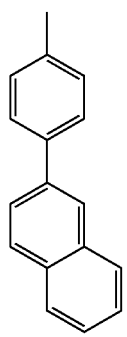

(R-23) 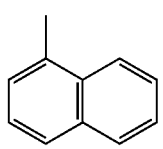

(R-24) 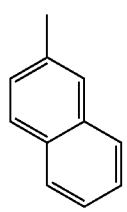

(R-25) 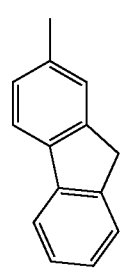

(R-26) 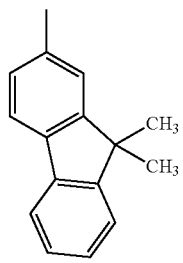

(R-27) 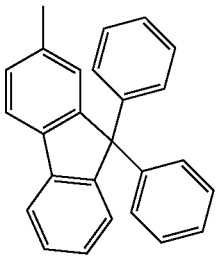

(R-28) 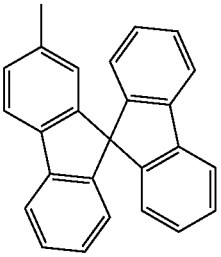

(R-29) 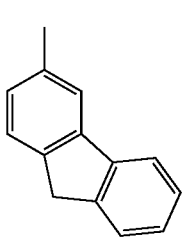

As a substituent that can be included in the general formulae (101) to (117), (201) to (218), and (301) to (315), Ar, R¹, and R², the alkyl group or aryl group represented by the above structural formulae (R-1) to (R-24) can be used, for example. Note that the group which can be used as an alkyl group or an aryl group is not limited thereto.

As the compound 132, any of the following hole-transport materials and electron-transport materials can be used, for example.

A material having a property of transporting more holes than electrons can be used as the hole-transport material, and a material having a hole mobility of $1 \times 10^{-6}$ cm²/Vs or higher is preferable. Specifically, an aromatic amine, a carbazole derivative, or the like can be used. Furthermore, the hole-transport material may be a high molecular compound.

Examples of the aromatic amine compound, which has a high hole-transport property, include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 1,4-bis[4-(N-carbazoly)phenyl]-2,3,5,6-tetraphenylbenzene, and the like.

Examples of the material having an excellent hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBiA1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances described here are mainly substances having a hole mobility of $1\times10^{-6}$ cm$^2$/Vs or higher. Note that other than these substances, any substance that has a property of transporting more holes than electrons may be used.

As the electron-transport material, a material having a property of transporting more electrons than holes can be used, and a material having an electron mobility of $1\times10^{-6}$ cm$^2$/Vs or higher is preferable. A metal complex containing zinc or aluminum, a π-electron deficient heteroaromatic compound such as a nitrogen-containing heteroaromatic compound, or the like can be used as a material which easily accepts electrons (material having an electron-transport property). As the metal complex, a metal complex having a quinoline ligand, a benzoquinoline ligand, an oxazole ligand, or a thiazole ligand can be used. As the π-electron deficient heteroaromatic compound, an oxadiazole derivative, a triazole derivative, a phenanthroline derivative, a pyridine derivative, a bipyridine derivative, a pyrimidine derivative, a triazine derivative, or the like can be used.

Examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), and the like. Alternatively, a metal complex having an oxazole-based or thiazole-based ligand, such as bis[2-(2-benzoxazolyl)phenolato]zinc(II) (abbreviation: ZnPBO) or bis[2-(2-benzothiazoly)phenolato]zinc(II) (abbreviation: ZnBTZ), can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), bathocuproine (abbreviation: BCP), and 2,9-bis(naphthalen-2-yl)-4,7-diphenyl-1,10-phenanthroline (abbreviation: NBPhen); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation:

2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); and heteroaromatic compounds such as 4,4'-bis(5-methylbenzoxazol-2-yl)stilbene (abbreviation: BzOs). Still alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1 \times 10^{-6}$ cm$^2$/Vs or higher. Note that other substances may also be used as long as their electron-transport properties are more excellent than their hole-transport properties.

As the compound 131 (phosphorescent compound), an iridium-, rhodium-, or platinum-based organometallic or metal complex, or a platinum or organoiridium complex having a porphyrin ligand can be used; it is particularly preferable to use an organoiridium complex such as an iridium-based ortho-metalated complex. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be used. Here, the compound 131 (phosphorescent compound) has an absorption band of triplet metal to ligand charge transfer (MLCT) transition.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κ C}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptzl-mp)$_3$) and tris(1-methyl-5-phenyl-3-propyl-1H-1,2,4-triazolato)iridium(III) (abbreviation: Ir(Prptzl-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and luminous efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (endo-and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN$^3$]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and luminous efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and (dipivaloylmethanato)bis[4,6-di(naphthalen-1-yl)pyrimidinato]iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation:

Ir(Fdpq)$_2$(acac)); organometallic iridium complexes having a pyridine skeleton, such as tris(1-phenylisoquinolinato-N, C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and luminous efficiency and are thus particularly preferable. Furthermore, the organometallic iridium complexes having a pyrazine skeleton can provide red light emission with favorable chromaticity.

Although there is no particular limitation on a material that can be used as the compound 133 in the light-emitting layer 130, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), and the like. One or more substances having a wider energy gap than the compound 131 are selected from these substances and known substances.

The light-emitting layer 130 can include two or more layers. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

The light-emitting layer 130 may contain a material other than the compounds 131, 132, and 133.

<<Pair of Electrodes>>

The electrode 101 and the electrode 102 have functions of injecting holes and electrons into the light-emitting layer 130. The electrode 101 and the electrode 102 can be formed using a metal, an alloy, or a conductive compound, a mixture or a stack thereof, or the like. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As a transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter referred to as ITO), indium tin oxide containing silicon or silicon oxide (ITSO), indium zinc oxide, indium oxide containing tungsten and zinc, and the like. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

In this specification and the like, as the electrode transmitting light, a material that transmits visible light and has conductivity is used. Examples of the material include, in addition to the above-described oxide conductor layer typified by an ITO, an oxide semiconductor layer and an organic conductor layer containing an organic substance. Examples of the organic conductive layer containing an organic substance include a layer containing a composite material in which an organic compound and an electron donor (donor material) are mixed and a layer containing a composite material in which an organic compound and an electron acceptor (acceptor material) are mixed. The resistivity of the transparent conductive layer is preferably lower than or equal to $1\times10^5$ Ω·cm, further preferably lower than or equal to $1\times10^4$ Ω·cm.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: F4TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the above aromatic amines, the above carbazole derivatives, the above aromatic hydrocarbons, the above stilbene derivatives, and the like as examples of the hole-transport material that can be used in the light-emitting layer 130 can be used. Furthermore, the hole-transport material may be a high molecular compound.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, any of the materials given as examples of the material of the hole-injection layer 111 can be used. As the hole-transport material, a substance having a hole mobility of $1\times10^{-6}$ cm$^2$/Vs or higher is preferably used. Note that any substance other than the above substances may be used as long as the hole-transport property is more excellent than the electron-transport property. The layer including a substance having an excellent hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, which are described as the electron-transport materials that can be used in the light-emitting layer 130, can be given. Furthermore, an oxadiazole derivative; a triazole derivative, a phenanthroline derivative, a pyridine derivative, a bipyridine derivative, a pyrimidine derivative, and the like can be given. A substance having an electron mobility of $1\times10^{-6}$ cm$^2$/Vs or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. The layer that controls transfer of electron carriers is formed by addition of a small amount of a substance having an excellent electron-trapping property to a material having an excellent electron-transport property described above, and is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiOx), can be used. Alternatively, a rare earth metal compound like erbium fluoride (ErF$_3$) can be used. Electride may be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide may be used. An organic compound such as tetrathiafulvalene (abbreviation: TTF) may be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle printing method, a gravure printing method, or the like. Other than the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a phenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly(9,9-di-n-octylfluorenyl-2,7-diyl)-alt-(2,2'-bithiophene-5,5'-diyl)] (abbreviation: F8T2), poly [(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); and a polyphenylene derivative. These high molecular compounds, poly(9-vinylcarbazole) (abbreviation: PVK), poly(2-vinylnaphthalene), poly[bis(4-phenyl)(2,4,6-trimethylphenyl)amine] (abbreviation: PTAA), or the like may be doped with a light-emitting compound and used for the light-emitting layer. As the light-emitting compound, any of the above-described light-emitting compounds can be used.

<<Substrate>>

A light-emitting element in one embodiment of the present invention can be formed over a substrate of glass, plastic, or the like. As the way of stacking layers over the substrate, layers can be sequentially stacked either from the electrode 101 side or from the electrode 102 side.

For the substrate over which the light-emitting element of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic film formed by evaporation, or the like can also be used. Another material may be used as long as the substrate functions as a support in a manufacturing process of the light-emitting element or the optical element.

Another material having a function of protecting the light-emitting element or the optical element may be used.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic film formed by evaporation, paper, or the like can be used.

Alternatively, a flexible substrate may be used as the substrate, and a transistor or a light-emitting element may be provided directly on the flexible substrate. Still alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a light-emitting element with high durability, high heat resistance, reduced weight, or reduced thickness can be formed.

The light-emitting element 150 may be formed over an electrode electrically connected to a field-effect transistor (FET), for example, which is formed over any of the above-described substrates. In that case, an active matrix display device in which the FET controls the driving of the light-emitting element can be manufactured.

The structure described above in this embodiment can be combined as appropriate with any of the structures described in the other embodiments.

Embodiment 2

Figure 5:
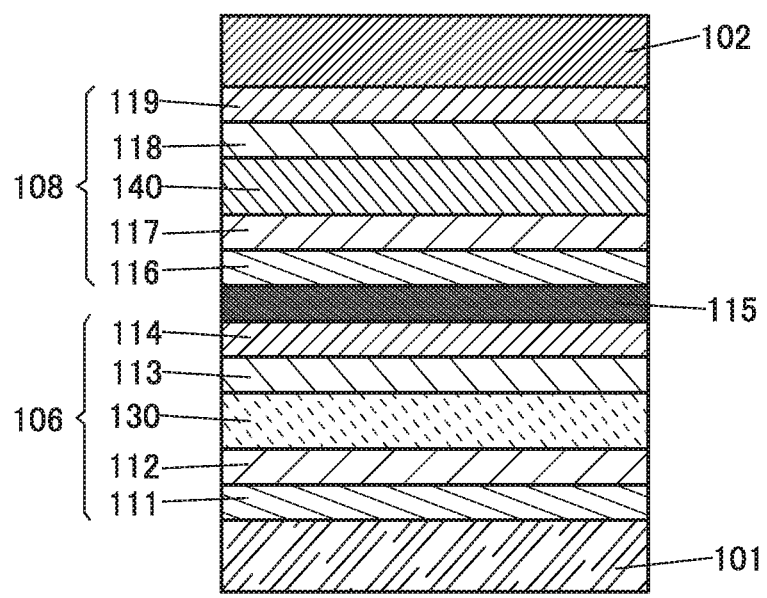
FIG. 5 is a schematic cross-sectional view of a light-emitting element of one embodiment of the present invention.

In this embodiment, light-emitting elements having structures different from that described in Embodiment 1 and light emission mechanisms of the light-emitting elements will be described below with reference to FIG. 5. In FIG. 5, a portion having a function similar to that in FIG. 1 is represented by the same hatch pattern as that in FIG. 1 and not particularly denoted by a reference numeral in some cases. In addition, common reference numerals are used for portions having similar functions, and a detailed description of the portions is omitted in some cases.

<Structure Example of Light-Emitting Element>

FIG. 5 is a schematic cross-sectional view of a light-emitting element 250.

The light-emitting element 250 illustrated in FIG. 5 includes a plurality of light-emitting units (a light-emitting unit 106 and a light-emitting unit 108 in FIG. 5) between a pair of electrodes (the electrode 101 and the electrode 102). One light-emitting unit has the same structure as the EL layer 100 illustrated in FIG. 1. That is, the light-emitting element 150 in FIG. 1 includes one light-emitting unit, while the light-emitting element 250 includes a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 5, the light-emitting unit 106 and the light-emitting unit 108 are stacked, and a charge-generation layer 115 is provided between the light-emitting unit 106 and the light-emitting unit 108. Note that the structures of the light-emitting unit 106 and the light-emitting unit 108 may be the same or different from each other. For example, it is preferable that the light-emitting unit 106 have a structure similar to that of the EL layer 100 illustrated in FIG. 1.

The light-emitting element 250 includes the light-emitting layer 130 and a light-emitting layer 140. The light-emitting unit 106 includes the hole-injection layer 111, the hole-transport layer 112, an electron-transport layer 113, and an electron-injection layer 114 in addition to the light-emitting layer 130. The light-emitting unit 108 includes a hole-injection layer 116, a hole-transport layer 117, an electron-transport layer 118, and the electron-injection layer 119 in addition to the light-emitting layer 140.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1 \times 10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be achieved. Note that when a surface of a light-emitting unit on the anode side is in contact with the charge-generation layer 115 as in the case of the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having an excellent electron-transport property. Furthermore, the charge-generation layer 115 may be formed using a combination of a layer containing the composite material of an organic compound and an acceptor substance with a layer containing a transparent conductive material.

The charge-generation layer 115 provided between the light-emitting unit 106 and the light-emitting unit 108 may have any structure as long as electrons can be injected into the light-emitting unit on one side and holes can be injected into the light-emitting unit on the other side when a voltage is applied between the electrode 101 and the electrode 102. For example, in FIG. 5, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even if it has lower conductivity than the pair of electrodes (the electrodes 101 and 102). In the case where the conductivity of the charge-generation layer 115 is as high as those of the pair of electrodes, carriers generated in the charge-generation layer 115 flow toward the film surface direction, so that light is emitted in a region where the electrode 101 and the electrode 102 do not overlap with each other, in some cases. To suppress such a defect, the charge-generation layer 115 is preferably formed using a material whose conductivity is lower than those of the pair of electrodes.

Note that forming the charge-generation layer 115 by using any of the above materials can suppress an increase in drive voltage caused by the stack of the light-emitting layers.

The light-emitting element having two light-emitting units is described with reference to FIG. 5; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. A light-emitting element with low power consumption can be provided.

When the structure of the EL layer 100 illustrated in FIG. 1 is used for at least one of the plurality of units, a light-emitting element with high luminous efficiency can be provided.

It is preferable that the light-emitting layer 130 included in the light-emitting unit 106 have the structure described in Embodiment 1, in which case the light-emitting element 250 has high luminous efficiency.

Note that the guest materials used in the light-emitting unit 106 and the light-emitting unit 108 may be the same or different. In the case where the same guest material is used for the light-emitting unit 106 and the light-emitting unit 108, the light-emitting element 250 can exhibit high emission luminance at a small current value, which is preferable. In the case where different guest materials are used for the light-emitting unit 106 and the light-emitting unit 108, the light-emitting element 250 can exhibit multi-color light emission, which is preferable. It is particularly favorable to select the guest materials so that white light emission with high color rendering properties or light emission of at least red, green, and blue can be obtained.

Note that the light-emitting units 106 and 108 and the charge-generation layer 115 can be formed by an evaporation method (including a vacuum evaporation method), an ink-jet method, a coating method, gravure printing, or the like.

Note that the structure described in this embodiment can be combined as appropriate with any of the structures described in the other embodiments.

Embodiment 3

In this embodiment, examples of light-emitting elements having structures different from those described in Embodiments 1 and 2 will be described below with reference to FIG. 6 and FIGS. 7A and 7B.

<Structure Example 1 of Light-Emitting Element>

Figure 6:
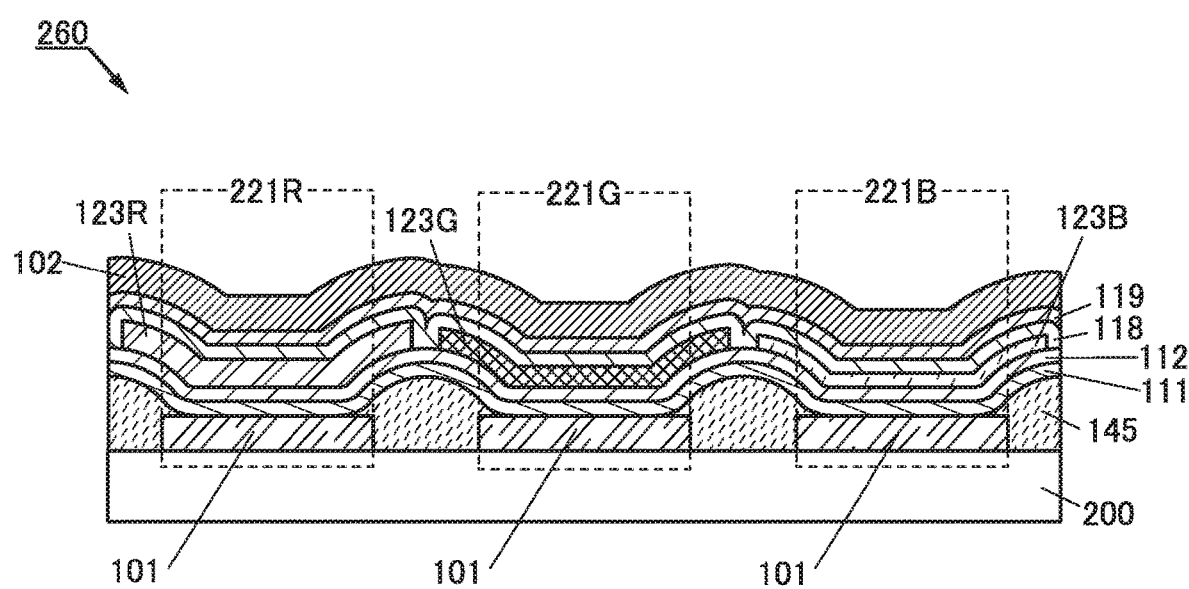
FIG. 6 is a schematic cross-sectional view of a light-emitting element of one embodiment of the present invention.

FIG. 6 is a cross-sectional view illustrating a light-emitting element of one embodiment of the present invention. In FIG. 6, a portion having a function similar to that in FIG. 1 is represented by the same hatch pattern as that in FIG. 1 and not particularly denoted by a reference numeral in some cases. In addition, common reference numerals are used for portions having similar functions, and a detailed description of the portions is omitted in some cases.

A light-emitting element 260 in FIG. 6 may have a bottom-emission structure in which light is extracted through a substrate 200 or may have a top-emission structure in which light is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting element 260 has a bottom emission structure, the electrode 101 preferably has a function of transmitting light and the electrode 102 preferably has a function of reflecting light. Alternatively, in the case where the light-emitting element 260 has a top emission structure, the electrode 101 preferably has a function of reflecting light and the electrode 102 preferably has a function of transmitting light.

The light-emitting element 260 includes the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

The electrode 101 may be formed using a plurality of conductive layers. In that case, it is preferable that a conductive layer having a function of reflecting light and a conductive layer having a function of transmitting light be stacked.

For the electrode 101, a structure and materials similar to those of the electrode 101 or 102 described in Embodiment 1 can be used.

In FIG. 6, a partition 145 is provided between a region 221B, a region 221G, and a region 221R, which are sandwiched between the electrode 101 and the electrode 102. The partition 145 has an insulating property. The partition 145 covers end portions of the electrode 101 and has openings overlapping with the electrode. With the partition 145, the electrode 101 provided over the substrate 200 in the regions can be divided into island shapes.

Note that the light-emitting layer 123B and the light-emitting layer 123G may overlap with each other in a region where they overlap with the partition 145. The light-emitting layer 123G and the light-emitting layer 123R may overlap with each other in a region where they overlap with the partition 145. The light-emitting layer 123R and the light-emitting layer 123B may overlap with each other in a region where they overlap with the partition 145.

The partition 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

The light-emitting layers 123R, 123G, and 123B preferably contain light-emitting materials having functions of emitting light of different colors. For example, when the light-emitting layer 123R contains a light-emitting material having a function of emitting red light, the region 221R emits red light. When the light-emitting layer 123G contains a light-emitting material having a function of emitting green light, the region 221G emits green light. When the light-emitting layer 123B contains a light-emitting material having a function of emitting blue light, the region 221B emits blue light. The light-emitting element 260 having such a structure is used in a pixel of a display device, whereby a full-color display device can be fabricated. The thicknesses of the light-emitting layers may be the same or different.

One or more of the light-emitting layer 123B, the light-emitting layer 123G, and the light-emitting layer 123R preferably have a structure similar to that of the light-emitting layer 130 described in Embodiment 1. In that case, a light-emitting element with high luminous efficiency can be fabricated.

One or more of the light-emitting layers 123B, 123G, and 123R may include two or more stacked layers.

When at least one light-emitting layer includes the light-emitting layer described in Embodiment 1 as described above and the light-emitting element 260 including the light-emitting layer is used in pixels in a display device, a display device with high luminous efficiency can be fabricated. The display device including the light-emitting element 260 can thus have reduced power consumption.

By providing a color filter over the electrode through which light is extracted, the color purity of the light-emitting element 260 can be improved. Therefore, the color purity of a display device including the light-emitting element 260 can be improved.

By providing a polarizing plate over the electrode through which light is extracted, the reflection of external light by the light-emitting element 260 can be reduced. Therefore, the contrast ratio of a display device including the light-emitting element 260 can be improved.

For the other components of the light-emitting element 260, the components of the light-emitting element in Embodiment 1 can be referred to.

<Structure Example 2 of Light-Emitting Element>

Next, structural examples different from the light-emitting element illustrated in FIG. 6 will be described below with reference to FIGS. 7A and 7B.

Figure 7A:
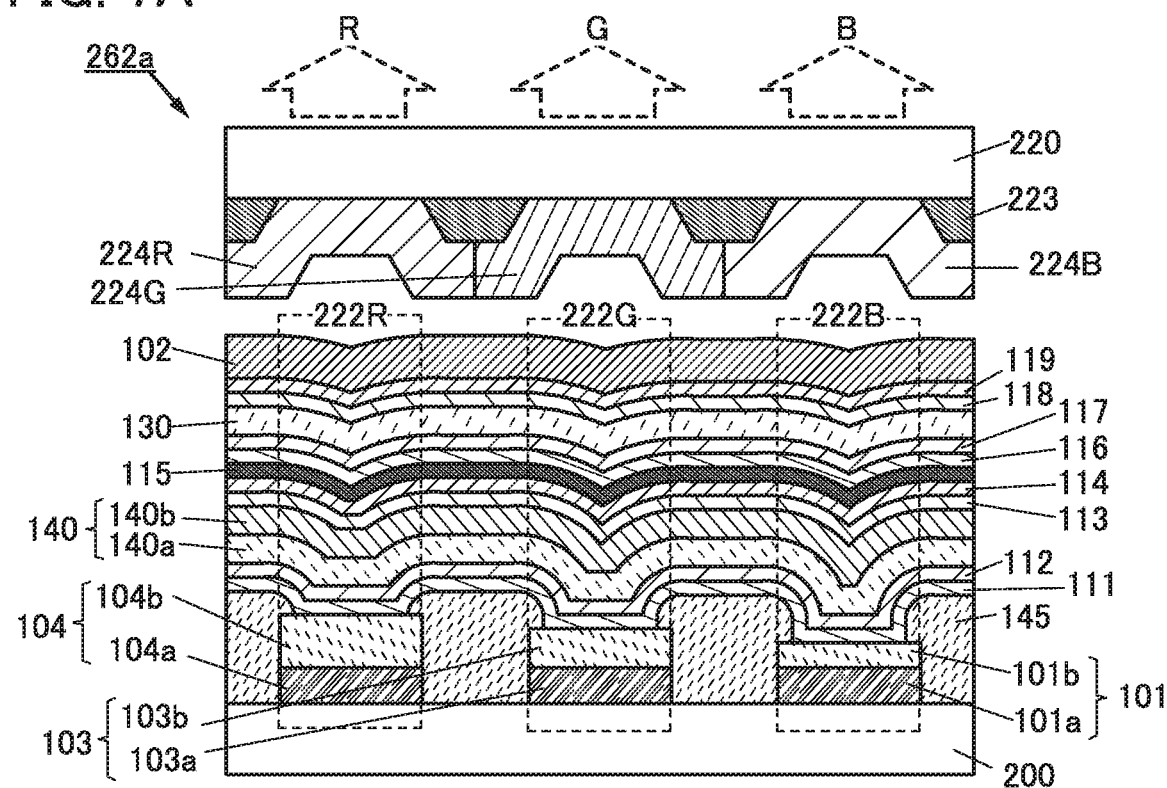
FIGS. 7A and 7B are each a schematic cross-sectional view of a light-emitting element of one embodiment of the present invention.
Figure 7B:
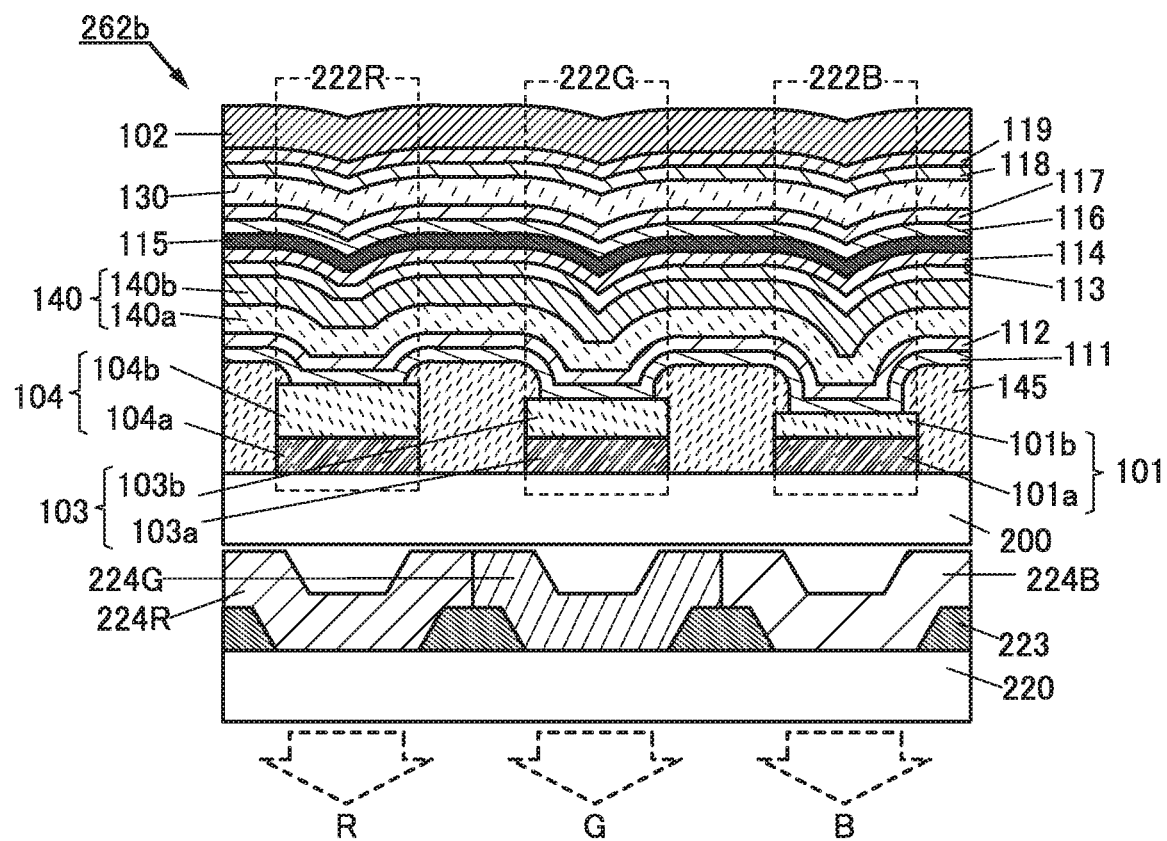

FIGS. 7A and 7B are cross-sectional views of a light-emitting element of one embodiment of the present invention. In FIGS. 7A and 7B, a portion having a function similar to that in FIG. 6 is represented by the same hatch pattern as that in FIG. 6 and not particularly denoted by a reference numeral in some cases. In addition, common reference numerals are used for portions having similar functions, and a detailed description of such portions is not repeated in some cases.

FIGS. 7A and 7B illustrate structural examples of a light-emitting element including the light-emitting layer between a pair of electrodes. A light-emitting element 262a illustrated in FIG. 7A has a top-emission structure in which light is extracted in a direction opposite to the substrate 200, and a light-emitting element 262b illustrated in FIG. 7B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 130 and the charge-generation layer 115 are provided between the electrode 101 and the electrode 102, between the electrode 102 and the electrode 103, and between the electrode 102 and the electrode 104. The hole-injection layer 111, the hole-transport layer 112, the light-emitting layer 140, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 7A and the light-emitting element 262b illustrated in FIG. 7B each include the partition 145 between a region 222B sandwiched between the electrode 101 and the electrode 102, a region 222G sandwiched between the electrode 102 and the electrode 103, and a region 222R sandwiched between the electrode 102 and the electrode 104. The partition 145 has an insulating property. The partition 145 covers end portions of the electrodes 101, 103, and 104 and has openings overlapping with the electrodes. With the partition 145, the electrodes provided over the substrate 200 in the regions can be separated into island shapes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The use of the quantum-dot type can increase color reproducibility of the display device.

A plurality of optical elements may also be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light incident from the outside of the display device is reflected inside the display device and returned to the outside. An anti-reflective film can weaken external light reflected by a surface of the display device. This leads to clear observation of light emitted from the display device.

Note that in FIGS. 7A and 7B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. For the light-blocking layer 223, a metal, a resin containing black pigment, carbon black, a metal oxide, a composite oxide containing a solid solution of a plurality of metal oxides, or the like can be used.

For the substrate 200 and the substrate 220 provided with the optical elements, the substrate in Embodiment 1 can be referred to.

Furthermore, the light-emitting elements 262a and 262b have a microcavity structure.

<<Microcavity Structure>>

Light emitted from the light-emitting layer 130 and the light-emitting layer 140 resonates between a pair of electrodes (e.g., the electrode 101 and the electrode 102). The light-emitting layer 130 and the light-emitting layer 140 are formed at such a position as to intensify the light of a desired wavelength among light to be emitted. For example, by adjusting the optical length from a reflective region of the electrode 101 to the light-emitting region of the light-emitting layer 130 and the optical length from a reflective region of the electrode 102 to the light-emitting region of the light-emitting layer 130, the light of a desired wavelength among light emitted from the light-emitting layer 130 can be intensified. By adjusting the optical length from the reflective region of the electrode 101 to the light-emitting region of the light-emitting layer 140 and the optical length from the reflective region of the electrode 102 to the light-emitting region of the light-emitting layer 140, the light of a desired wavelength among light emitted from the light-emitting layer 140 can be intensified. In the case of a light-emitting element in which a plurality of light-emitting layers (here, the light-emitting layers 130 and 140) are stacked, the optical lengths of the light-emitting layers 130 and 140 are preferably optimized.

In each of the light-emitting elements 262a and 262b, by adjusting the thicknesses of the conductive layers (the conductive layer 101b, the conductive layer 103b, and the conductive layer 104b) in each region, the light of a desired wavelength among light emitted from the light-emitting layers 130 and 140 can be intensified. Note that the thickness of at least one of the hole-injection layer 111 and the hole-transport layer 112 may differ between the regions to intensify the light emitted from the light-emitting layers 130 and 140.

For example, in the case where the refractive index of the conductive material having a function of reflecting light in the electrodes 101 to 104 is lower than the refractive index of the light-emitting layer 130 or 140, the thickness of the conductive layer 101b of the electrode 101 is adjusted so that the optical length between the electrode 101 and the electrode 102 is $m_B \lambda_B/2$ ($m_B$ is a natural number and $\lambda_B$ is the wavelength of light intensified in the region 222B). Similarly, the thickness of the conductive layer 103b of the electrode 103 is adjusted so that the optical length between the electrode 103 and the electrode 102 is $m_G \lambda_G/2$ ($m_G$ is a natural number and $\lambda_G$ is the wavelength of light intensified in the region 222G). Furthermore, the thickness of the conductive layer 104b of the electrode 104 is adjusted so that the optical length between the electrode 104 and the electrode 102 is $m_R \lambda_R/2$ ($m_R$ is a natural number and $\lambda_R$ is the wavelength of light intensified in the region 222R).

In the above manner, with the microcavity structure, in which the optical length between the pair of electrodes in the respective regions is adjusted, scattering and absorption of light in the vicinity of the electrodes can be suppressed, resulting in high light extraction efficiency. In the above structure, the conductive layers 101b, 103b, and 104b preferably have a function of transmitting light. The materials of the conductive layers 101b, 103b, and 104b may be the same or different. Each of the conductive layers 101b, 103b, and 104b may have a stacked structure of two or more layers.

Since the light-emitting element 262a illustrated in FIG. 7A has a top-emission structure, it is preferable that the conductive layer 101a, the conductive layer 103a, and the conductive layer 104a have a function of reflecting light. In addition, it is preferable that the electrode 102 have functions of transmitting light and reflecting light.

Since the light-emitting element 262b illustrated in FIG. 7B has a bottom-emission structure, it is preferable that the conductive layer 101a, the conductive layer 103a, and the conductive layer 104a have functions of transmitting light and reflecting light. In addition, it is preferable that the electrode 102 have a function of reflecting light.

In each of the light-emitting elements 262a and 262b, the conductive layers 101a, 103a, and 104a may be formed of different materials or the same material. When the conductive layers 101a, 103a, and 104a are formed of the same material, manufacturing cost of the light-emitting elements 262a and 262b can be reduced. Note that each of the conductive layers 101a, 103a, and 104a may have a stacked structure including two or more layers.

The light-emitting layer 130 in the light-emitting elements 262a and 262b preferably has the structure described in Embodiment 1, in which case light-emitting elements with high luminous efficiency can be fabricated.

Either or both of the light-emitting layers 130 and 140 may have a stacked structure of two layers, like a light-emitting layer 140a and a light-emitting layer 140b. The two light-emitting layers including two kinds of light-emitting materials (a first light-emitting material and a second light-emitting material) for emitting different colors of light enable light emission of a plurality of colors. It is particularly preferable to select the light-emitting materials of the light-emitting layers so that white light can be obtained by combining light emissions from the light-emitting layers 130 and 140.

Either or both of the light-emitting layers 130 and 140 may have a stacked structure of three or more layers, in which a layer not including a light-emitting material may be included.

In the above-described manner, the light-emitting element 262a or 262b including the light-emitting layer which has the structure described in Embodiment 1 is used in pixels in a display device, whereby a display device with high luminous efficiency can be fabricated. Accordingly, the display device including the light-emitting element 262a or 262b can have low power consumption.

For the other components of the light-emitting elements 262a and 262b, the components of the light-emitting element 260 or the light-emitting element in Embodiment 1 or 2 can be referred to.

Note that the structure described in this embodiment can be combined as appropriate with any of the structures described in the other embodiments.

Embodiment 4

In this embodiment, a display device including a light-emitting element of one embodiment of the present invention will be described with reference to FIGS. 8A and 8B, FIGS. 9A and 9B, and FIGS. 10A and 10B.

<Structure Example 1 of Display Device>

Figure 8A:
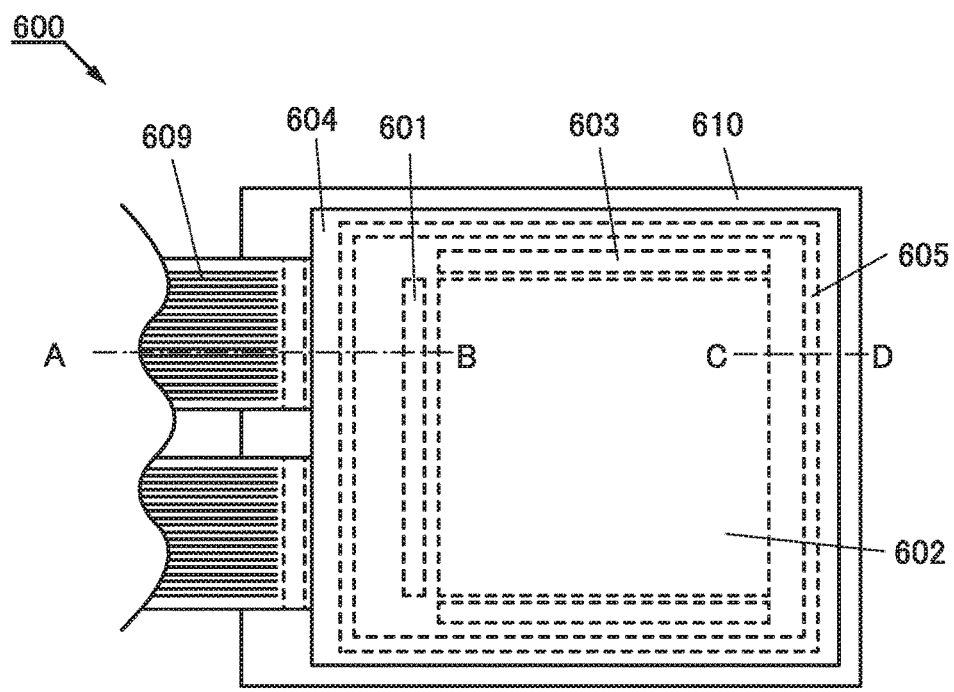
FIGS. 8A and 8B are a top view and a schematic cross-sectional view illustrating a display device of one embodiment of the present invention.
Figure 8B:
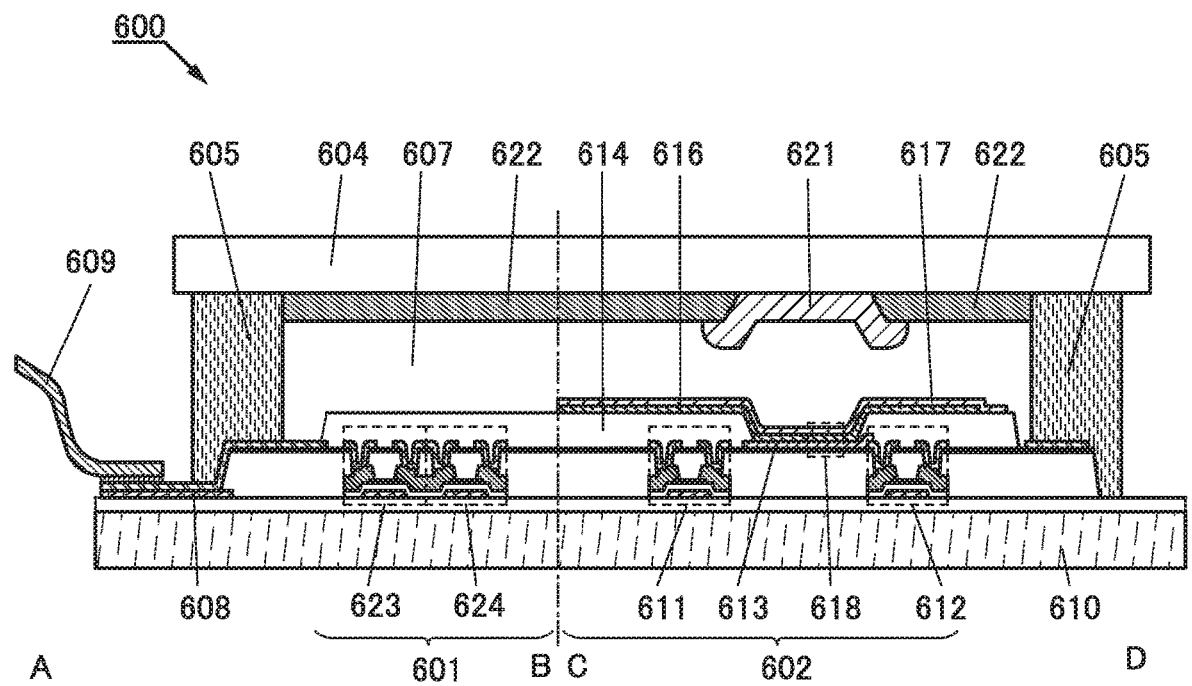

FIG. 8A is a top view illustrating a display device 600 and FIG. 8B is a cross-sectional view taken along the dashed-dotted line A-B and the dashed-dotted line C-D in FIG. 8A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for the transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more, and further preferably 3 eV or more, for the transistors, so that the off-state current of the transistors can be reduced. Examples of the oxide semiconductor include an In—Ga oxide, an In-M-Zn oxide (M is aluminum (Al), gallium (Ga), yttrium (Y), zirconium (Zr), lanthanum (La), cerium (Ce), tin (Sn), hafnium (Hf), or neodymium (Nd)), and the like.

An EL layer 616 and an upper electrode 617 are formed over the lower electrode 613. Here, the lower electrode 613 functions as an anode and the upper electrode 617 functions as a cathode.

In addition, the EL layer 616 is formed by any of various methods including an evaporation method (including a vacuum evaporation method) with an evaporation mask, a droplet discharge method (also referred to as an ink-jet method), a coating method such as a spin coating method, and a gravure printing method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1 to 3. In the case where the pixel portion includes a plurality of light-emitting elements, the pixel portion may include both any of the light-emitting elements described in Embodiments 1 to 3 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 3, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastics (FRP), poly(vinyl fluoride) (PVF), polyester, acrylic, or the like can be used.

In the above-described manner, a display device including any of the light-emitting elements and the optical elements which are described in Embodiments 1 to 3 can be obtained.

<Structure Example 2 of Display Device>

Next, another example of the display device will be described with reference to FIGS. 9A and 9B. Note that FIGS. 9A and 9B are each a cross-sectional view of a display device of one embodiment of the present invention.

Figure 9A:
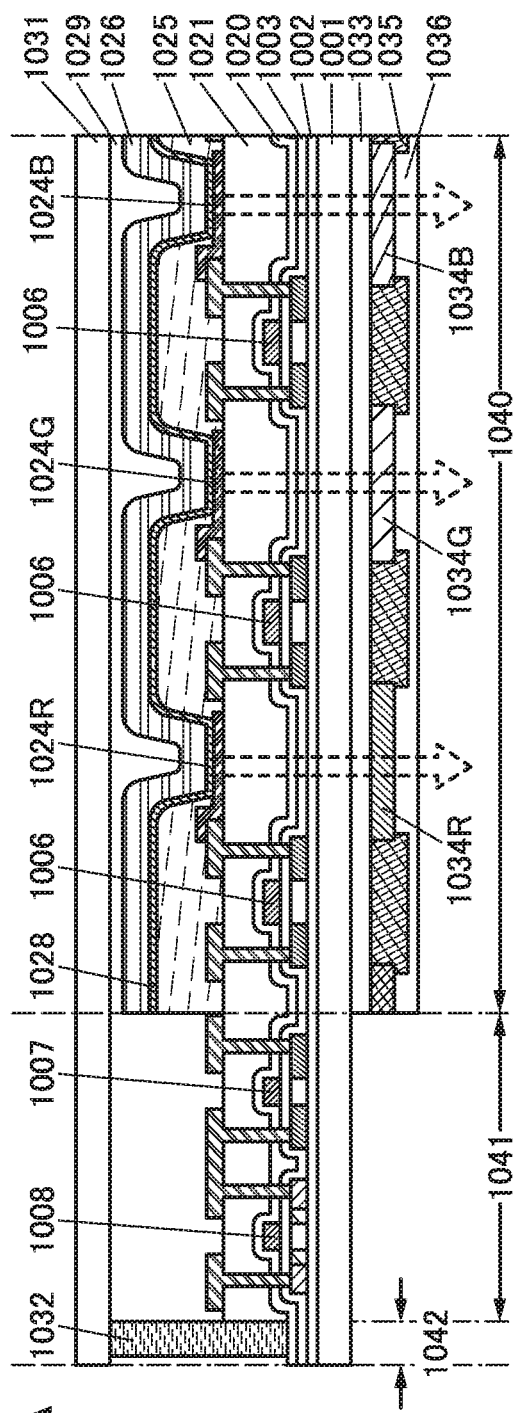
FIGS. 9A and 9B are schematic cross-sectional views each illustrating a display device of one embodiment of the present invention.

In FIG. 9A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 9A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 9A, the coloring layers transmit red light, green light, and blue light, and thus an image can be displayed with the use of pixels of three colors.

Figure 9B:
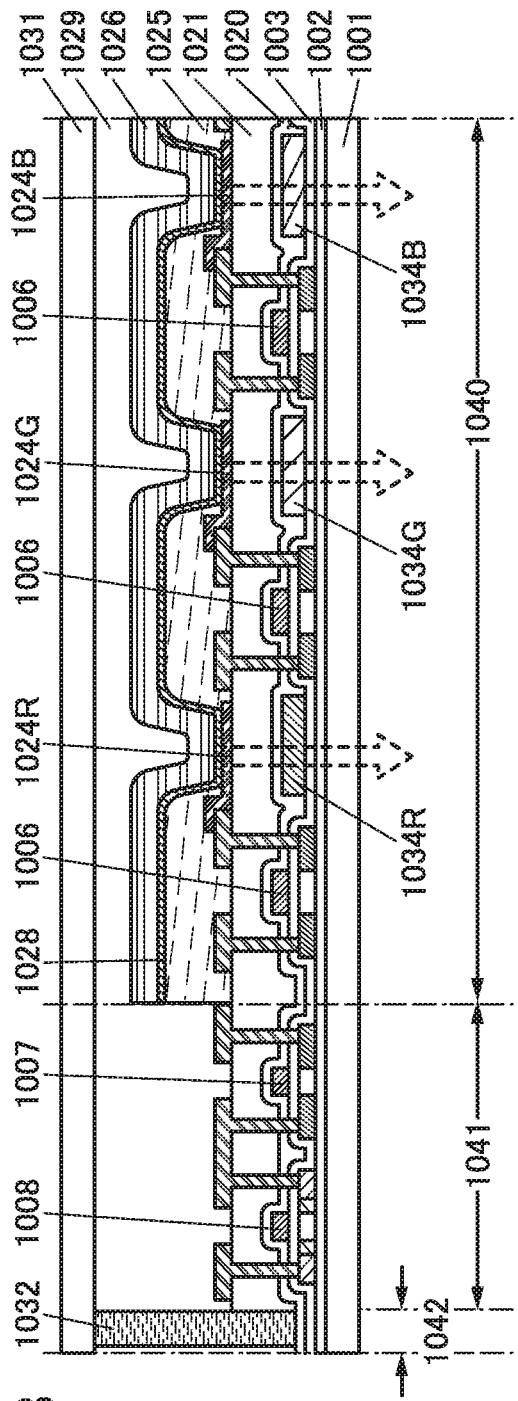

FIG. 9B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

As examples of the optical elements, the coloring layers (the red coloring layer 1034R, the green coloring layer 1034G, and the blue coloring layer 1034B) are provided between the first interlayer insulating film 1020 and the second interlayer insulating film 1021.

The above-described display device has a structure in which light is extracted from the substrate 1001 side where the transistors are formed (a bottom-emission structure), but may have a structure in which light is extracted from the sealing substrate 1031 side (a top-emission structure).

<Structure Example 3 of Display Device>

Figure 10A:
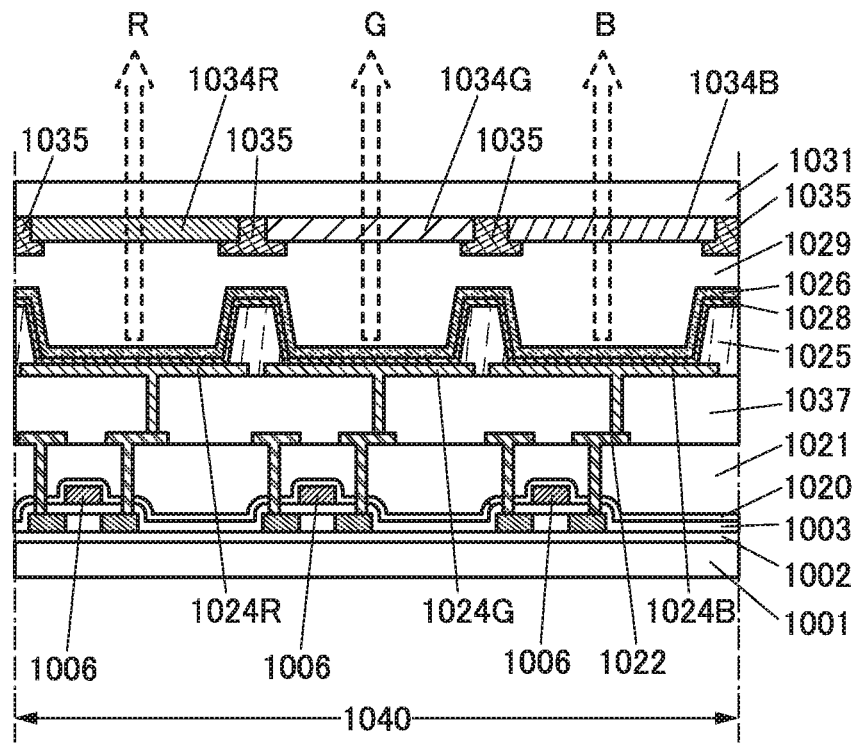
FIGS. 10A and 10B are schematic cross-sectional views each illustrating a display device of one embodiment of the present invention.
Figure 10B:
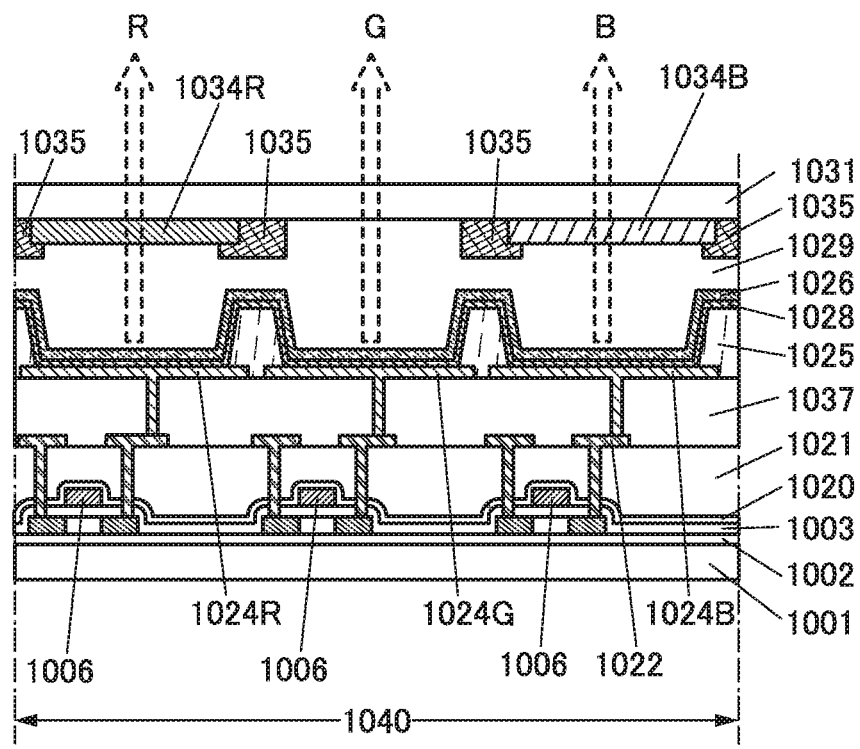

FIGS. 10A and 10B are each an example of a cross-sectional view of a display device having a top-emission structure. Note that FIGS. 10A and 10B are each a cross-sectional view illustrating the display device of one embodiment of the present invention, and the driver circuit portion 1041, the peripheral portion 1042, and the like, which are illustrated in FIGS. 9A and 9B, are not illustrated therein.

In that case, a substrate which does not transmit light can be used as the substrate 1001. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using any of various other materials.

The lower electrodes 1024R, 1024G, and 1024B of the light-emitting elements each function as an anode here, but may function as a cathode. Further, in the case of a display device having a top-emission structure as illustrated in FIGS. 10A and 10B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 10A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 10A illustrates the structure provided with the light-emitting elements and the coloring layers for the light-emitting elements as an example; however, the structure is not limited thereto. For example, as shown in FIG. 10B, a structure including the red coloring layer 1034R and the blue coloring layer 1034B but not including a green coloring layer may be employed to achieve full color display with the three colors of red, green, and blue. The structure as illustrated in FIG. 10A where the light-emitting elements are provided with the coloring layers is effective to suppress reflection of external light. In contrast, the structure as illustrated in FIG. 10B where the light-emitting elements are provided with the red coloring layer and the blue coloring layer but not with the green coloring layer is effective in reducing power consumption because of small energy loss of light emitted from the green-light-emitting element.

Although a display device including sub-pixels of three colors (red, green, and blue) is described above, the number of colors of sub-pixels may be four (red, green, blue, and yellow, or red, green, blue, and white). In this case, a coloring layer can be used which has a function of transmitting yellow light or a function of transmitting light of a plurality of colors selected from blue, green, yellow, and red. In the case where the coloring layer can transmit light of a plurality of colors selected from blue, green, yellow, and red, light passing through the coloring layer may be white light. Since the light-emitting element which exhibits yellow or white light has high luminous efficiency, the display device having such a structure can have lower power consumption.

Furthermore, in the display device 600 shown in FIGS. 8A and 8B, a sealing layer may be formed in the region 607 which is surrounded by the element substrate 610, the sealing substrate 604, and the sealant 605. For the sealing layer, a resin such as a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer in the region 607 can prevent deterioration of the light-emitting element 618 due to impurities such as water, which is preferable. Note that in the case where the sealing layer is formed, the sealant 605 is not necessarily provided.

When the sealing layer has a multilayer structure, the impurities such as water can be effectively prevented from entering the light-emitting element 618 which is inside the display device from the outside of the display device 600. In the case where the sealing layer has a multilayer structure, a resin and an inorganic material are preferably stacked.

The structures described in this embodiment can be combined as appropriate with any of the other structures in this embodiment and the other embodiments.

Embodiment 5

In this embodiment, a display module, electronic devices, a light-emitting device, and lighting devices each including the light-emitting element of one embodiment of the present invention are described with reference to FIG. 11, FIGS. 12A to 12G, FIGS. 13A to 13C, and FIG. 14.
<Display Module>

Figure 11:
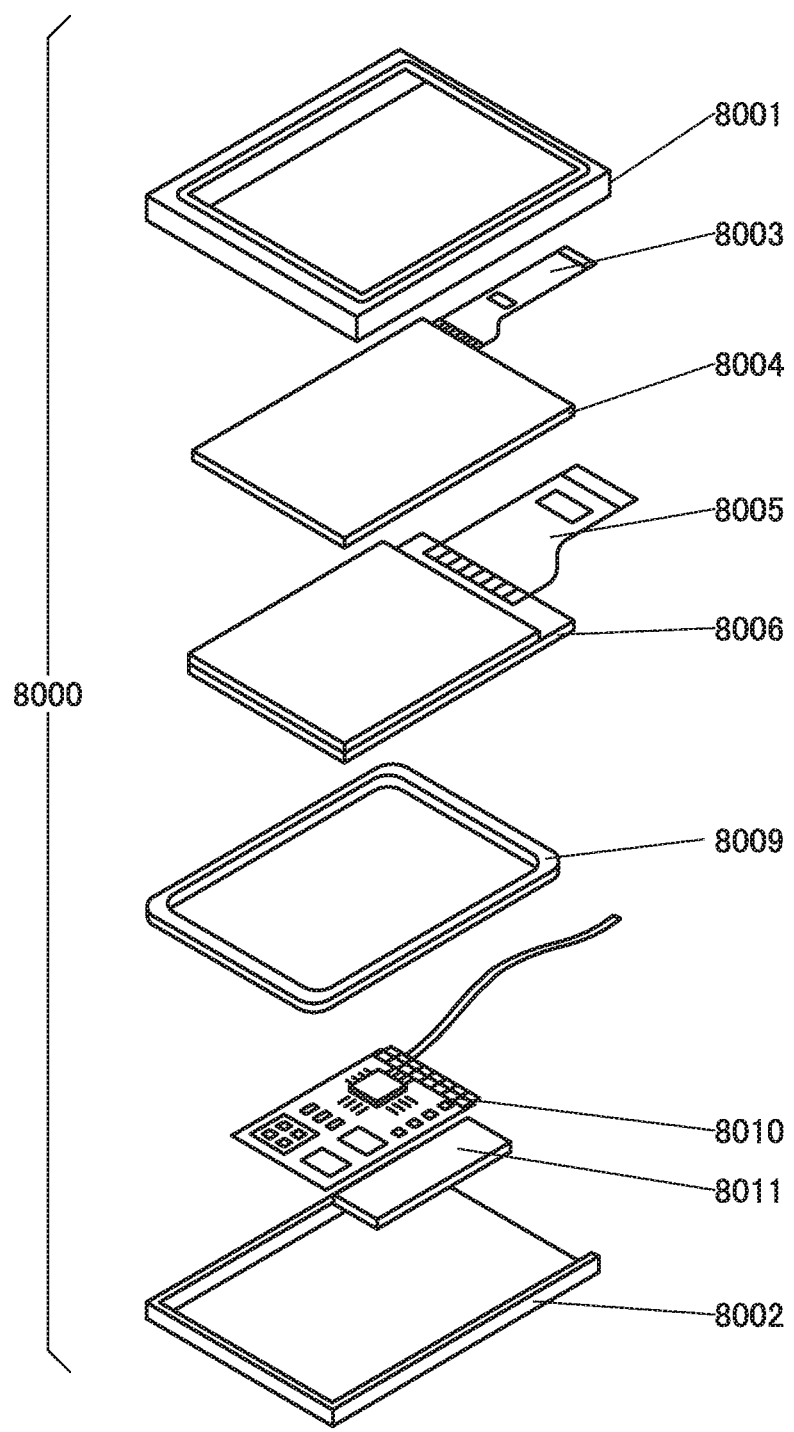
FIG. 11 is a perspective view illustrating a display module of one embodiment of the present invention.

In a display module 8000 in FIG. 11, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate depending on the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also functions as an electromagnetic shield for blocking electromagnetic waves generated by the operation of the printed board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.
<Electronic Device>

FIGS. 12A to 12G show electronic devices. These electronic devices can each include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 12A to 12G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that the electronic devices illustrated in FIGS. 12A to 12G can have a variety of functions without limitation to the above functions. Although not illustrated in FIGS. 12A to 12G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 12A to 12G will be described in detail below.

Figure 12A:
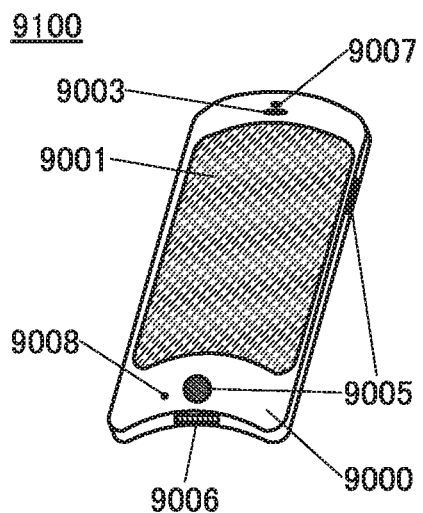
FIGS. 12A to 12G illustrate electronic devices of one embodiment of the present invention.

FIG. 12A is a perspective view of a portable information terminal 9100. The display portion 9001 of the portable information terminal 9100 is flexible. Therefore, the display portion 9001 can be incorporated along a curved surface of a curved housing 9000. In addition, the display portion 9001 includes a touch sensor, and operation can be performed by touching the screen with a finger, a stylus, or the like. For example, when an icon displayed on the display portion 9001 is touched, an application can be started.

Figure 12B:
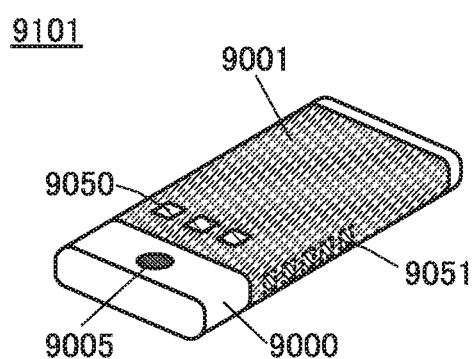

FIG. 12B is a perspective view illustrating a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in FIG. 12A, can be positioned in the portable information terminal 9101 as in the portable information terminal 9100 illustrated in FIG. 12A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, plastic, or ceramic can be used. As a plastic, a reinforced plastic can also be used. A carbon fiber reinforced plastics (CFRP), which is a kind of reinforced plastic, has advantages of being lightweight and corrosion-free. Other examples of the reinforced plastic include one including glass fiber and one including aramid fiber. As the alloy, an aluminum alloy and a magnesium alloy can be given. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is put in a mold of at least part of the housing and coagulated so that the part of the housing is formed using a bulk-solidifying amorphous alloy. The amorphous alloy may include beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 12C:
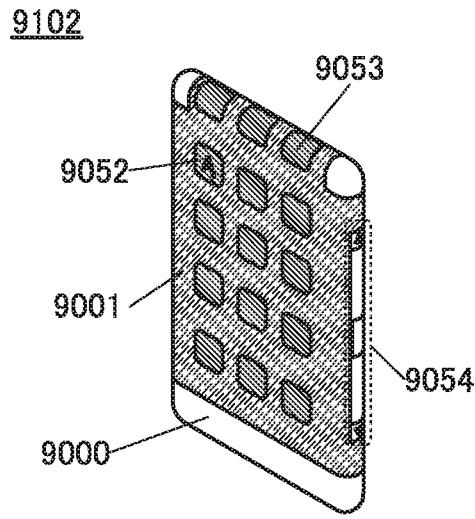

FIG. 12C is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 12D:
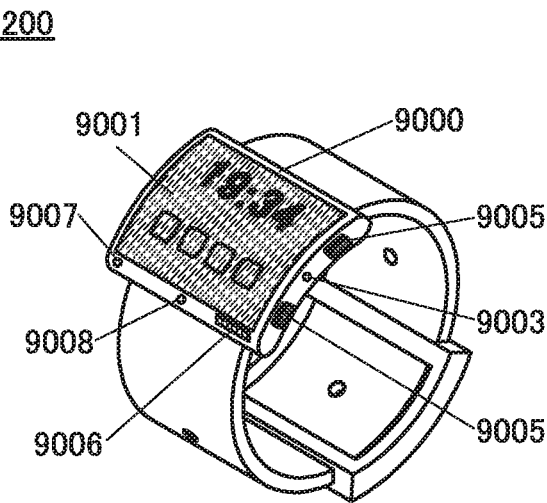

FIG. 12D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 12E:
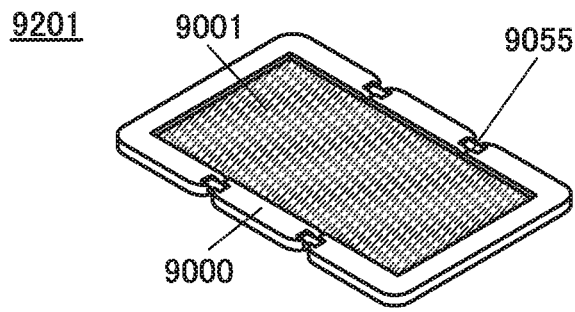
Figure 12F:
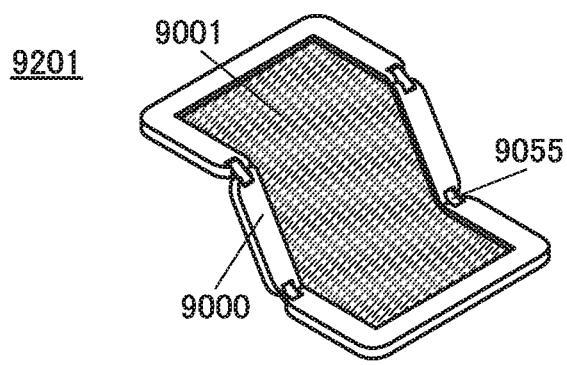
Figure 12G:
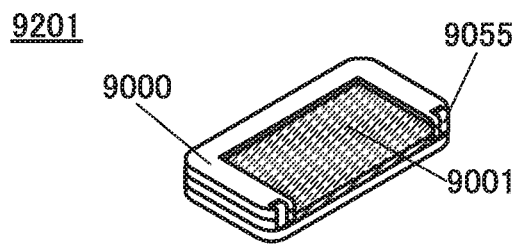

FIGS. 12E, 12F, and 12G are perspective views of a foldable portable information terminal 9201. FIG. 12E is a perspective view illustrating the portable information terminal 9201 that is opened. FIG. 12F is a perspective view illustrating the portable information terminal 9201 that is shifted from the opened state to the folded state or from the folded state to the opened state. FIG. 12G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a digital camera, a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

The electronic device or the lighting device of one embodiment of the present invention has flexibility and therefore can be incorporated along a curved inside/outside wall surface of a house or a building or a curved interior/exterior surface of a car. For example, the electronic device or the lighting device can be used for lighting for a dashboard, a windshield, a ceiling, and the like of a car.

<Light-Emitting Device>

Figure 13A:
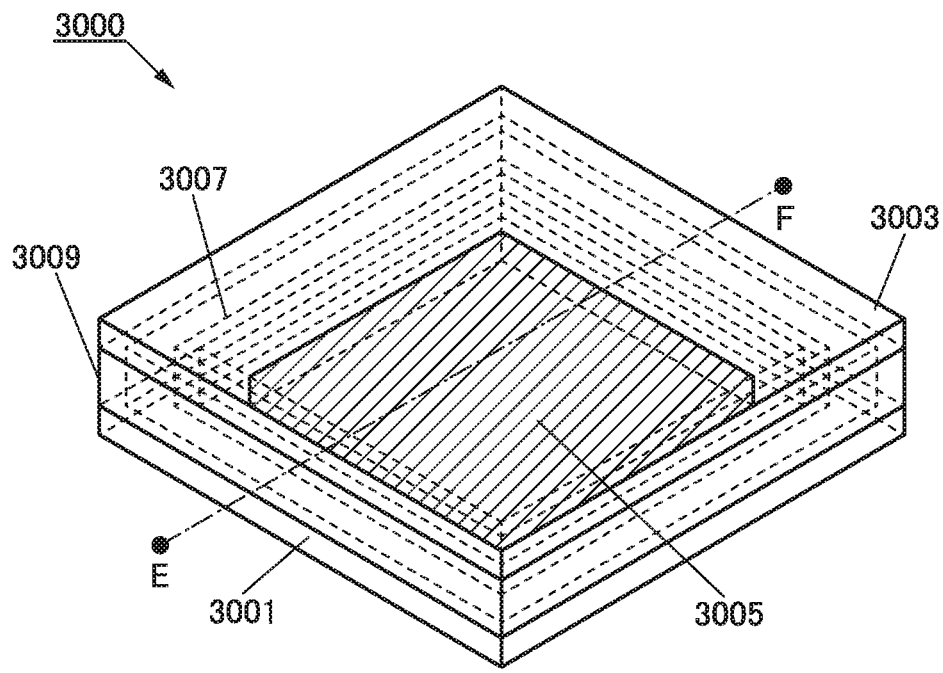
FIGS. 13A to 13C illustrate a display device of one embodiment of the present invention.
Figure 13B:
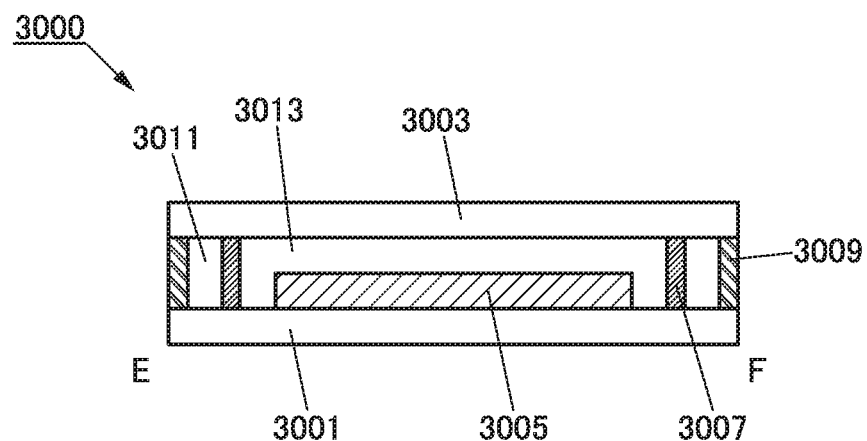

FIG. 13A is a perspective view of a light-emitting device 3000 shown in this embodiment, and FIG. 13B is a cross-sectional view along dashed-dotted line E-F in FIG. 13A. Note that in FIG. 13A, some components are illustrated by broken lines in order to avoid complexity of the drawing.

The light-emitting device 3000 illustrated in FIGS. 13A and 13B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 13A and 13B, a structure in which light is emitted from the light-emitting element 3005 to the lower side (the substrate 3001 side) is illustrated.

As illustrated in FIGS. 13A and 13B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 13B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited thereto, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 13B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 13C:
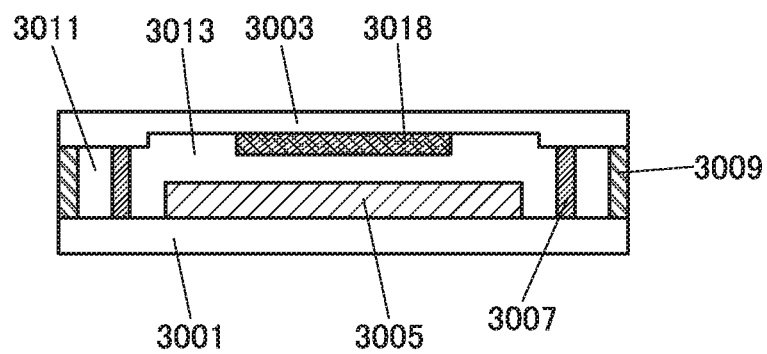

FIG. 13C illustrates a modification example of the structure in FIG. 13B. FIG. 13C is a cross-sectional view illustrating the modification example of the light-emitting device 3000.

FIG. 13C illustrates a structure in which a desiccant 3018 is provided in a recessed portion provided in part of the substrate 3003. The other components are the same as those of the structure illustrated in FIG. 13B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxides (e.g., calcium oxide, barium oxide, and the like), sulfate, metal halides, perchlorate, zeolite, silica gel, and the like.

<Lighting Device>

FIG. 14 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. The light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which functions as a table can be obtained. When the light-emitting element is used as part of other furniture, a lighting device which functions as the furniture can be obtained.

As described above, display modules, light-emitting devices, electronic devices, and lighting devices can be obtained by application of the light-emitting element of one embodiment of the present invention. Note that the light-emitting element can be used for electronic devices in a variety of fields without being limited to the lighting devices and the electronic devices described in this embodiment.

The structure described in this embodiment can be combined with any of the structures described in the other embodiments as appropriate.

Example 1

In this example, examples of fabrication methods of the light-emitting element of one embodiment of the present invention and a comparative light-emitting element will be described. The structure of each of the light-emitting elements fabricated in this example is the same as that illustrated in FIG. 1. Table 1 shows the details of the element structures. In addition, structures and abbreviations of compounds used here are given below.

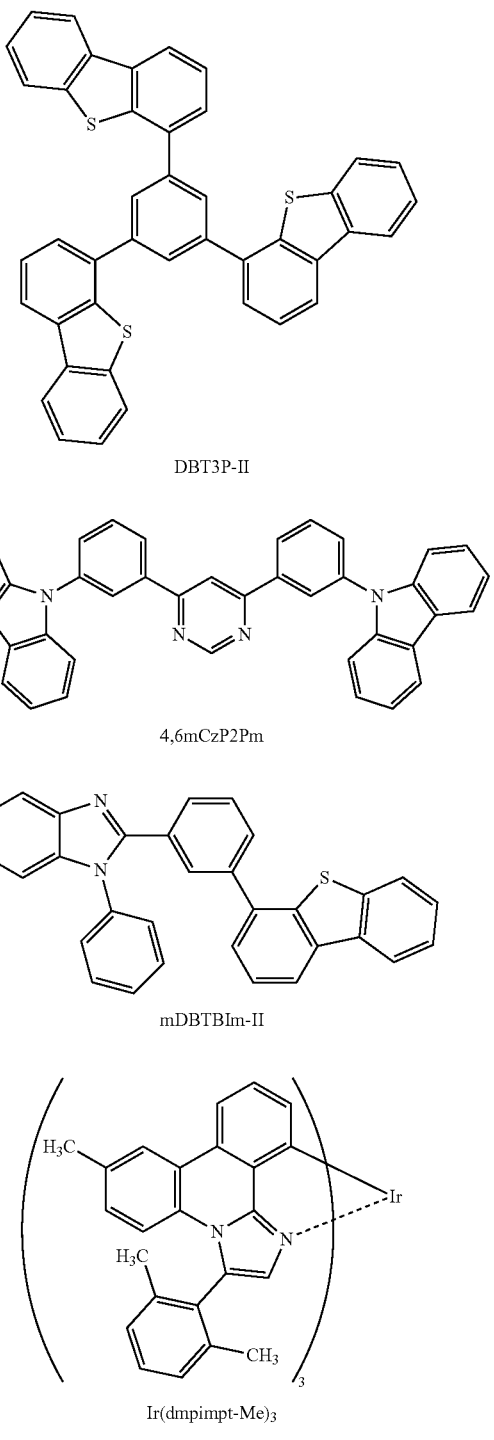

-continued

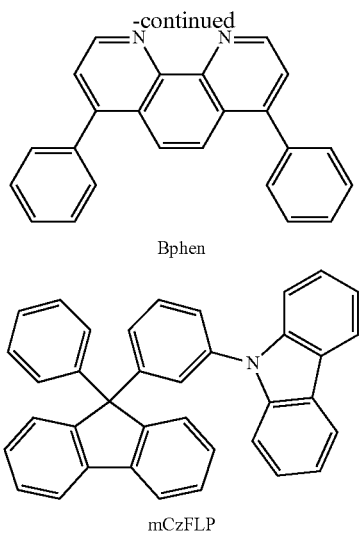

Bphen mCzFLP

As the electron-transport layer 118, 4,6mCzP2Pm and Bphen were sequentially deposited by evaporation to thicknesses of 20 nm and 10 nm, respectively, over the light-emitting layer 130. Then, as the electron-injection layer 119, LiF was deposited over the electron-transport layer 118 by evaporation to a thickness of 1 nm.

As the electrode 102, aluminum (Al) was formed over the electron-injection layer 119 to a thickness of 200 nm.

Next, in a glove box containing a nitrogen atmosphere, the electrodes and the EL layer were sealed by fixing a glass substrate for sealing to the glass substrate on which the organic materials were deposited using a sealant for an organic EL device. Specifically, after the sealant was applied so as to surround the organic materials deposited on the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above process, the light-emitting element 1 was fabricated.

<<Fabrication of Comparative Light-Emitting Element 1>>

As the electrode 101, an ITSO film was formed to a thickness of 110 nm over a glass substrate. The electrode area of the electrode 101 was set to 4 mm$^2$ (2 mm×2 mm).

TABLE 1

| | Layer | Reference numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:Ir(dmpimpt-Me)$_3$ | 1:0.1 |
| | Hole-transport layer | 112 | 20 | mCzFLP | — |
| | Hole-injection layer | 111 | 60 | DBT3P-II:MoO$_3$ | 1:0.5 |
| | Electrode | 101 | 70 | ITSO | — |
| Comparative light-emitting element 1 | Electrode | 102 | 200 | Al | — |
| | Electron-injection layer | 119 | 1 | LiF | — |
| | Electron-transport layer | 118 (2) | 15 | BPhen | — |
| | | 118 (1) | 10 | mDBTBIm-II:Ir(dmpimpt-Me)$_3$ | 1:0.08 |
| | Light-emitting layer | 130 | 30 | mCP:Ir(dmpimpt-Me)$_3$ | 1:0.08 |
| | Hole-transport layer | 112 | 20 | mCP | — |
| | Hole-injection layer | 111 | 60 | DBT3P-II:MoO$_3$ | 1:0.5 |
| | Electrode | 101 | 110 | ITSO | — |

<Fabrication of Light-Emitting Elements>

Methods for fabricating the light-emitting elements fabricated in this example will be described below.

<<Fabrication of Light-Emitting Element 1>>

As the electrode 101, an ITSO film was formed to a thickness of 70 nm over a glass substrate. The electrode area of the electrode 101 was set to 4 mm$^2$ (2 mm×2 mm).

As the hole-injection layer 111, DBT3P-II and molybdenum oxide (MoO$_3$) were deposited to a thickness of 60 nm over the electrode 101 by co-evaporation at a weight ratio of 1:0.5 (DBT3P-II:MoO$_3$).

As the hole-transport layer 112, 9-[3-(9-phenyl-9H-fluoren-9-yl)phenyl]-9H-carbazole (abbreviation: mCzFLP) was deposited over the hole-injection layer 111 by evaporation to a thickness of 20 nm.

As the light-emitting layer 130, 4,6mCzP2Pm and Ir(dmpimpt-Me)$_3$ were deposited to a thickness of 40 nm over the hole-transport layer 112 by co-evaporation at a weight ratio of 1:0.1 (4,6mCzP2Pm:Ir(dmpimpt-Me)$_3$). In the light-emitting layer 130, Ir(dmpimpt-Me)$_3$ was a phosphorescent compound corresponding to the first organic compound, and 4,6mCzP2Pm corresponded to the second organic compound.

As the hole-injection layer 111, DBT3P-II and molybdenum oxide (MoO$_3$) were deposited to a thickness of 60 nm over the electrode 101 by co-evaporation at a weight ratio of 1:0.5 (DBT3P-II:MoO$_3$).

As the hole-transport layer 112, mCP was deposited over the hole-injection layer 111 by evaporation to a thickness of 20 nm.

As the light-emitting layer 130, mCP and Ir(dmpimpt-Me)$_3$ were deposited to a thickness of 30 nm over the hole-transport layer 112 by co-evaporation at a weight ratio of 1:0.08 (mCP:Ir(dmpimpt-Me)$_3$). In the light-emitting layer 130, Ir(dmpimpt-Me)$_3$ was a phosphorescent compound corresponding to a guest material and mCP corresponded to a host material.

As the electron-transport layer 118, mDBTBIm-II and Ir(dmpimpt-Me)$_3$ were deposited to a thickness of 10 nm over the light-emitting layer 130 by co-evaporation at a weight ratio of 1:0.08 (mDBTBIm-II:Ir(dmpimpt-Me)$_3$), and then BPhen was deposited by evaporation to a thickness of 15 nm. Then, as the electron-injection layer 119, LiF was deposited over the electron-transport layer 118 by evaporation to a thickness of 1 nm.

As the electrode 102, aluminum (Al) was formed over the electron-injection layer 119 to a thickness of 200 nm.

Next, in a glove box containing a nitrogen atmosphere, the electrodes and the EL layer were sealed by fixing a glass substrate for sealing to the glass substrate on which the organic materials were deposited using a sealant for an organic EL device. For the detailed method, the description of the light-emitting element 1 can be referred to. Through the above process, the comparative light-emitting element 1 was fabricated.

<Characteristics of Light-Emitting Elements>

Next, the characteristics of the fabricated light-emitting element 1 and comparative light-emitting element 1 were measured. Luminances and CIE chromaticities were measured with a luminance colorimeter (BM-5A produced by TOPCON TECHNOHOUSE CORPORATION), and electroluminescence spectra were measured with a multi-channel spectrometer (PMA-11 produced by Hamamatsu Photonics K.K.).

Figure 15:
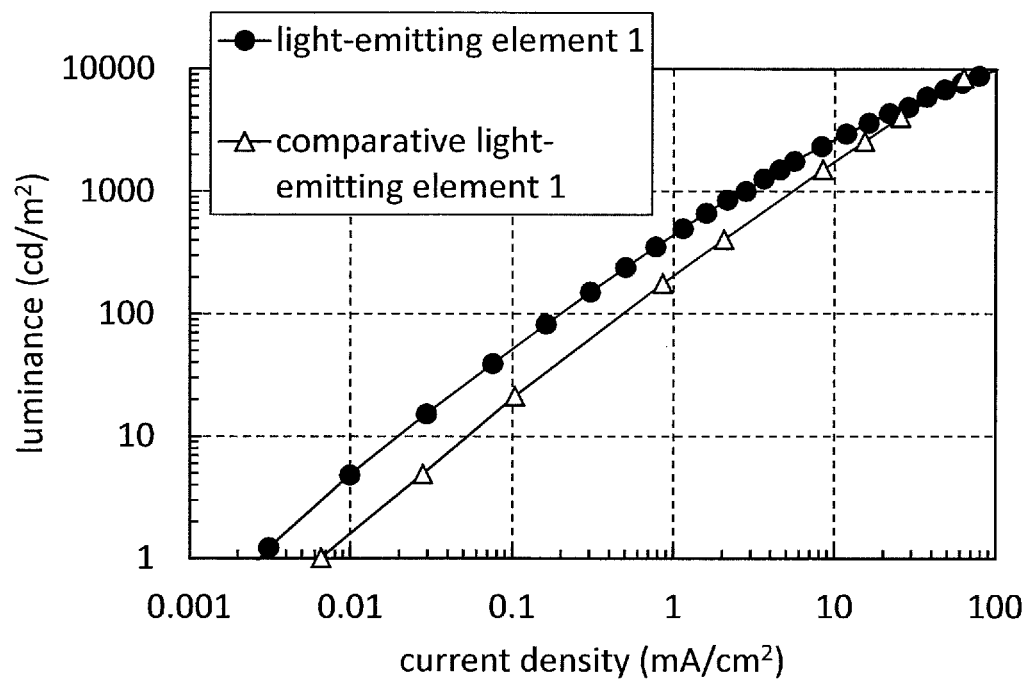
FIG. 15 shows the luminance-current density characteristics of light-emitting elements in Example.
Figure 16:
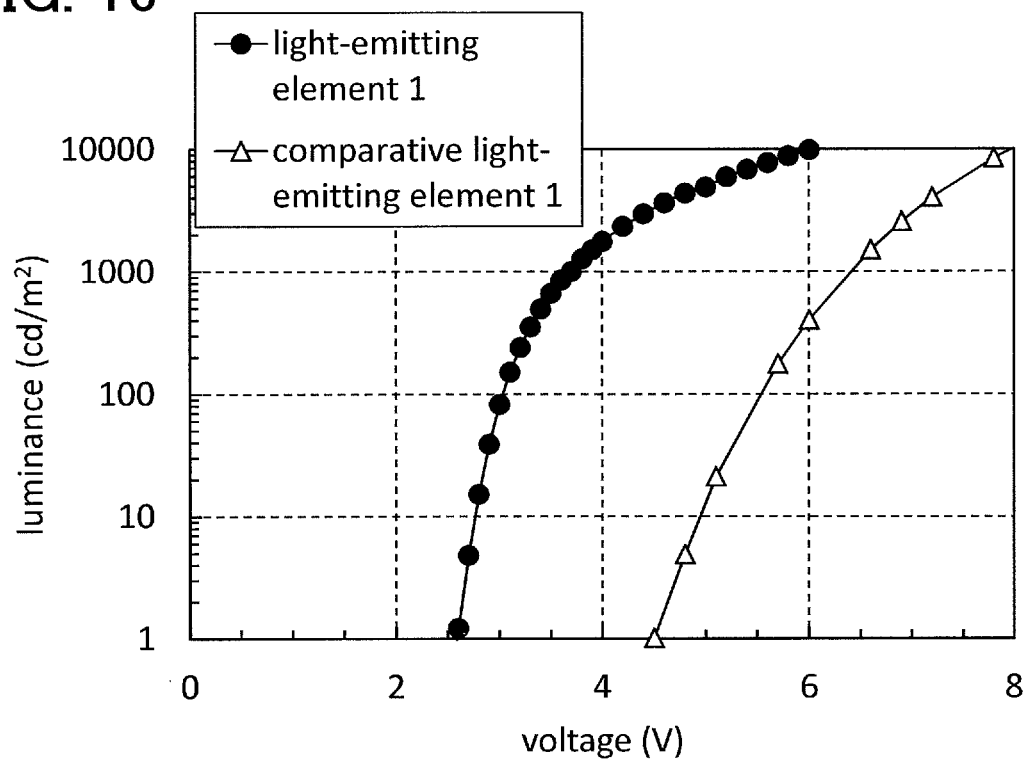
FIG. 16 shows the luminance-voltage characteristics of light-emitting elements in Example.
Figure 17:
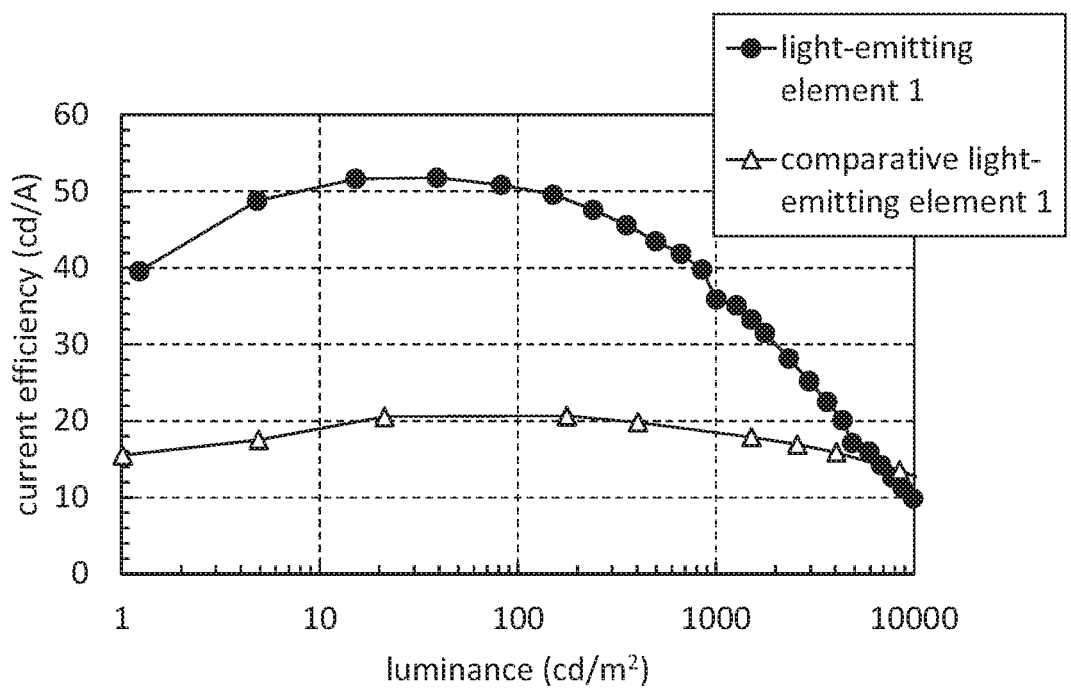
FIG. 17 shows the current efficiency-luminance characteristics of light-emitting elements in Example.
Figure 18:
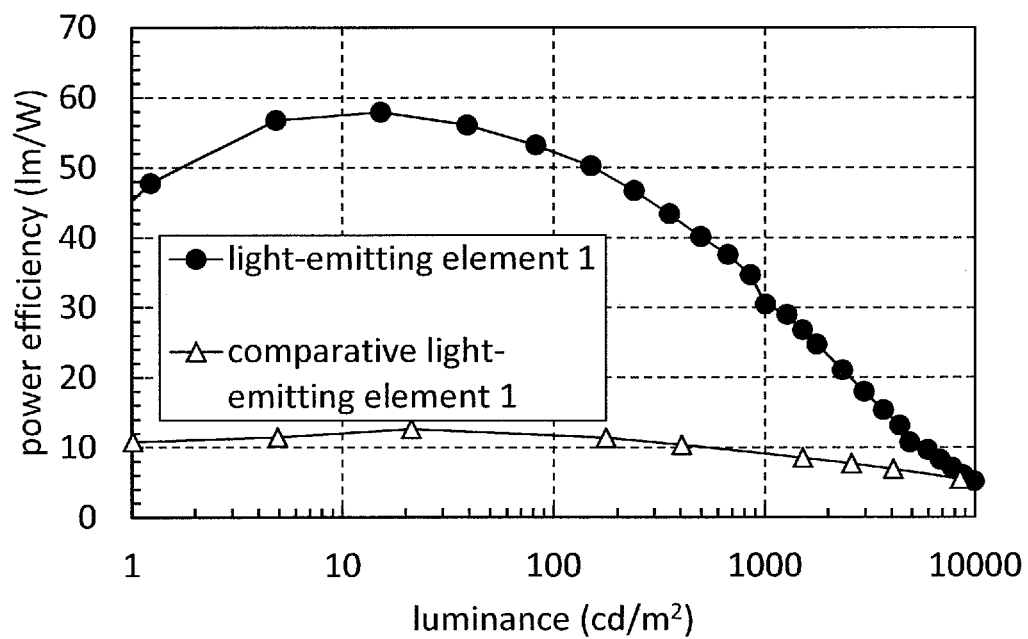
FIG. 18 shows the power efficiency-luminance characteristics of light-emitting elements in Example.
Figure 19:
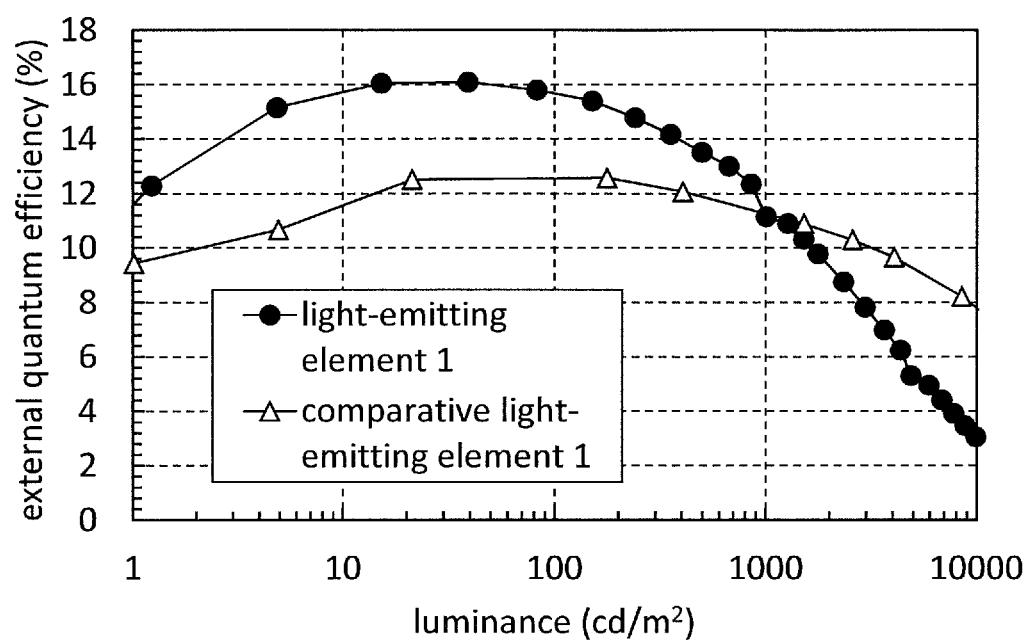
FIG. 19 shows the external quantum efficiency-luminance characteristics of light-emitting elements in Example.
Figure 20:
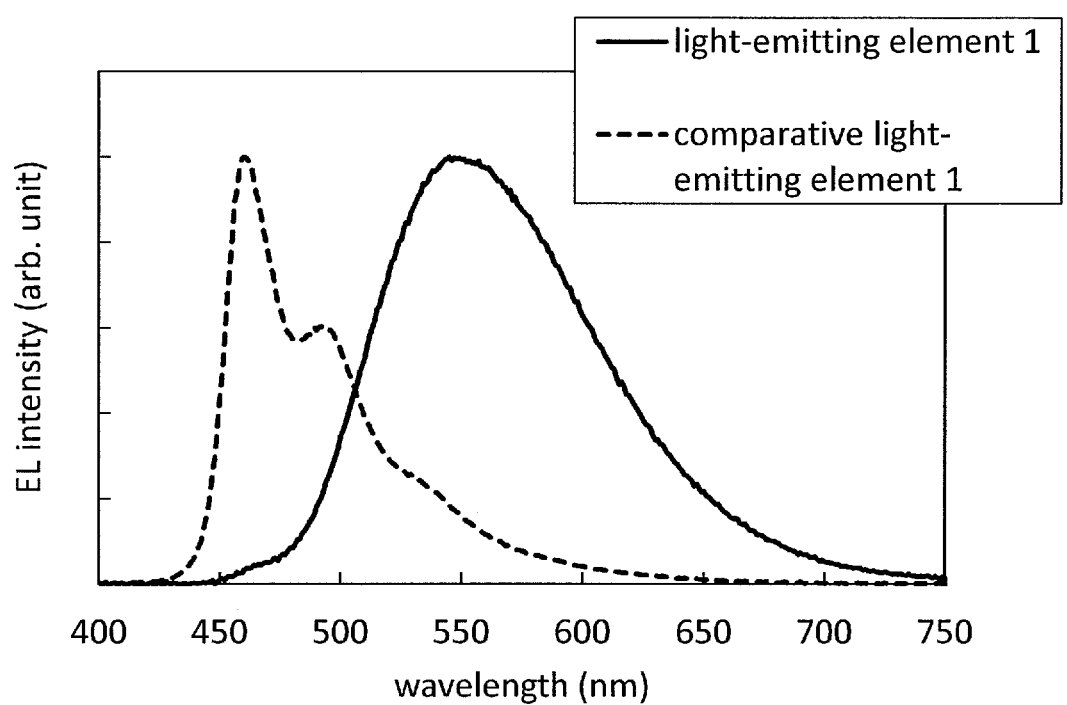
FIG. 20 shows electroluminescence spectra of light-emitting elements in Example.

FIG. 15 shows the luminance-current density characteristics of the light-emitting element 1 and the comparative light-emitting element 1. FIG. 16 shows the luminance-voltage characteristics thereof. FIG. 17 shows the current efficiency-luminance characteristics thereof. FIG. 18 shows the power efficiency-luminance characteristics thereof. FIG. 19 shows the external quantum efficiency-luminance characteristics thereof. FIG. 20 shows the electroluminescence spectra obtained when a current at a current density of 2.5 mA/cm$^2$ was supplied to the light-emitting element 1 and the comparative light-emitting element 1. The measurements of the light-emitting elements were performed at room temperature (in an atmosphere kept at 23° C.).

Table 2 shows the element characteristics of the light-emitting element 1 and the comparative light-emitting element 1 at around 500 cd/m$^2$.

compound (Ir(dmpimpt-Me)$_3$) and the second organic compound (4,6mCzP2Pm) is a light-emitting element with high luminous efficiency that drives at low driving voltage at low power consumption.

<CV Measurement Results>

The electrochemical characteristics (oxidation reaction characteristics and reduction reaction characteristics) of the above compounds were measured by cyclic voltammetry (CV) measurement. Note that for the measurement, an electrochemical analyzer (ALS model 600A or 600C, produced by BAS Inc.) was used, and the measurement was performed on a solution obtained by dissolving each compound in N,N-dimethylformamide (abbreviation: DMF). In the measurement, the potential of a working electrode with respect to the reference electrode was changed within an appropriate range, so that the oxidation peak potential and the reduction peak potential were obtained. In addition, the HOMO and LUMO levels of each compound were calculated from the estimated redox potential of the reference electrode (−4.94 eV) and the obtained peak potentials.

According to the CV measurement results, the oxidation potential and the reduction potential of 4,6mCzP2Pm were 0.95 V and −2.06 V, respectively. The HOMO level and the LUMO level of 4,6mCzP2Pm calculated from the CV measurement results were −5.89 eV and −2.88 eV, respectively. Thus, it is found that 4,6mCzP2Pm has a low LUMO level. The oxidation potential and the reduction potential of Ir(dmpimpt-Me)$_3$ were 0.24 V and −2.67 V, respectively. The HOMO level and the LUMO level of Ir(dmpimpt-Me)$_3$ calculated from the CV measurement results were −5.18 eV and −2.27 eV, respectively. Thus, it is found that Ir(dmpimpt-Me)$_3$ has a high HOMO level. The oxidation potential of mCP was 0.97 V. The HOMO level of mCP

TABLE 2

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 1 | 3.30 | 1.01 | (0.528, 0.468) | 440 | 43.1 | 41.0 | 15.4 |
| Comparative light-emitting element 1 | 6.00 | 2.05 | (0.167, 0.239) | 410 | 19.8 | 10.4 | 12.1 |

As shown in FIG. 20, the electroluminescence spectrum of the light-emitting element 1 has a peak at a wavelength of 545 nm and has a large full width at half maximum of 105 nm. This indicates that the light-emitting element 1 emits yellow light. Meanwhile, the electroluminescence spectrum of the comparative light-emitting element 1 has a peak at a wavelength of 460 nm and has a small full width at half maximum of 52 nm. This indicates that the comparative light-emitting element 1 emits blue light. The light emission of the comparative light-emitting element 1 originated from a phosphorescent compound Ir(dmpimpt-Me)$_3$. Meanwhile, no light emission originating from a phosphorescent compound Ir(dmpimpt-Me)$_3$ was observed from the light-emitting element 1.

As shown in FIG. 15 to FIG. 19 and Table 2, the driving voltage of the light-emitting element 1 is lower than that of the comparative light-emitting element 1. Furthermore, the light-emitting element 1 has higher luminous efficiency (current efficiency, power efficiency, and external quantum efficiency) than the comparative light-emitting element 1. Accordingly, the light-emitting element of one embodiment of the present invention that contains the first organic calculated from the CV measurement results was −5.91 eV. Note that the LUMO level of mCP is probably high because the reduction potential of mCP was low and no clear reduction peak was observed.

As described above, the LUMO level and the HOMO level of 4,6mCzP2Pm, which is the second organic compound, are lower than those of Ir(dmpimpt-Me)$_3$, which is the first organic compound. Thus, in the case where the compounds are used in a light-emitting layer as in the light-emitting element 1, electrons and holes, which serve as carriers, are efficiently injected from a pair of electrodes into 4,6mCzP2Pm (the second organic compound) and Ir(dmpimpt-Me)$_3$ (the first organic compound), respectively, so that 4,6mCzP2Pm (the second organic compound) and Ir(dmpimpt-Me)$_3$ (the first organic compound) can form an exciplex.

The exciplex formed by 4,6mCzP2Pm and Ir(dmpimpt-Me)$_3$ has the LUMO level in 4,6mCzP2Pm and the HOMO level in Ir(dmpimpt-Me)$_3$. The energy difference between the LUMO level of 4,6mCzP2Pm and the HOMO level of Ir(dmpimpt-Me)$_3$ is 2.30 eV. This value is substantially equal to light emission energy (2.28 eV) calculated from the peak wavelength of the electroluminescence spectrum of the light-emitting element 1 in FIG. 20. This result implies that the electroluminescence spectrum of the light-emitting element 1 corresponds to light emission due to the exciplex formed by 4,6mCzP2Pm and Ir(dmpimpt-Me)$_3$. In the exciplex, the difference between the S1 level and the T1 level is small; thus, the light emission energy can be regarded as energy of each of the S1 level and the T1 level (2.28 eV).

Meanwhile, the CV measurement results indicate that the HOMO level of Ir(dmpimpt-Me)$_3$ is higher than that of mCP and the LUMO level of mCP is probably higher than that of Ir(dmpimpt-Me)$_3$. Thus, when the compounds are used for a light-emitting layer as in the comparative light-emitting element 1, both electrons and holes serving as carriers injected from a pair of electrodes are injected into Ir(dmpimpt-Me)$_3$, resulting in light emission from Ir(dmpimpt-Me)$_3$.

In the light-emitting element 1, an exciplex formed by 4,6mCzP2Pm and Ir(dmpimpt-Me)$_3$ emits light; thus, the exciplex can be formed with energy corresponding to the difference between the LUMO level of 4,6mCzP2Pm and the HOMO level of Ir(dmpimpt-Me)$_3$ (i.e., 2.30 eV). In contrast, in the comparative light-emitting element 1, Ir(dmpimpt-Me)$_3$ is excited to emit light; thus, at least energy corresponding to the difference between the LUMO level and the HOMO level of Ir(dmpimpt-Me)$_3$ (i.e., 2.91 eV) is needed for excitation. Therefore, the light-emitting element 1 can emit light at lower driving voltage than the comparative light-emitting element 1.

Furthermore, the excitation energy level of the exciplex formed by 4,6mCzP2Pm and Ir(dmpimpt-Me)$_3$ is smaller than the energy difference between the LUMO level and the HOMO level of 4,6mCzP2Pm (i.e., 3.01 eV). Thus, when the exciplex is formed, a light-emitting element with low driving voltage can be obtained.

<Measurement of T1 Level>

Next, to obtain the T1 levels of the compounds each used in the light-emitting layer 130, a thin film of 4,6mCzP2Pm and a thin film of mCP were each formed over a quartz substrate by a vacuum evaporation method, and the emission spectra of the thin films were measured at a low temperature (10 K).

The measurement was performed with a PL microscope and LabRAM HR-PL, produced by HORIBA, Ltd., at a measurement temperature of 10 K using a He—Cd laser having a wavelength of 325 nm as excitation light and a CCD detector as a detector.

Figure 21:
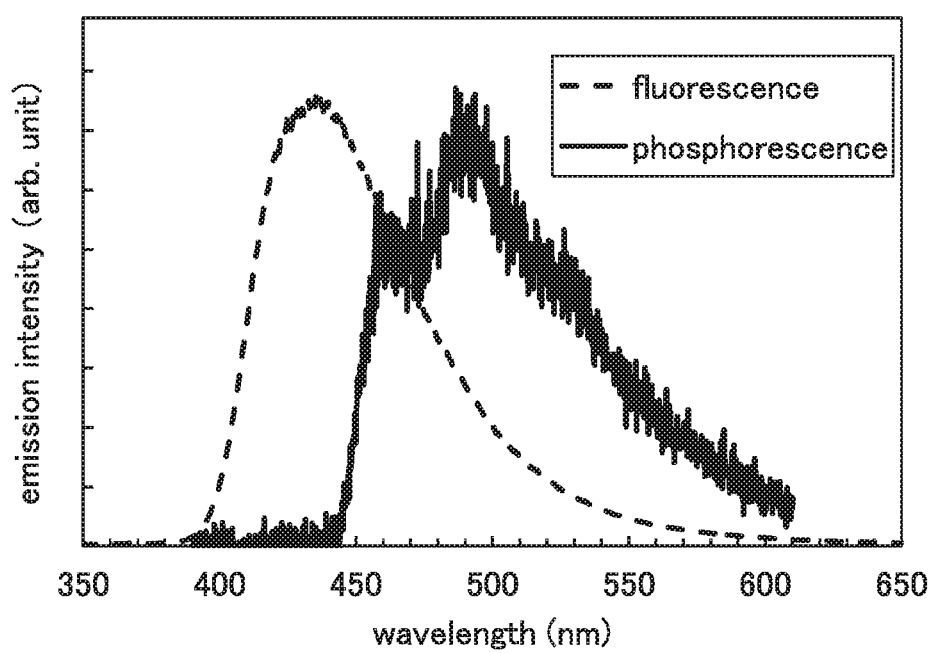
FIG. 21 shows emission spectra of a thin film in Example.
Figure 22:
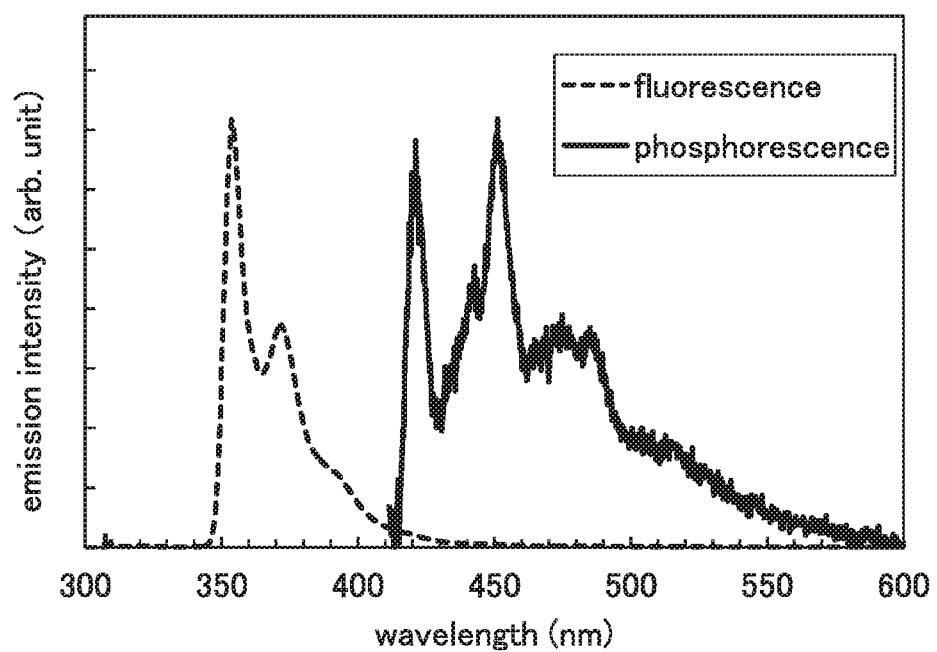
FIG. 22 shows emission spectra of a thin film in Example.

In the measurement method of the emission spectra, in addition to the normal measurement of emission spectra, the measurement of time-resolved emission spectra in which light emission with a long lifetime is focused on was performed. Since the measurement temperature in this measurement method of emission spectra was set at a low temperature (10 K, phosphorescence was partly observed in the normal measurement of emission spectra, in addition to fluorescence, which is the main emission component. Furthermore, in the measurement of time-resolved emission spectra in which light emission with a long lifetime is focused on, phosphorescence was mainly observed. FIG. 21 and FIG. 22 show the time-resolved emission spectra of 4,6mCzP2Pm and mCP, respectively, measured at a low temperature.

As shown in the measurement results of the emission spectra, the emission spectrum of 4,6mCzP2Pm has a peak (including a shoulder) of the phosphorescent component on the shortest wavelength side at 459 nm, and the emission spectrum of mCP has a peak (including a shoulder) of the phosphorescent component on the shortest wavelength side at 421 nm.

Thus, from the peak wavelengths, the T1 level of 4,6mCzP2Pm was calculated to be 2.70 eV and the T1 level of mCP was calculated to be 2.95 eV.

<Absorption Spectrum and Emission Spectrum of Compound>

Figure 23:
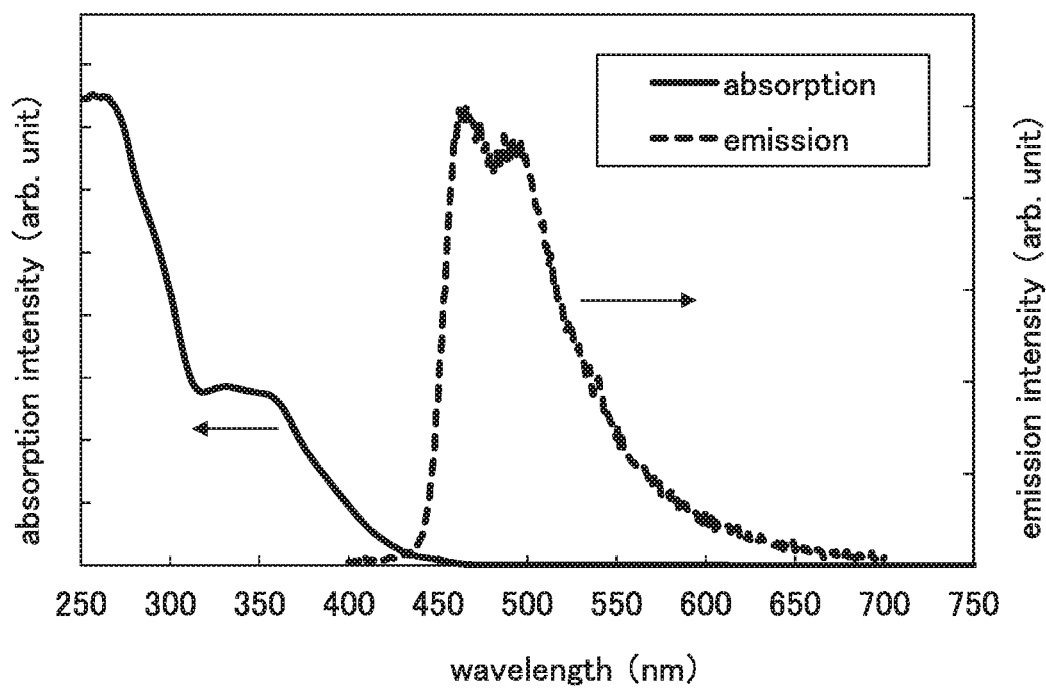
FIG. 23 shows an absorption spectrum and an emission spectrum of a compound in Example.

Next, FIG. 23 shows the measurement results of the absorption and emission spectra of Ir(dmpimpt-Me)$_3$.

For the measurement of the absorption and emission spectra, a dichloromethane solution in which Ir(dmpimpt-Me)$_3$ was dissolved was prepared, and a quartz cell was used. The absorption spectrum was measured using an ultraviolet-visible spectrophotometer (V-550, produced by JASCO Corporation). The absorption spectra of the quartz cell and the solvent were subtracted from the measured spectrum of the solution. Note that the emission spectrum of the solution was measured with a PL-EL measurement apparatus (produced by Hamamatsu Photonics K.K.). The measurement was performed at room temperature (in an atmosphere kept at 23° C.).

As shown in FIG. 23, an absorption edge on the lowest energy side (the longest wavelength side) of the absorption spectrum of Ir(dmpimpt-Me)$_3$ is at around 450 nm. The absorption edge was obtained from data of the absorption spectrum, and transition energy was estimated on the assumption of direct transition, whereby transition energy of Ir(dmpimpt-Me)$_3$ was calculated to be 2.71 eV. Since Ir(dmpimpt-Me)$_3$ is a phosphorescent compound, the absorption band on the lowest energy side is based on the transition to the triplet excited state. Therefore, the T1 level of Ir(dmpimpt-Me)$_3$ is calculated to be 2.71 eV.

From the above measurement results, it is found that the T1 level of 4,6mCzP2Pm (2.70 eV) is equivalent to the T1 level of Ir(dmpimpt-Me)$_3$ (2.71 eV), and the T1 level of Ir(dmpimpt-Me)$_3$ (2.71 eV) is higher than the T1 level of the exciplex (2.28 eV) formed by 4,6mCzP2Pm and Ir(dmpimpt-Me)$_3$ and is greater than the difference between the LUMO level of 4,6mCzP2Pm and the HOMO level of Ir(dmpimpt-Me)$_3$ (2.30 eV). Thus, the exciplex formed by 4,6mCzP2Pm and Ir(dmpimpt-Me)$_3$ can emit light efficiently.

<Luminescence Quantum Yield of Compound>

Next, the luminescence quantum yield of Ir(dmpimpt-Me)$_3$ was measured. The luminescence quantum yield was measured using a toluene solution ($1\times10^{-5}$ M) in which Ir(dmpimpt-Me)$_3$ was dissolved with an absolute quantum yield measurement system C9920-02, produced by Hamamatsu Photonics K.K. The excitation wavelength was in a range of 350 nm to 550 nm.

According to the measurement results, the luminescence quantum yield of Ir(dmpimpt-Me)$_3$ was 7%. This indicates that Ir(dmpimpt-Me)$_3$ is a phosphorescent material with a low luminescence quantum yield.

The light-emitting element 1 emits light originating from the exciplex formed by 4,6mCzP2Pm and Ir(dmpimpt-Me)$_3$, and has higher luminous efficiency than the comparative light-emitting element 1 which emits light originating from Ir(dmpimpt-Me)$_3$. Since the generation probability of singlet excitons which are generated by recombination of carriers (holes and electrons) injected from the pair of electrodes is at most 25%, the external quantum efficiency in the case where the light extraction efficiency to the outside is 30% is at most 7.5%. The light-emitting element 1 has external quantum efficiency of more than 7.5%. This is because the light-emitting element 1 emits, in addition to light originating from singlet excitons generated by recombination of carriers (holes and electrons) injected from the pair of electrodes, light originating from triplet excitons or light originating from singlet excitons generated from triplet excitons by reverse intersystem crossing in the exciplex. That is, even when a compound with a low luminescence quantum yield is used, one embodiment of the present invention can provide a light-emitting element with high luminous efficiency.

With one embodiment of the present invention, a light-emitting element with high luminous efficiency can be provided. With one embodiment of the present invention, a light-emitting element emitting light in a broad emission spectrum can be provided. With one embodiment of the present invention, a light-emitting element with low driving voltage and low power consumption can be provided.

Example 2

In this example, an example of a fabrication method of the light-emitting element of one embodiment of the present invention will be described. The structure of the light-emitting element fabricated in this example is the same as that illustrated in FIG. 1. Table 3 shows the details of the element structure. In addition, a structure and an abbreviation of a compound used here are given below. Note that Example 1 is referred to for structures and abbreviations of other compounds.

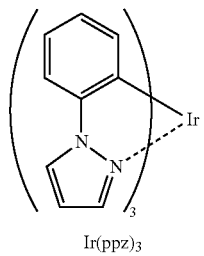

Ir(ppz)$_3$

<Fabrication of Light-Emitting Element 2>

A method for fabricating a light-emitting element 2 fabricated in this example will be described below. The light-emitting element 2 was fabricated through the same steps as those for the above-described light-emitting element 1 except for the step of forming the light-emitting layer 130.

As the light-emitting layer 130 of the light-emitting element 2, 4,6mCzP2Pm and tris[2-(1H-pyrazol-1-yl-κN$^2$)phenyl-κC]iridium(III) (abbreviation: Ir(ppz)$_3$) were deposited to a thickness of 40 nm by co-evaporation at a weight ratio of 1:0.2 (4,6mCzP2Pm:Ir(ppz)$_3$). In the light-emitting layer 130, Ir(ppz)$_3$ corresponded to the first organic compound, and 4,6mCzP2Pm corresponded to the second organic compound.

<Characteristics of Light-Emitting Element>

Next, the characteristics of the fabricated light-emitting element 2 were measured. Note that the measurement method was similar to that used in Example 1.

Figure 24:
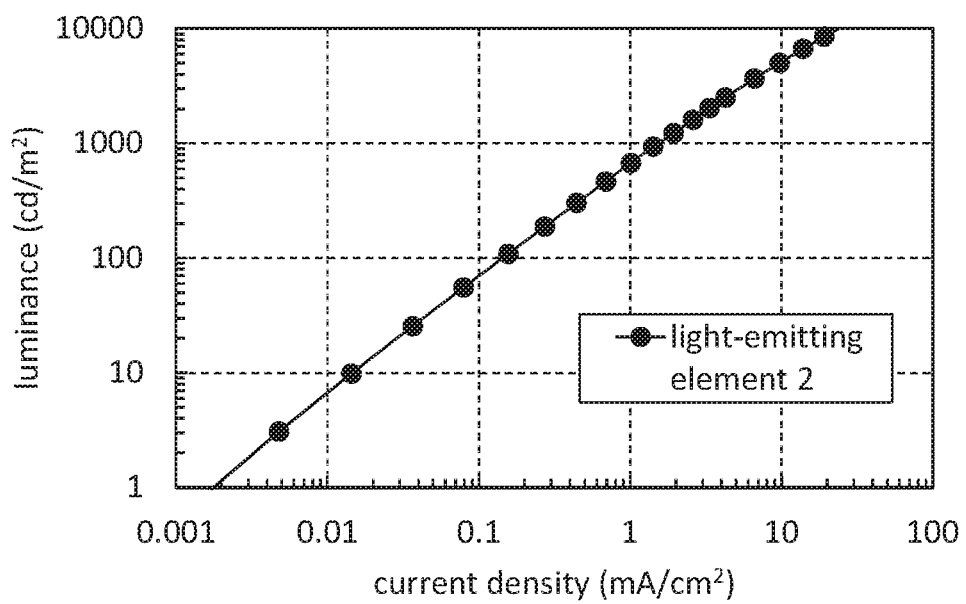
FIG. 24 shows the luminance-current density characteristics of a light-emitting element in Example.
Figure 25:
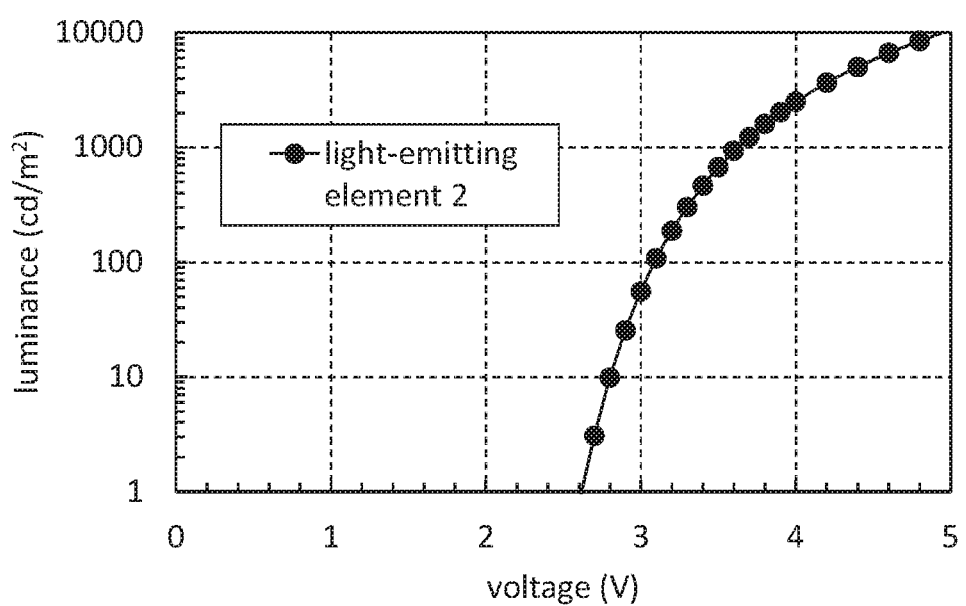
FIG. 25 shows the luminance-voltage characteristics of a light-emitting element in Example.
Figure 26:
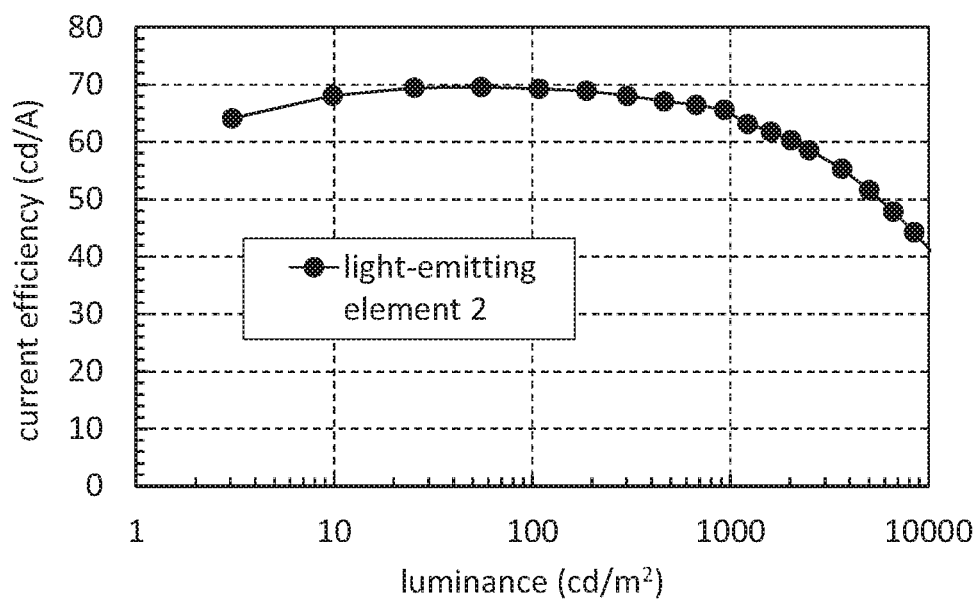
FIG. 26 shows the current efficiency-luminance characteristics of a light-emitting element in Example.
Figure 27:
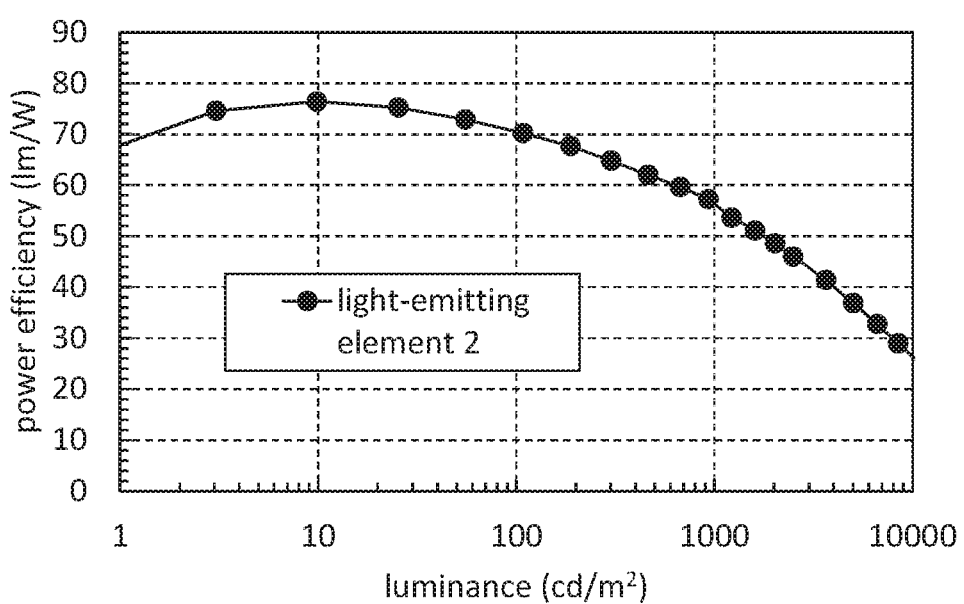
FIG. 27 shows the power efficiency-luminance characteristics of a light-emitting element in Example.
Figure 28:
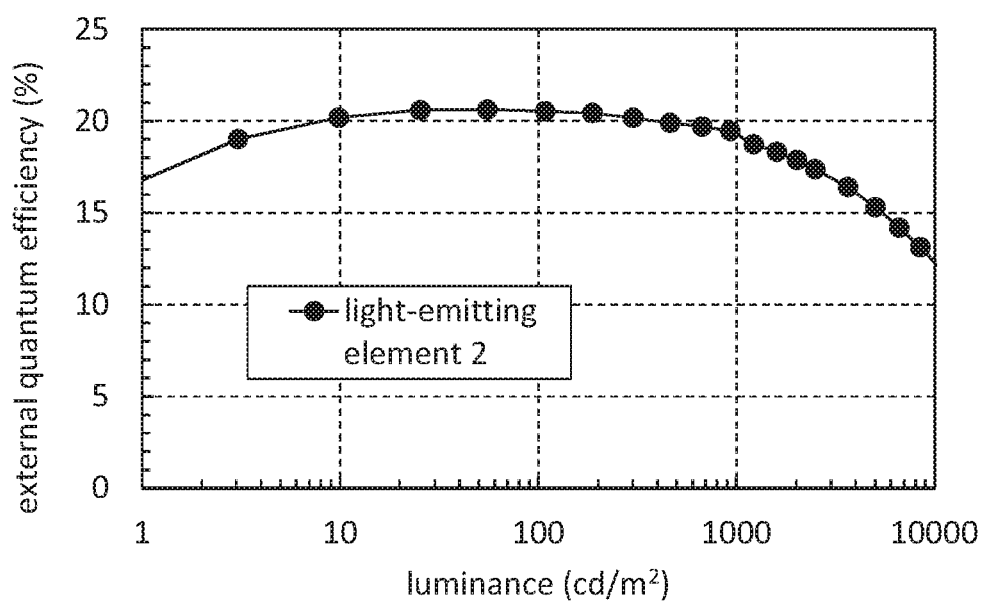
FIG. 28 shows the external quantum efficiency-luminance characteristics of a light-emitting element in Example.
Figure 29:
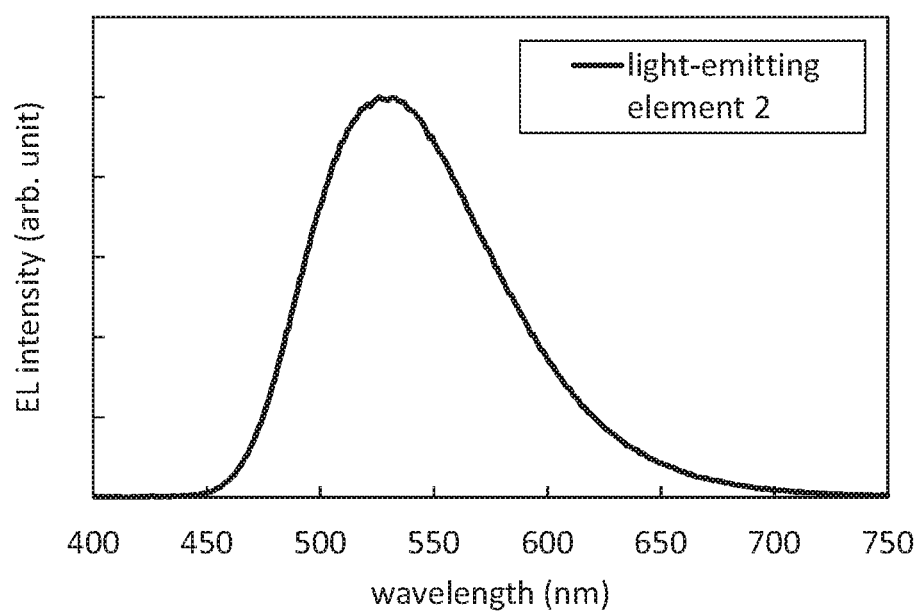
FIG. 29 shows an electroluminescence spectrum of a light-emitting element in Example.

FIG. 24 shows the luminance-current density characteristics of the light-emitting element 2. FIG. 25 shows the luminance-voltage characteristics thereof. FIG. 26 shows the current efficiency-luminance characteristics thereof. FIG. 27 shows the power efficiency-luminance characteristics thereof. FIG. 28 shows the external quantum efficiency-luminance characteristics thereof. FIG. 29 shows the electroluminescence spectrum obtained when a current at a current density of 2.5 mA/cm$^2$ was supplied to the light-emitting element 2. The measurements of the light-emitting element were performed at room temperature (in an atmosphere kept at 23° C.).

Table 4 shows the element characteristics of the light-emitting element 2 at around 1000 cd/m$^2$.

TABLE 3

| | Layer | Reference numeral | Thickness (nm) | Material | Weight ratio |
|---|---|---|---|---|---|
| Light-emitting element 2 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:Ir(ppz)$_3$ | 1:0.2 |
| | Hole-transport layer | 112 | 20 | mCzFLP | — |
| | Hole-injection layer | 111 | 60 | DBT3P-II:MoO$_3$ | 1:0.5 |
| | Electrode | 101 | 70 | ITSO | — |

TABLE 4

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 2 | 3.60 | 1.42 | (0.348, 0.585) | 930 | 65.6 | 57.2 | 19.4 |

As shown in FIG. 29, the electroluminescence spectrum of the light-emitting element 2 has a peak at a wavelength of 537 nm and a full width at half maximum of 84 nm. This indicates that the light-emitting element 2 emits yellow light. Note that Ir(ppz)$_3$ used in the light-emitting element 2 is known as a compound which emits blue light at low temperatures; however, light originating from Ir(ppz)$_3$ was not observed here.

As shown in FIG. 24 to FIG. 28 and Table 4, the driving voltage of the light-emitting element 2 is low. Furthermore, the light-emitting element 2 has high luminous efficiency (current efficiency, power efficiency, and external quantum efficiency). Accordingly, the light-emitting element of one embodiment of the present invention that contains the first organic compound (Ir(ppz)$_3$) and the second organic compound (4,6mCzP2Pm) is a light-emitting element with high luminous efficiency that drives at low driving voltage at low power consumption.

<CV Measurement Results>

The electrochemical characteristics (oxidation reaction characteristics and reduction reaction characteristics) of the above compounds were measured by cyclic voltammetry (CV) measurement. Note that the measurement method was similar to that used in Example 1. Example 1 is referred to for the measurement results of 4,6mCzP2Pm.

According to the CV measurement results, the oxidation potential and the reduction potential of Ir(ppz)$_3$ were 0.45 V and −3.17 V, respectively. The HOMO level and the LUMO level of Ir(ppz)$_3$ calculated from the CV measurement results were −5.39 eV and −1.77 eV, respectively. Thus, it is found that Ir(ppz)$_3$ has a high HOMO level.

As described above, the LUMO level and the HOMO level of 4,6mCzP2Pm, which is the second organic compound, are lower than those of Ir(ppz)$_3$, which is the first organic compound. Thus, in the case where the compounds are used in a light-emitting layer as in the light-emitting element 2, electrons and holes, which serve as carriers, are efficiently injected from a pair of electrodes into 4,6mCzP2Pm (the second organic compound) and Ir(ppz)$_3$ (the first organic compound), respectively, so that 4,6mCzP2Pm (the second organic compound) and Ir(ppz)$_3$ (the first organic compound) can form an exciplex.

The difference between the LUMO level of 4,6mCzP2Pm and the HOMO level of Ir(ppz)$_3$ is 2.51 eV. This value is substantially equal to light emission energy (2.31 eV) calculated from the peak wavelength of the electroluminescence spectrum of the light-emitting element 2 in FIG. 29. This result implies that the electroluminescence spectrum of the light-emitting element 2 corresponds to light emission due to the exciplex formed by 4,6mCzP2Pm and Ir(ppz)$_3$. In the exciplex, the difference between the S1 level and the T1 level is small; thus, the light emission energy can be regarded as energy of each of the S1 level and the T1 level (2.31 eV).

Furthermore, the excitation energy level of the exciplex formed by 4,6mCzP2Pm and Ir(ppz)$_3$ is smaller than the energy difference between the LUMO level and the HOMO level of 4,6mCzP2Pm (i.e., 3.01 eV). Thus, when the exciplex is formed, a light-emitting element with low driving voltage can be obtained.

<Absorption Spectrum of Compound>

Figure 30:
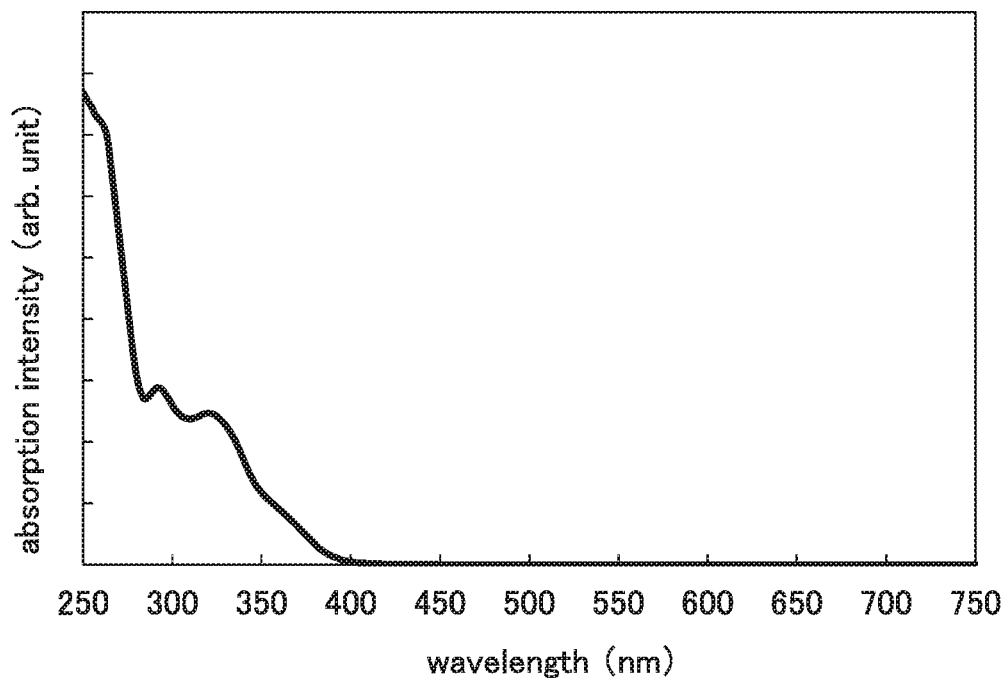
FIG. 30 shows an absorption spectrum of a compound in Example.

Next, FIG. 30 shows the measurement results of the absorption spectrum of Ir(ppz)$_3$.

For the measurement of the absorption spectrum, a dichloromethane solution in which Ir(ppz)$_3$ was dissolved was prepared, and a quartz cell was used. The absorption spectrum was measured using an ultraviolet-visible spectrophotometer (V-550, produced by JASCO Corporation). The absorption spectra of the quartz cell and the solvent were subtracted from the measured spectrum of the solution. The measurement was performed at room temperature (in an atmosphere kept at 23° C.).

As shown in FIG. 30, an absorption edge on the lowest energy side (the longest wavelength side) of the absorption spectrum of Ir(ppz)$_3$ is at around 370 nm. The absorption edge was obtained from data of the absorption spectrum, and transition energy was estimated on the assumption of direct transition, whereby transition energy of Ir(ppz)$_3$ was calculated to be 3.27 eV. Since Ir(ppz)$_3$ is a phosphorescent compound, the absorption band on the lowest energy side is based on the transition to the triplet excited state. Therefore, from the absorption edge, the T1 level of Ir(ppz)$_3$ is calculated to be 3.27 eV.

From the above measurement results, it is found that the T1 level of 4,6mCzP2Pm (2.70 eV) is lower than the T1 level of Ir(ppz)$_3$ (3.27 eV), higher than the T1 level of the exciplex (2.31 eV) formed by 4,6mCzP2Pm and Ir(ppz)$_3$, and is greater than the difference between the LUMO level of 4,6mCzP2Pm and the HOMO level of Ir(ppz)$_3$ (2.51 eV). Thus, the exciplex formed by 4,6mCzP2Pm and Ir(ppz)$_3$ can emit light efficiently.

In addition, when the measurement of emission spectrum of Ir(ppz)$_3$ was performed at room temperature, light emission from Ir(ppz)$_3$ was not observed. Non-Patent Document 1 discloses that the luminescence quantum yield of Ir(ppz)$_3$ is lower than 1% at room temperature. This indicates that Ir(ppz)$_3$ is a material that does not emit light at room temperature.

The light-emitting element 2 which emits light originating from the exciplex formed by 4,6mCzP2Pm and Ir(ppz)$_3$ has high external quantum efficiency, which is higher than 20%. This is because the light-emitting element 2 emits, in addition to light originating from singlet excitons generated by recombination of carriers (holes and electrons) injected from the pair of electrodes, light originating from triplet excitons or light originating from singlet excitons generated from triplet excitons by reverse intersystem crossing in the exciplex. That is, even when a compound with a low luminescence quantum yield, which is lower than 1%, is used, one embodiment of the present invention can provide a light-emitting element with high luminous efficiency.

With one embodiment of the present invention, a light-emitting element with high luminous efficiency can be provided. With one embodiment of the present invention, a light-emitting element with low driving voltage and low power consumption can be provided.

Example 3

In this example, examples of fabrication methods of the light-emitting elements of one embodiment of the present invention will be described. The structure of each of the light-emitting elements fabricated in this example is the same as that illustrated in FIG. 1. Table 5 shows the details of the element structures. In addition, structures and abbreviations of compounds used here are given below. Note that Examples 1 and 2 are referred to for structures and abbreviations of other compounds.

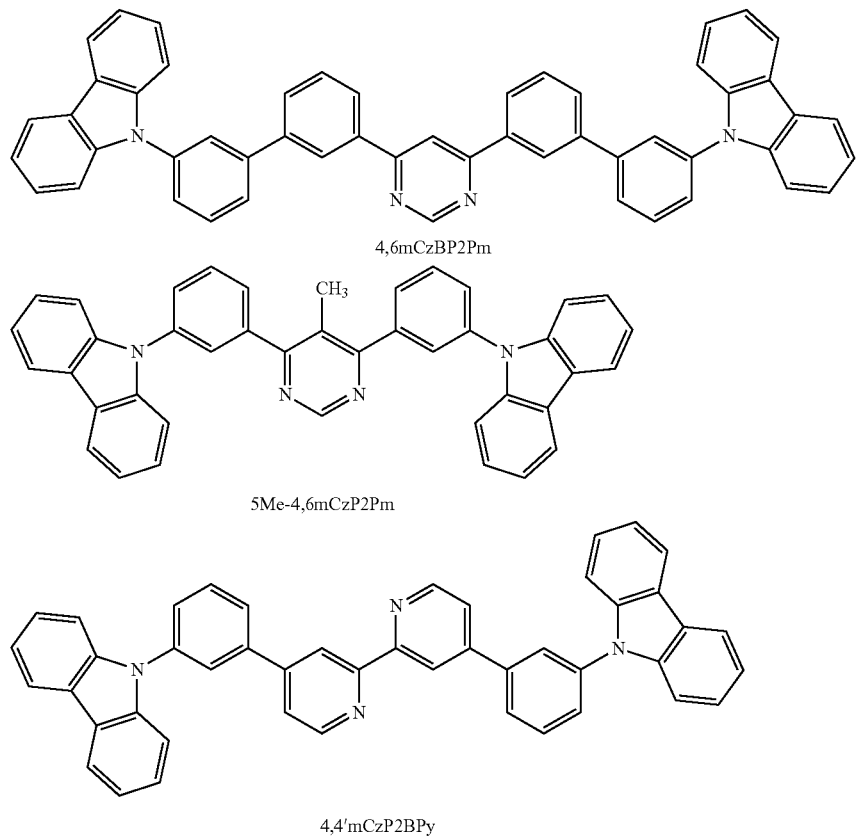

4,6mCzBP2Pm

5Me-4,6mCzP2Pm 4,4′mCzP2BPy

TABLE 5

| Layer | | Reference numeral | Thickness (nm) | Material | Weight ratio |
|---|---|---|---|---|---|
| Light-emitting element 3 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:Ir(ppz)$_3$ | 1:0.1 |
| | Hole-transport layer | 112 | 20 | mCzFLP | — |
| | Hole-injection layer | 111 | 60 | DBT3P-II:MoO$_3$ | 1:0.5 |
| | Electrode | 101 | 70 | ITSO | — |
| Light-emitting element 4 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzBP2Pm | — |
| | Light-emitting layer | 130 | 40 | 4,6mCzBP2Pm:Ir(ppz)$_3$ | 1:0.1 |
| | Hole-transport layer | 112 | 20 | mCzFLP | — |
| | Hole-injection layer | 111 | 60 | DBT3P-II:MoO$_3$ | 1:0.5 |
| | Electrode | 101 | 70 | ITSO | — |
| Light-emitting element 5 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 5Me-4,6mCzP2Pm | — |

TABLE 5-continued

|  | Layer | Reference numeral | Thickness (nm) | Material | Weight ratio |
|---|---|---|---|---|---|
|  | Light-emitting layer | 130 | 40 | 5Me-4,6mCzP2Pm:Ir(ppz)$_3$ | 1:0.1 |
|  | Hole-transport layer | 112 | 20 | mCzFLP | — |
|  | Hole-injection layer | 111 | 60 | DBT3P-II:MoO$_3$ | 1:0.5 |
|  | Electrode | 101 | 70 | ITSO | — |
| Light-emitting element 6 | Electrode | 102 | 200 | Al | — |
|  | Electron-injection layer | 119 | 1 | LiF | — |
|  | Electron-transport layer | 118 (2) | 10 | BPhen | — |
|  |  | 118 (1) | 20 | 4,4'mCzP2BPy | — |
|  | Light-emitting layer | 130 | 40 | 4,4'mCzP2BPy:Ir(ppz)$_3$ | 1:0.1 |
|  | Hole-transport layer | 112 | 20 | mCzFLP | — |
|  | Hole-injection layer | 111 | 60 | DBT3P-II:MoO$_3$ | 1:0.5 |
|  | Electrode | 101 | 70 | ITSO | — |

<Fabrication of Light-Emitting Elements 3 to 6>

Methods for fabricating the light-emitting elements 3 to 6 fabricated in this example will be described below. The light-emitting elements 3 to 6 were fabricated through the same steps as those for the above-described light-emitting element 1 except for the steps of forming the light-emitting layer 130 and the electron-transport layer 118.

As the light-emitting layer 130 of the light-emitting element 3, 4,6mCzP2Pm and Ir(ppz)$_3$ were deposited to a thickness of 40 nm by co-evaporation at a weight ratio of 1:0.1 (4,6mCzP2Pm:Ir(ppz)$_3$). In the light-emitting layer 130, Ir(ppz)$_3$ corresponded to the first organic compound, and 4,6mCzP2Pm corresponded to the second organic compound. Then, as the electron-transport layer 118, 4,6mCzP2Pm and Bphen were sequentially deposited by evaporation to thicknesses of 20 nm and 10 nm, respectively, over the light-emitting layer 130.

As the light-emitting layer 130 of the light-emitting element 4, 9,9'-[pyrimidine-4,6-diylbis(biphenyl-3,3'-diyl)]bis(9H-carbazole) (abbreviation: 4,6mCzBP2Pm) and Ir(ppz)$_3$ were deposited to a thickness of 40 nm by co-evaporation at a weight ratio of 1:0.1 (4,6mCzBP2Pm:Ir(ppz)$_3$). In the light-emitting layer 130, Ir(ppz)$_3$ corresponded to the first organic compound, and 4,6mCzBP2Pm corresponded to the second organic compound. Then, as the electron-transport layer 118, 4,6mCzBP2Pm and Bphen were sequentially deposited by evaporation to thicknesses of 20 nm and 10 nm, respectively, over the light-emitting layer 130.

As the light-emitting layer 130 of the light-emitting element 5, 5-methyl-4,6-bis[3-(9H-carbazol-9-yl)phenyl]pyrimidine (abbreviation: 5Me-4,6mCzP2Pm) and Ir(ppz)$_3$ were deposited to a thickness of 40 nm by co-evaporation at a weight ratio of 1:0.1 (5Me-4,6mCzP2Pm:Ir(ppz)$_3$). In the light-emitting layer 130, Ir(ppz)$_3$ corresponded to the first organic compound, and 5Me-4,6mCzP2Pm corresponded to the second organic compound. Then, as the electron-transport layer 118, 5Me-4,6mCzP2Pm and Bphen were sequentially deposited by evaporation to thicknesses of 20 nm and 10 nm, respectively, over the light-emitting layer 130.

As the light-emitting layer 130 of the light-emitting element 6, 4,4'-bis[3-(9H-carbazol-9-yl)phenyl]-2,2'-bipyridine (abbreviation: 4,4'mCzP2BPy) and Ir(ppz)$_3$ were deposited to a thickness of 40 nm by co-evaporation at a weight ratio of 1:0.1 (4,4'mCzP2BPy:Ir(ppz)$_3$). In the light-emitting layer 130, Ir(ppz)$_3$ corresponded to the first organic compound, and 4,4'mCzP2BPy corresponded to the second organic compound. Then, as the electron-transport layer 118, 4,4'mCzP2BPy and Bphen were sequentially deposited by evaporation to thicknesses of 20 nm and 10 nm, respectively, over the light-emitting layer 130.

<Characteristics of Light-Emitting Elements>

Next, the characteristics of the fabricated light-emitting elements 3 to 6 were measured. Note that the measurement method was similar to that used in Example 1.

Figure 31:
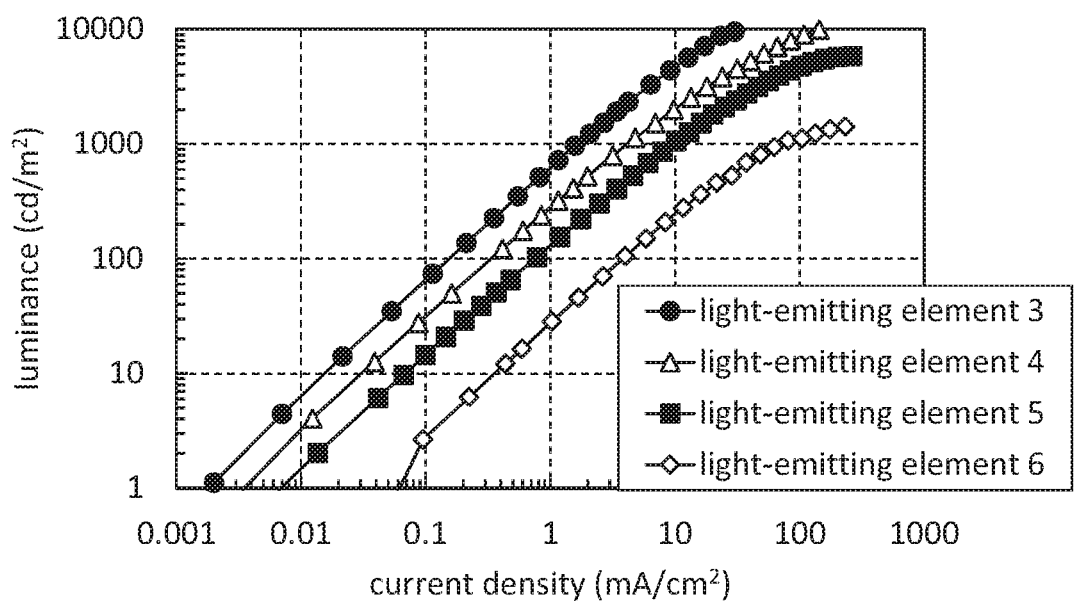
FIG. 31 shows the luminance-current density characteristics of light-emitting elements in Example.
Figure 32:
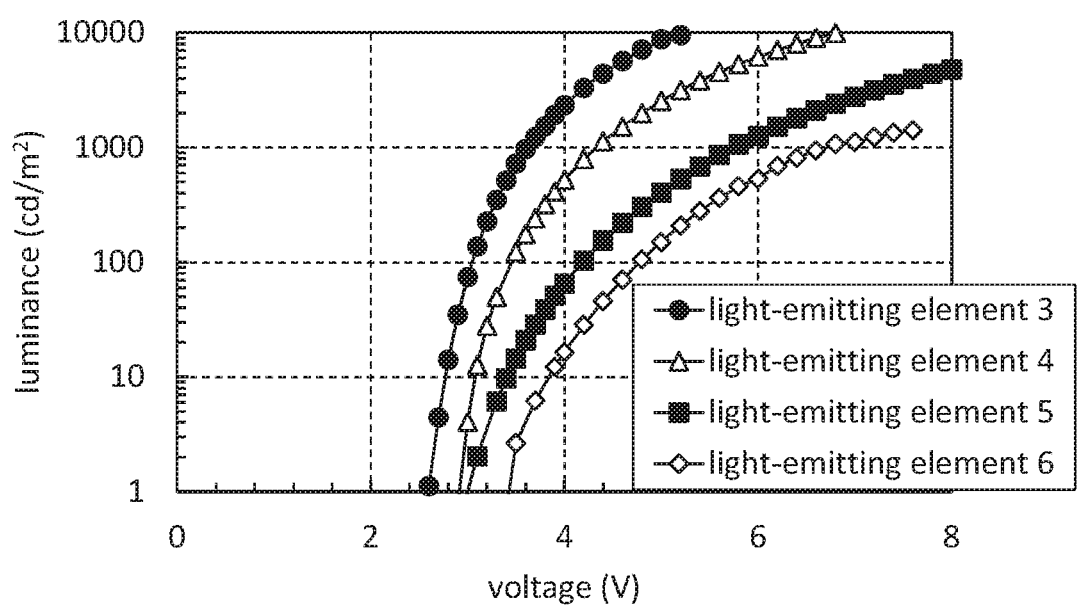
FIG. 32 shows the luminance-voltage characteristics of light-emitting elements in Example.
Figure 33:
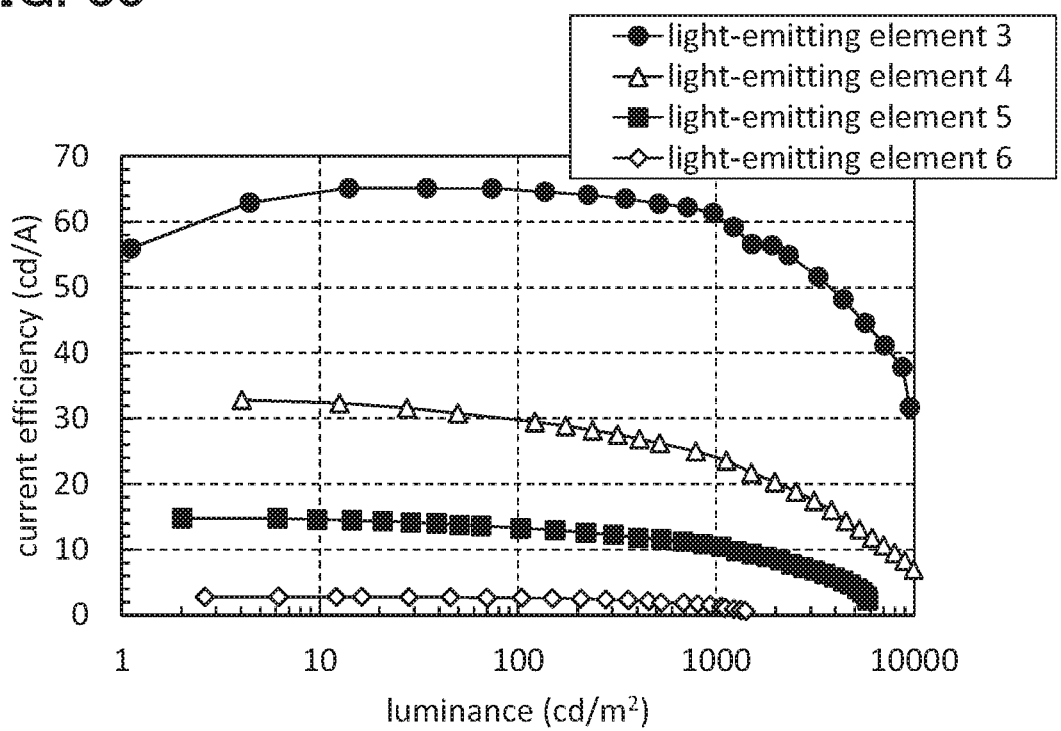
FIG. 33 shows the current efficiency-luminance characteristics of light-emitting elements in Example.
Figure 34:
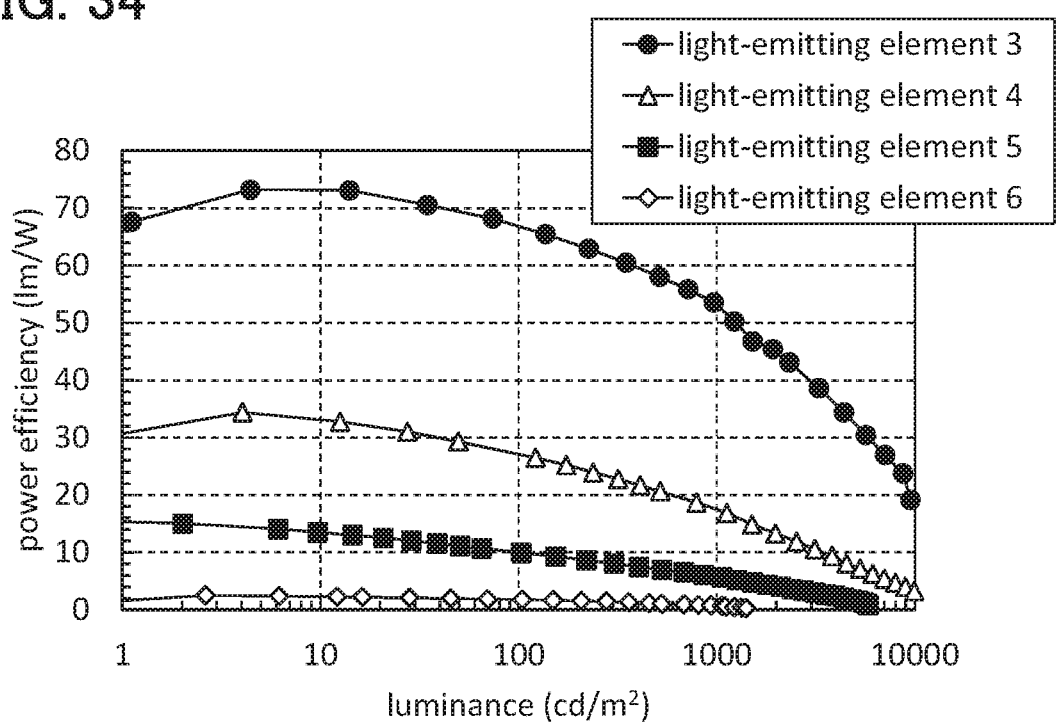
FIG. 34 shows the power efficiency-luminance characteristics of light-emitting elements in Example.
Figure 35:
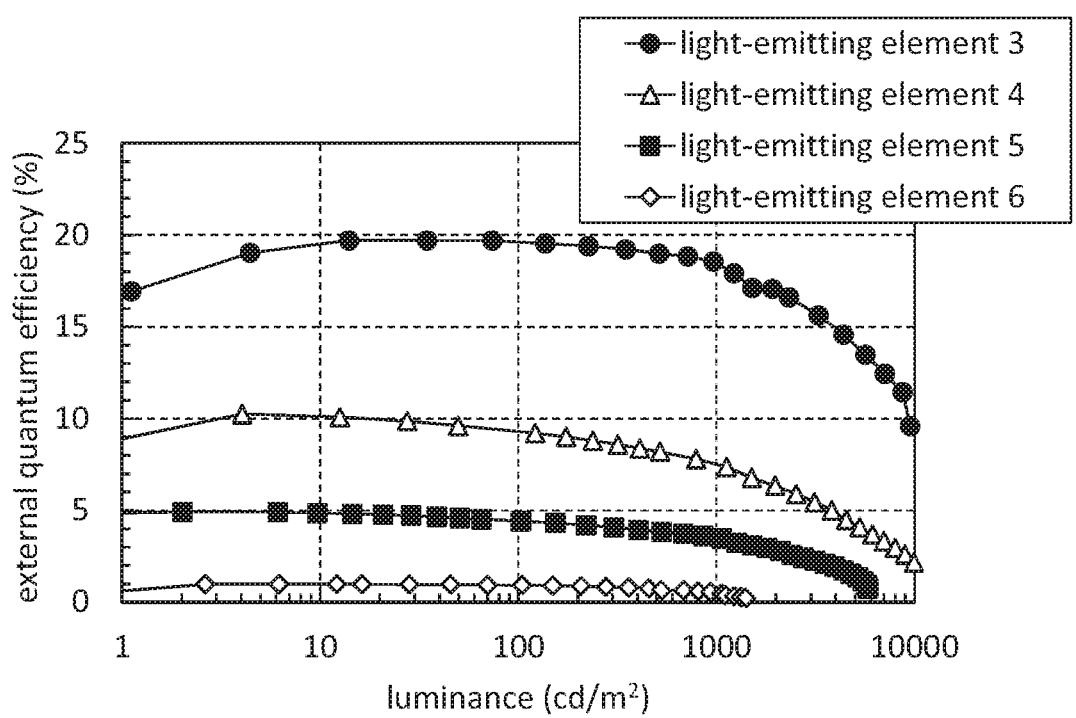
FIG. 35 shows the external quantum efficiency-luminance characteristics of light-emitting elements in Example.
Figure 36:
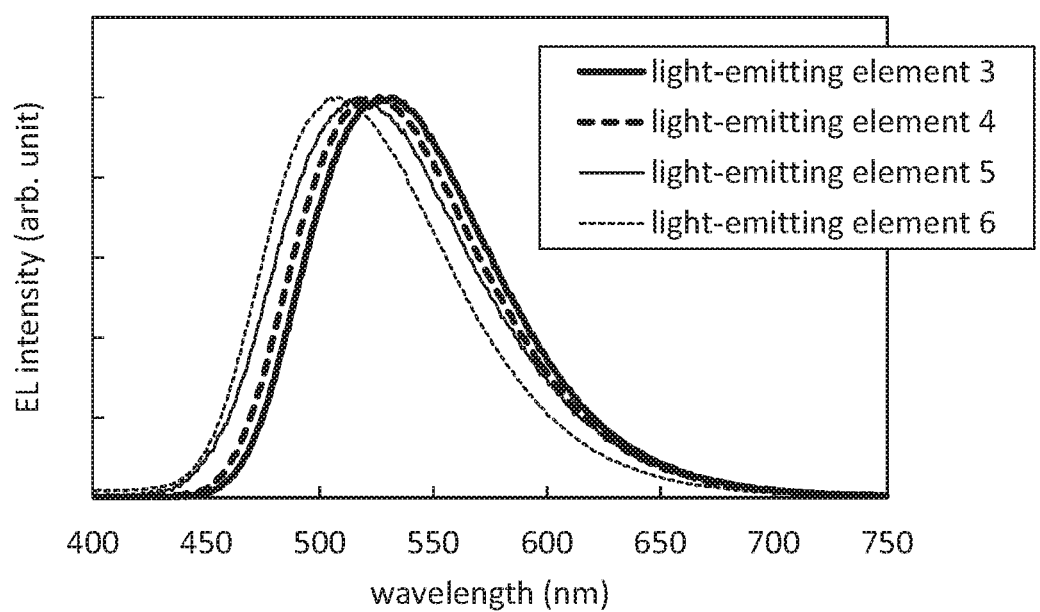
FIG. 36 shows electroluminescence spectra of light-emitting elements in Example.

FIG. 31 shows the luminance-current density characteristics of the light-emitting elements 3 to 6. FIG. 32 shows the luminance-voltage characteristics thereof. FIG. 33 shows the current efficiency-luminance characteristics thereof. FIG. 34 shows the power efficiency-luminance characteristics thereof. FIG. 35 shows the external quantum efficiency-luminance characteristics thereof. FIG. 36 shows the electroluminescence spectra obtained when a current at a current density of 2.5 mA/cm$^2$ was supplied to the light-emitting elements 3 to 6. The measurements of the light-emitting elements were performed at room temperature (in an atmosphere kept at 23° C.).

Table 6 shows the element characteristics of the light-emitting elements 3 to 6 at around 1000 cd/m$^2$.

TABLE 6

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 3 | 3.60 | 1.57 | (0.327, 0.580) | 970 | 61.3 | 53.5 | 18.6 |
| Light-emitting element 4 | 4.40 | 4.78 | (0.310, 0.565) | 1130 | 23.6 | 16.8 | 7.36 |
| Light-emitting element 5 | 5.80 | 10.2 | (0.287, 0.531) | 1060 | 10.4 | 5.64 | 3.46 |
| Light-emitting element 6 | 6.60 | 62.7 | (0.262, 0.498) | 940 | 1.50 | 0.712 | 0.524 |

As shown in FIG. 36, the electroluminescence spectra of the light-emitting elements 3, 4, 5, and 6 have peaks at wavelengths of 526 nm, 521 nm, 517 nm, and 508 nm, respectively, and have full widths at half maximum of 95 nm, 96 nm, 100 nm, and 94 nm, respectively. This indicates that the light-emitting elements 3 to 6 emit yellow light. Note that $Ir(ppz)_3$ used in the light-emitting elements 3 to 6 is known as a compound which emits blue light at low temperatures; however, light originating from $Ir(ppz)_3$ was not observed here.

As shown in FIG. 31 to FIG. 35 and Table 6, the driving voltage of the light-emitting element 3 is low. The light-emitting element 3, the light-emitting element 4, the light-emitting element 5, and the light-emitting element 6 have low driving voltage in this order. The light-emitting element 3 has high luminous efficiency (current efficiency, power efficiency, and external quantum efficiency). The light-emitting element 3, the light-emitting element 4, the light-emitting element 5, and the light-emitting element 6 have high luminous efficiency in this order.

<CV Measurement Results>

The electrochemical characteristics (oxidation reaction characteristics and reduction reaction characteristics) of the above compounds were measured by cyclic voltammetry (CV) measurement. Note that the measurement method was similar to that used in Example 1. Examples 1 and 2 are referred to for the measurement results of 4,6mCzP2Pm and $Ir(ppz)_3$.

According to the CV measurement results, the oxidation potential and the reduction potential of 4,6mCzBP2Pm were 0.95 V and −2.14 V, respectively. The HOMO level and the LUMO level of 4,6mCzBP2Pm calculated from the CV measurement results were −5.89 eV and −2.80 eV, respectively. Thus, it is found that 4,6mCzBP2Pm has a low LUMO level.

According to the CV measurement results, the oxidation potential and the reduction potential of 5Me-4,6mCzP2Pm were 0.97 V and −2.22 V, respectively. The HOMO level and the LUMO level of 5Me-4,6mCzP2Pm calculated from the CV measurement results were −5.91 eV and −2.73 eV, respectively. Thus, it is found that 5Me-4,6mCzP2Pm has a low LUMO level.

According to the CV measurement results, the oxidation potential and the reduction potential of 4,4'mCzP2BPy were 1.00 V and −2.29 V, respectively. The HOMO level and the LUMO level of 4,4'mCzP2BPy calculated from the CV measurement results were −5.94 eV and −2.66 eV, respectively. Thus, it is found that 4,4'mCzP2BPy has a low LUMO level.

As described above, the LUMO level of each of 4,6mCzP2Pm, 4,6mCzBP2Pm, 5Me-4,6mCzP2Pm, and 4,4'mCzP2BPy, which are the second organic compounds, is lower than the LUMO level of $Ir(ppz)_3$, which is the first organic compound. Furthermore, the HOMO level of each of 4,6mCzP2Pm, 4,6mCzBP2Pm, 5Me-4,6mCzP2Pm, and 4,4'mCzP2BPy, which are the second organic compounds, is lower than the HOMO level of $Ir(ppz)_3$, which is the first organic compound. Thus, in the case where the compounds are used in a light-emitting layer as in the light-emitting elements 3 to 6, electrons and holes, which serve as carriers, are efficiently injected from a pair of electrodes into the second organic compound (4,6mCzP2Pm, 4,6mCzBP2Pm, 5Me-4,6mCzP2Pm, or 4,4'mCzP2BPy) and the first organic compound ($Ir(ppz)_3$), respectively, so that the second organic compound (4,6mCzP2Pm, 4,6mCzBP2Pm, 5Me-4,6mCzP2Pm, or 4,4'mCzP2BPy) and the first organic compound can form an exciplex.

The exciplex formed by the second organic compound (4,6mCzP2Pm, 4,6mCzBP2Pm, 5Me-4,6mCzP2Pm, or 4,4'mCzP2BPy) and the first organic compound ($Ir(ppz)_3$) has the LUMO level in the second organic compound (4,6mCzP2Pm, 4,6mCzBP2Pm, 5Me-4,6mCzP2Pm, or 4,4'mCzP2BPy) and the HOMO level in the first organic compound ($Ir(ppz)_3$).

The energy difference between the LUMO level of 4,6mCzBP2Pm and the HOMO level of $Ir(ppz)_3$ is 2.59 eV. This value is substantially equal to light emission energy (2.38 eV) calculated from the peak wavelength of the electroluminescence spectrum of the light-emitting element 4 in FIG. 36. This result implies that the electroluminescence spectrum of the light-emitting element 4 corresponds to light emission due to the exciplex formed by 4,6mCzBP2Pm and $Ir(ppz)_3$. In the exciplex, the difference between the S1 level and the T1 level is small; thus, the light emission energy can be regarded as energy of each of the S1 level and the T1 level (2.38 eV). Furthermore, the excitation energy level of the exciplex formed by 4,6mCzBP2Pm and $Ir(ppz)_3$ is smaller than the energy difference between the LUMO level and the HOMO level of 4,6mCzBP2Pm (3.09 eV). Thus, when the exciplex is formed, a light-emitting element with low driving voltage can be obtained.

The energy difference between the LUMO level of 5Me-4,6mCzP2Pm and the HOMO level of $Ir(ppz)_3$ is 2.66 eV. This value is substantially equal to light emission energy (2.40 eV) calculated from the peak wavelength of the electroluminescence spectrum of the light-emitting element 5 in FIG. 36. This result implies that the electroluminescence spectrum of the light-emitting element 5 corresponds to light emission due to the exciplex formed by 5Me-4,6mCzP2Pm and $Ir(ppz)_3$. In the exciplex, the difference between the S1 level and the T1 level is small; thus, the light emission energy can be regarded as energy of each of the S1 level and the T1 level (2.40 eV). Furthermore, the excitation energy level of the exciplex formed by 5Me-4,6mCzP2Pm and $Ir(ppz)_3$ is smaller than the energy difference between the LUMO level and the HOMO level of 5Me-4,6mCzP2Pm (3.18 eV). Thus, when the exciplex is formed, a light-emitting element with low driving voltage can be obtained.

The energy difference between the LUMO level of 4,4'mCzP2BPy and the HOMO level of $Ir(ppz)_3$ is 2.73 eV. This value is substantially equal to light emission energy (2.44 eV) calculated from the peak wavelength of the electroluminescence spectrum of the light-emitting element 6 in FIG. 36. This result implies that the electroluminescence spectrum of the light-emitting element 6 corresponds to light emission due to the exciplex formed by 4,4'mCzP2BPy and $Ir(ppz)_3$. In the exciplex, the difference between the S1 level and the T1 level is small; thus, the light emission energy can be regarded as energy of each of the S1 level and the T1 level (2.44 eV). Furthermore, the excitation energy level of the exciplex formed by 4,4'mCzP2BPy and $Ir(ppz)_3$ is smaller than the energy difference between the LUMO level and the HOMO level of 4,4'mCzP2BPy (3.28 eV). Thus, when the exciplex is formed, a light-emitting element with low driving voltage can be obtained.

Note that the compounds used in the light-emitting element 3 were similar to the compounds used in the light-emitting element 2 described in Example 2. This means that the electroluminescence spectrum of the light-emitting element 3 corresponds to light emission due to the exciplex formed by 4,6mCzP2Pm and $Ir(ppz)_3$. Furthermore, the light emission energy can be regarded as energy of each of the S1 level and the T1 level.

<Measurement of T1 Level>

Next, to obtain the T1 levels of the compounds each used in the light-emitting layer 130, a thin film of 4,6mCzBP2Pm, a thin film of 5Me-4,6mCzP2Pm, and a thin film of 4,4'mCzP2BPy were each formed over a quartz substrate by a vacuum evaporation method, and the emission spectra of the thin films were measured at a low temperature (10 K). Note that the measurement method was similar to that used in Example 1.

Figure 37:
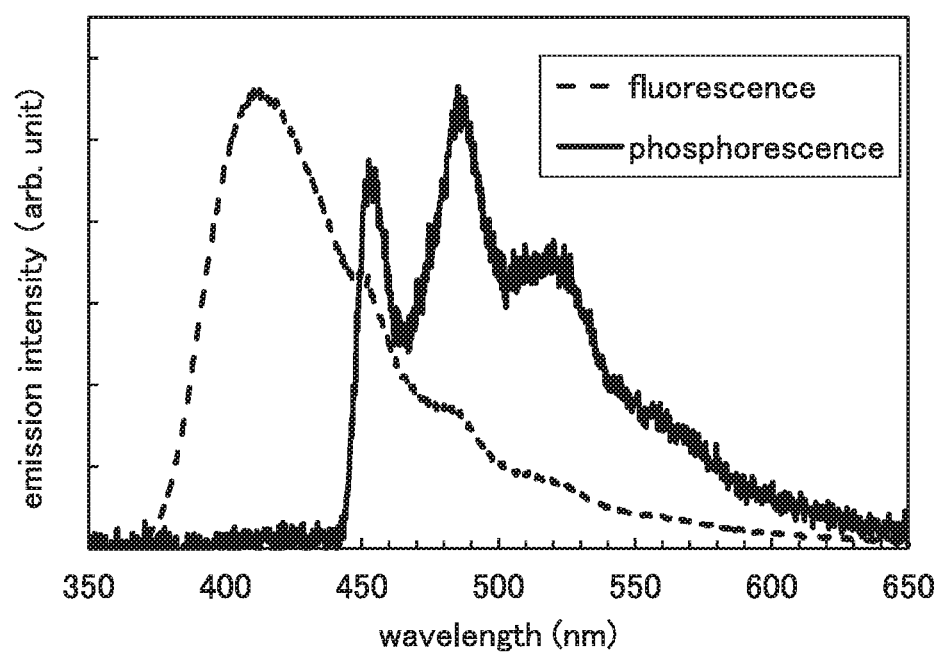
FIG. 37 shows emission spectra of a thin film in Example.
Figure 38:
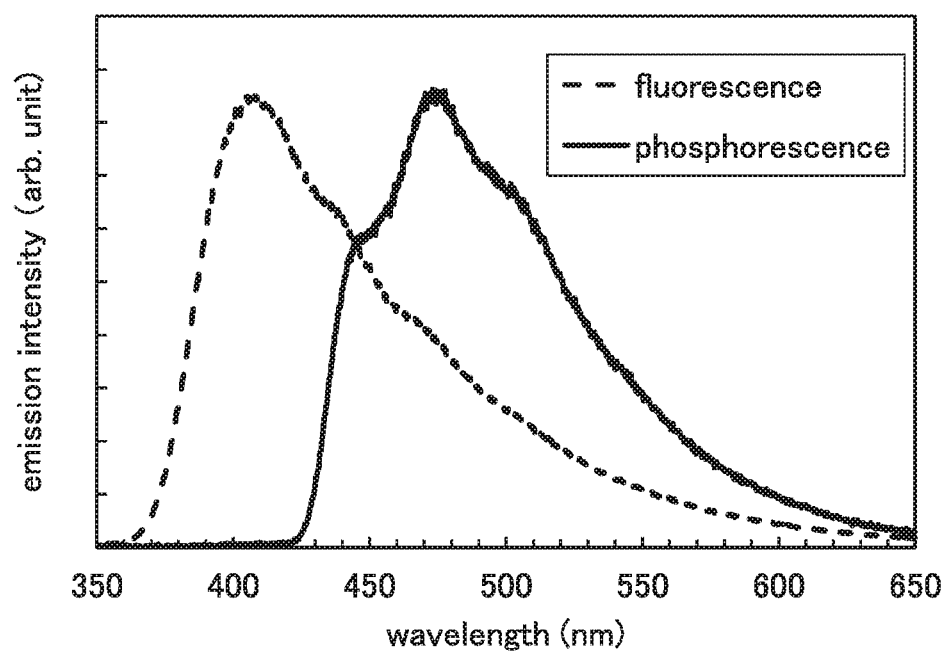
FIG. 38 shows emission spectra of a thin film in Example.
Figure 39:
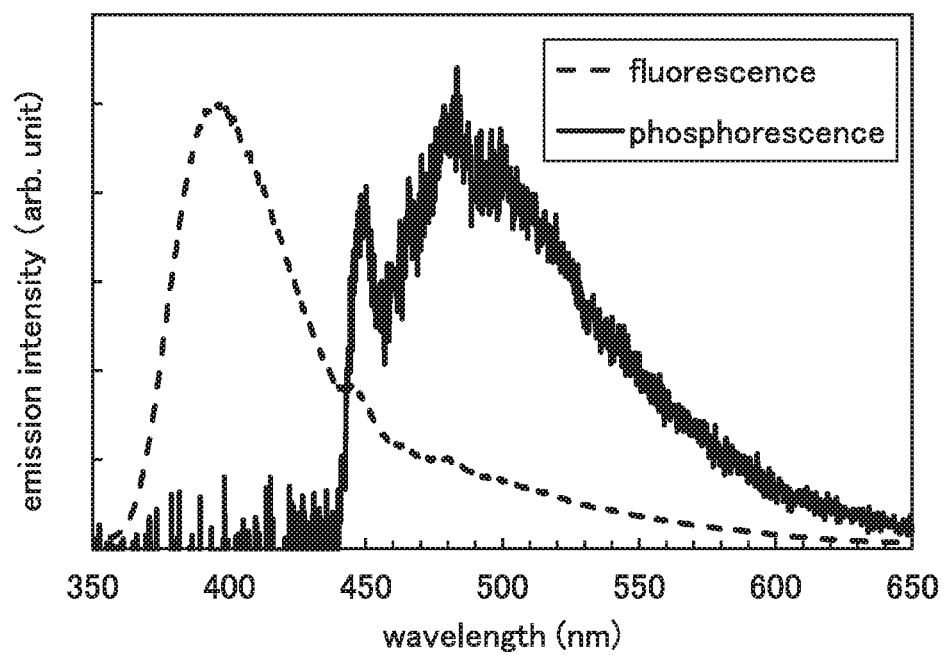
FIG. 39 shows emission spectra of a thin film in Example.

FIG. 37, FIG. 38, and FIG. 39 show the time-resolved emission spectra of 4,6mCzBP2Pm, 5Me-4,6mCzP2Pm, and 4,4'mCzP2BPy, respectively, measured at a low temperature.

As shown in the measurement results of the emission spectra, the emission spectrum of 4,6mCzBP2Pm has a peak (including a shoulder) of the phosphorescent component on the shortest wavelength side at 452 nm, the emission spectrum of 5Me-4,6mCzP2Pm has a peak (including a shoulder) of the phosphorescent component on the shortest wavelength side at 446 nm, and the emission spectrum of 4,4'mCzP2BPy has a peak (including a shoulder) of the phosphorescent component on the shortest wavelength side at 447 nm.

Thus, from the peak wavelengths, the T1 level of 4,6mCzBP2Pm was calculated to be 2.74 eV, the T1 level of 5Me-4,6mCzP2Pm was calculated to be 2.78 eV, and the T1 level of 4,4'mCzP2BPy was calculated to be 2.77 eV.

From the above measurement results, it is found that the T1 level of 4,6mCzBP2Pm (2.74 eV) is lower than the T1 level of Ir(ppz)$_3$ (3.27 eV), higher than the T1 level of the exciplex (2.38 eV) formed by 4,6mCzBP2Pm and Ir(ppz)$_3$, and is greater than the difference between the LUMO level of 4,6mCzBP2Pm and the HOMO level of Ir(ppz)$_3$ (2.59 eV). Thus, the exciplex formed by 4,6mCzBP2Pm and Ir(ppz)$_3$ can emit light efficiently.

Furthermore, it is found that the T1 level of 5Me-4,6mCzP2Pm (2.78 eV) is lower than the T1 level of Ir(ppz)$_3$ (3.27 eV), higher than the T1 level of the exciplex (2.40 eV) formed by 5Me-4,6mCzP2Pm and Ir(ppz)$_3$, and is greater than the difference between the LUMO level of 5Me-4,6mCzP2Pm and the HOMO level of Ir(ppz)$_3$ (2.66 eV). Thus, the exciplex formed by 5Me-4,6mCzP2Pm and Ir(ppz)$_3$ can emit light efficiently.

Moreover, it is found that the T1 level of 4,4'mCzP2BPy (2.77 eV) is lower than the T1 level of Ir(ppz)$_3$ (3.27 eV), higher than the T1 level of the exciplex (2.44 eV) formed by 4,4'mCzP2BPy and Ir(ppz)$_3$, and is equivalent to the difference between the LUMO level of 4,4'mCzP2BPy and the HOMO level of Ir(ppz)$_3$ (2.73 eV). Thus, the triplet excitation energy of the exciplex formed by 4,4'mCzP2BPy and Ir(ppz)$_3$ is likely to be transferred to the T1 level of 4,4'mCzP2BPy, and it is difficult for the exciplex to emit light efficiently. Furthermore, as shown in FIG. 36, the rising wavelength on the shorter wavelength side of the electroluminescence spectrum of the light-emitting element 6 is shorter than a wavelength (448 nm) that corresponds to the T1 level of 4,4'mCzP2BPy (2.77 eV). Accordingly, to obtain efficient light emission from an exciplex, it is preferable that the T1 level of each of compounds that form the exciplex be higher than energy obtained by conversion using the rising wavelength on the shorter wavelength side of the emission spectrum of the exciplex.

According to the above results, the difference between the T1 level of one of the first organic compound and the second organic compound having a lower T1 level and the T1 level of an exciplex formed by the first organic compound and the second organic compound is preferably large. Specifically, the T1 level of one of the first organic compound and the second organic compound having a lower T1 level is preferably higher than the T1 level of the exciplex formed by the first organic compound and the second organic compound by 0.35 eV or more. In addition, the difference between the T1 level of one of the first organic compound and the second organic compound having a lower T1 level and the difference between the lower LUMO level and the higher HOMO level of the first and second organic compounds is preferably large. Specifically, the T1 level of one of the first organic compound and the second organic compound having a lower T1 level is preferably greater than the difference between the lower LUMO level and the higher HOMO level of the first and second organic compounds by 0.1 eV or more.

When the measurement of emission spectrum of Ir(ppz)$_3$ was performed at room temperature, light emission from Ir(ppz)$_3$ was not observed. Non-Patent Document 1 discloses that the luminescence quantum yield of Ir(ppz)$_3$ is lower than 1% at room temperature. This indicates that Ir(ppz)$_3$ is a material that does not emit light at room temperature.

Each of the light-emitting elements 3 to 6 is a light-emitting element that emits light originating from the exciplex formed by the second organic compound (4,6mCzP2Pm, 4,6mCzBP2Pm, 5Me-4,6mCzP2Pm, or 4,4'mCzP2BPy) and the first organic compound (Ir(ppz)$_3$). This is because each of the light-emitting elements 3 to 6 emits, in addition to light originating from singlet excitons generated by recombination of carriers (holes and electrons) injected from the pair of electrodes, light originating from triplet excitons or light originating from singlet excitons generated from triplet excitons by reverse intersystem crossing in the exciplex. That is, even when a compound with a low luminescence quantum yield, which is lower than 1%, is used, one embodiment of the present invention can provide a light-emitting element with high luminous efficiency.

With one embodiment of the present invention, a light-emitting element with high luminous efficiency can be provided. With one embodiment of the present invention, a light-emitting element with low driving voltage and low power consumption can be provided.

Example 4

In this example, examples of fabrication methods of the light-emitting elements of one embodiment of the present invention will be described. The structure of each of the light-emitting elements fabricated in this example is the same as that illustrated in FIG. 1. Table 7 shows the details of the element structures. In addition, structures and abbreviations of compounds used here are given below. Note that Example 2 is referred to for structures and abbreviations of other compounds.

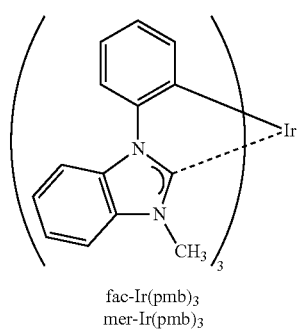

fac-Ir(pmb)₃
mer-Ir(pmb)₃ benzimidazolin-2-ylidene-C,$C^{2'}$)iridium(III) (abbreviation: mer-Ir(pmb)₃) were deposited to a thickness of 40 nm by co-evaporation at a weight ratio of 1:0.1 (4,6mCzP2Pm:mer-Ir(pmb)₃). In the light-emitting layer 130, mer-Ir(pmb)₃ corresponded to the first organic compound, and 4,6mCzP2Pm corresponded to the second organic compound.

<Characteristics of Light-Emitting Elements>

Next, the characteristics of the fabricated light-emitting elements 7 and 8 were measured. Note that the measurement method was similar to that used in Example 1.

Figure 40:
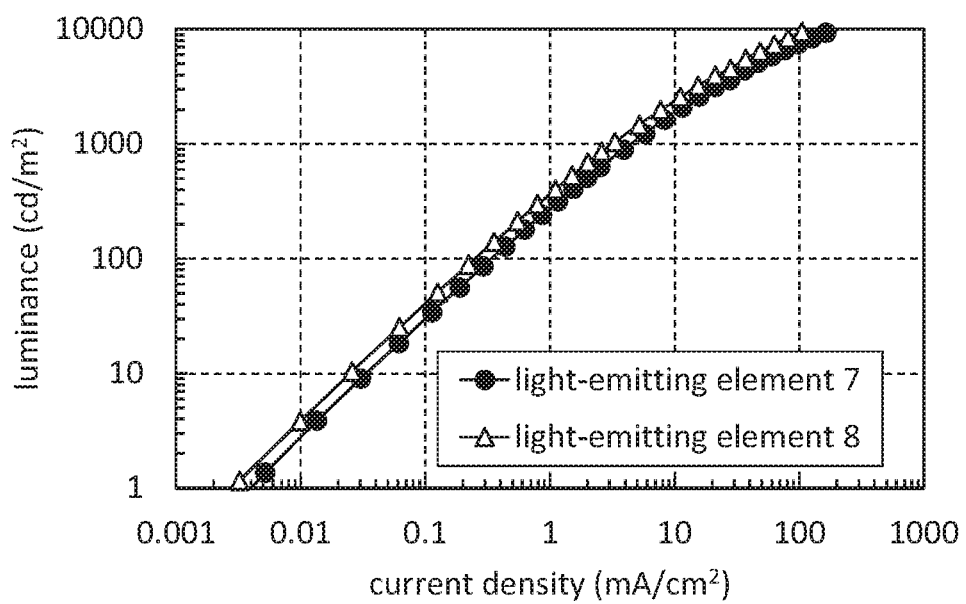
FIG. 40 shows the luminance-current density characteristics of light-emitting elements in Example.
Figure 41:
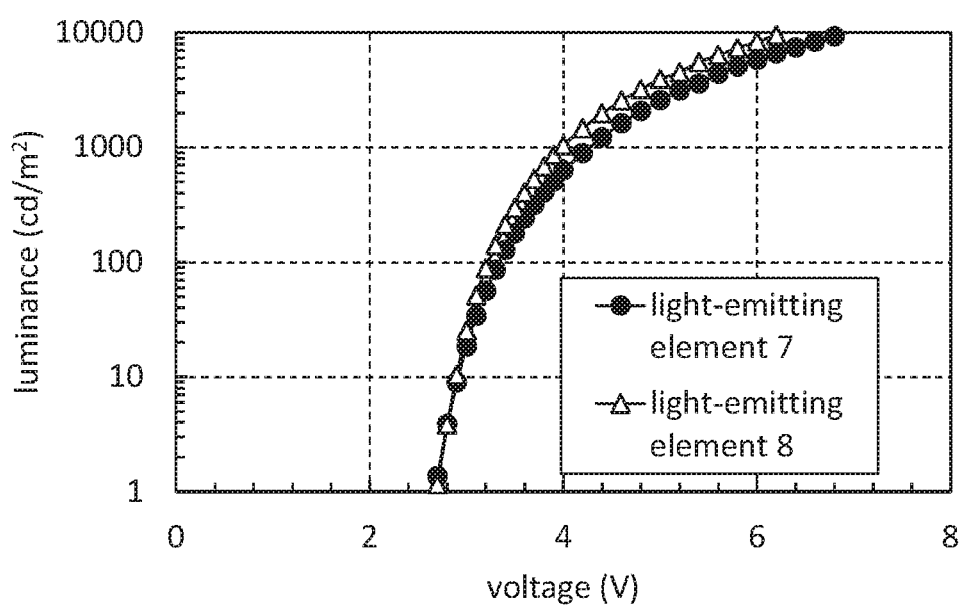
FIG. 41 shows the luminance-voltage characteristics of light-emitting elements in Example.
Figure 42:
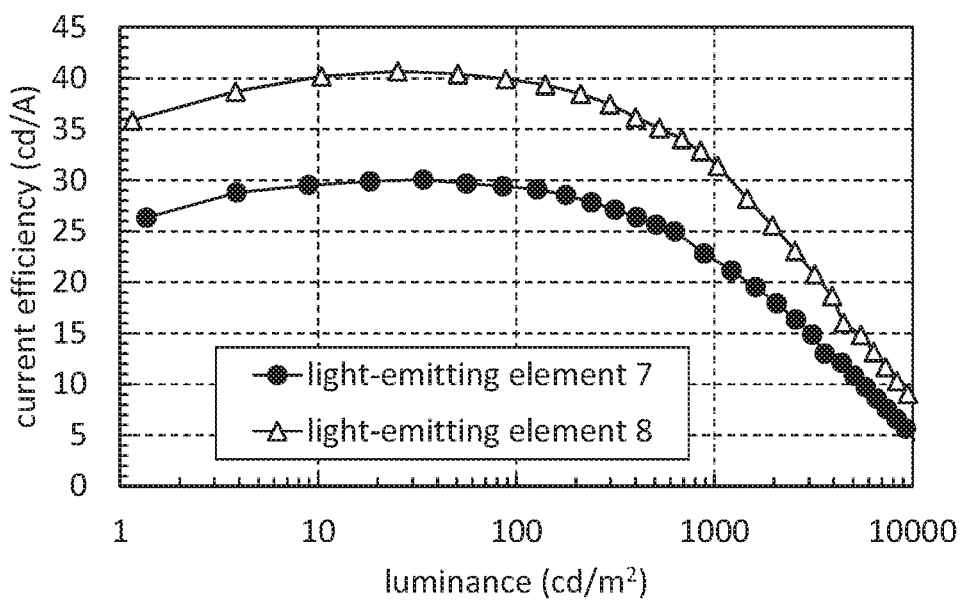
FIG. 42 shows the current efficiency-luminance characteristics of light-emitting elements in Example.

FIG. 40 shows the luminance-current density characteristics of the light-emitting elements 7 and 8. FIG. 41 shows the luminance-voltage characteristics thereof. FIG. 42 shows the current efficiency-luminance characteristics

TABLE 7

| Layer | | Reference numeral | Thickness (nm) | Material | Weight ratio |
|---|---|---|---|---|---|
| Light-emitting element 7 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:fac-Ir(pmb)₃ | 1:0.1 |
| | Hole-transport layer | 112 | 20 | mCzFLP | — |
| | Hole-injection layer | 111 | 60 | DBT3P-II:MoO₃ | 1:0.5 |
| | Electrode | 101 | 70 | ITSO | — |
| Light-emitting element 8 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:mer-Ir(pmb)₃ | 1:0.1 |
| | Hole-transport layer | 112 | 20 | mCzFLP | — |
| | Hole-injection layer | 111 | 60 | DBT3P-II:MoO₃ | 1:0.5 |
| | Electrode | 101 | 70 | ITSO | — |

<Fabrication of Light-Emitting Elements 7 and 8>

Methods for fabricating the light-emitting elements 7 and 8 fabricated in this example will be described below. The light-emitting elements 7 and 8 were fabricated through the same steps as those for the above-described light-emitting element 1 except for the step of forming the light-emitting layer 130.

As the light-emitting layer 130 of the light-emitting element 7, 4,6mCzP2Pm and fac-tris(1-phenyl-3-methyl-benzimidazolin-2-ylidene-C,$C^{2'}$)iridium(III) (abbreviation: fac-Ir(pmb)₃) were deposited to a thickness of 40 nm by co-evaporation at a weight ratio of 1:0.1 (4,6mCzP2Pm:fac-Ir(pmb)₃). In the light-emitting layer 130, fac-Ir(pmb)₃ corresponded to the first organic compound, and 4,6mCzP2Pm corresponded to the second organic compound.

Figure 43:
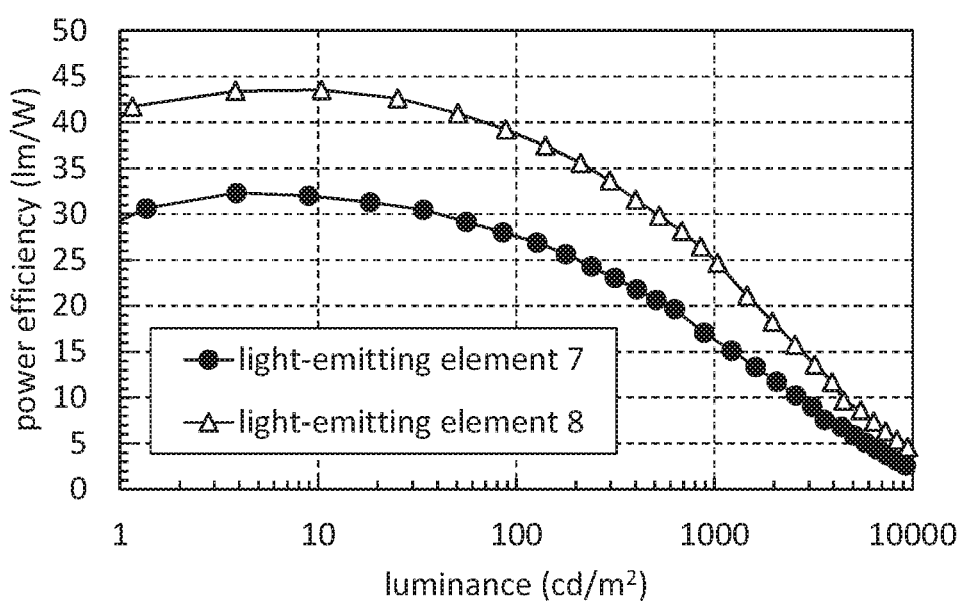
FIG. 43 shows the power efficiency-luminance characteristics of light-emitting elements in Example.
Figure 44:
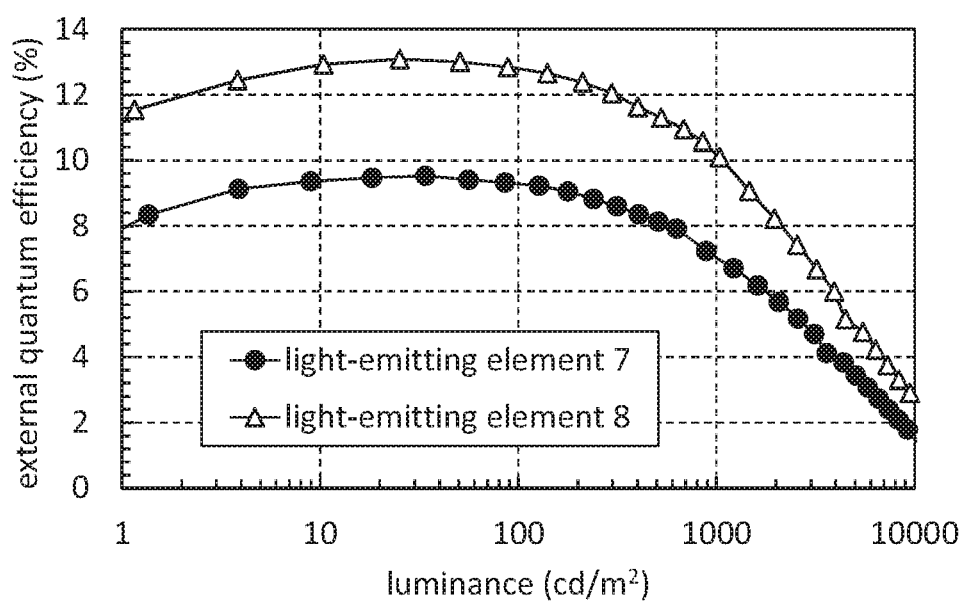
FIG. 44 shows the external quantum efficiency-luminance characteristics of light-emitting elements in Example.
Figure 45:
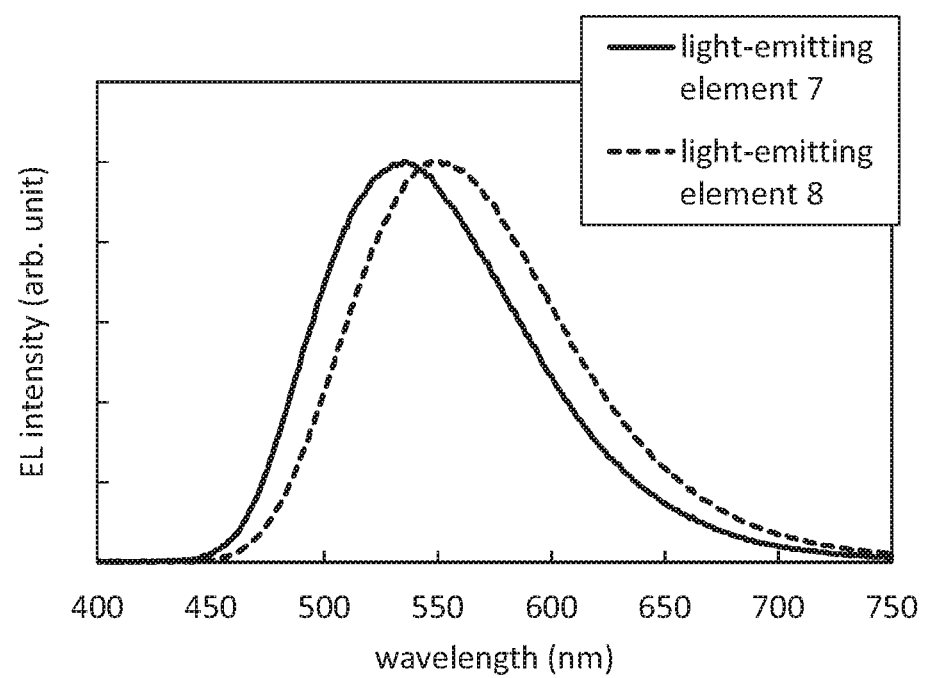
FIG. 45 shows electroluminescence spectra of light-emitting elements in Example.

As the light-emitting layer 130 of the light-emitting element 8, 4,6mCzP2Pm and mer-tris(1-phenyl-3-methylthereof. FIG. 43 shows the power efficiency-luminance characteristics thereof. FIG. 44 shows the external quantum efficiency-luminance characteristics thereof. FIG. 45 shows the electroluminescence spectra obtained when a current at a current density of 2.5 mA/cm² was supplied to the light-emitting elements 7 and 8. The measurements of the light-emitting elements were performed at room temperature (in an atmosphere kept at 23° C.).

Table 8 shows the element characteristics of the light-emitting elements 7 and 8 at around 1000 cd/m².

TABLE 8

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Light-emitting element 7 | 4.20 | 3.91 | (0.350, 0.559) | 890 | 22.8 | 17.1 | 7.23 |
| Light-emitting element 8 | 4.00 | 3.32 | (0.405, 0.550) | 1040 | 31.4 | 24.6 | 10.1 |

As shown in FIG. 45, the electroluminescence spectra of the light-emitting elements 7 and 8 have peaks at wavelengths of 536 nm and 551 nm, respectively, and have large full widths at half maximum of 106 nm and 109 nm, respectively. This indicates that the light-emitting elements 7 and 8 emit yellow light. Note that although fac-Ir(pmb)₃ and mer-Ir(pmb)₃ used for the light-emitting element 7 and the light-emitting element 8 were compounds that emit blue light as described later, no light emission originating from fac-Ir(pmb)$_3$ or mer-Ir(pmb)$_3$ was observed from the light-emitting elements 7 and 8.

As shown in FIG. 40 to FIG. 44 and Table 8, the driving voltage of each of the light-emitting elements 7 and 8 is low. Furthermore, the light-emitting elements 7 and 8 have high luminous efficiency (current efficiency, power efficiency, and external quantum efficiency). Accordingly, the light-emitting element of one embodiment of the present invention that contains the first organic compound (fac-Ir(pmb)$_3$ or mer-Ir(pmb)$_3$) and the second organic compound (4,6mCzP2Pm) is a light-emitting element with high luminous efficiency that drives at low driving voltage at low power consumption.

<CV Measurement Results>

The electrochemical characteristics (oxidation reaction characteristics and reduction reaction characteristics) of the above compounds were measured by cyclic voltammetry (CV) measurement. Note that the measurement method was similar to that used in Example 1.

According to the CV measurement results, the oxidation potential of fac-Ir(pmb)$_3$ was 0.55 V. The HOMO level of fac-Ir(pmb)$_3$ calculated from the CV measurement results was −5.49 eV. Thus, it is found that fac-Ir(pmb)$_3$ has a high HOMO level. The oxidation potential of mer-Ir(pmb)$_3$ was 0.38 V. The HOMO level of mer-Ir(pmb)$_3$ calculated from the CV measurement results was −5.32 eV. Thus, it is found that mer-Ir(pmb)$_3$ has a high HOMO level. Note that the LUMO levels of fac-Ir(pmb)$_3$ and mer-Ir(pmb)$_3$ are probably high because the reduction potentials of fac-Ir(pmb)$_3$ and mer-Ir(pmb)$_3$ were low and no clear reduction peak was observed.

As described above, the LUMO level of 4,6mCzP2Pm, which is the second organic compound, is lower than the LUMO level of each of fac-Ir(pmb)$_3$ and mer-Ir(pmb)$_3$, which are the first organic compounds. Furthermore, the HOMO level of 4,6mCzP2Pm, which is the second organic compound, is lower than the HOMO level of each of fac-Ir(pmb)$_3$ and mer-Ir(pmb)$_3$, which are the first organic compounds. Thus, in the case where the compounds are used in a light-emitting layer as in the light-emitting elements 7 and 8, electrons and holes, which serve as carriers, are efficiently injected from a pair of electrodes into the second organic compound (4,6mCzP2Pm) and the first organic compound (fac-Ir(pmb)$_3$ or mer-Ir(pmb)$_3$), respectively, so that the second organic compound (4,6mCzP2Pm) and the first organic compound (fac-Ir(pmb)$_3$ or mer-Ir(pmb)$_3$) can form an exciplex.

The exciplex formed by the second organic compound (4,6mCzP2Pm) and the first organic compound (fac-Ir(pmb)$_3$ or mer-Ir(pmb)$_3$) has the LUMO level in the second organic compound (4,6mCzP2Pm) and the HOMO level in the first organic compound (fac-Ir(pmb)$_3$ or mer-Ir(pmb)$_3$).

The energy difference between the LUMO level of 4,6mCzP2Pm and the HOMO level of fac-Ir(pmb)$_3$ is 2.61 eV. This value is substantially equal to light emission energy (2.31 eV) calculated from the peak wavelength of the electroluminescence spectrum of the light-emitting element 7 in FIG. 45. This result implies that the electroluminescence spectrum of the light-emitting element 7 corresponds to light emission due to the exciplex formed by 4,6mCzP2Pm and fac-Ir(pmb)$_3$. In the exciplex, the difference between the S1 level and the T1 level is small; thus, the light emission energy can be regarded as energy of each of the S1 level and the T1 level (2.31 eV). Furthermore, the excitation energy level of the exciplex formed by 4,6mCzP2Pm and fac-Ir(pmb)$_3$ is smaller than the energy difference between the LUMO level and the HOMO level of 4,6mCzP2Pm (i.e., 3.01 eV). Thus, when the exciplex is formed, a light-emitting element with low driving voltage can be obtained.

The energy difference between the LUMO level of 4,6mCzP2Pm and the HOMO level of mer-Ir(pmb)$_3$ is 2.44 eV. This value is substantially equal to light emission energy (2.25 eV) calculated from the peak wavelength of the electroluminescence spectrum of the light-emitting element 8 in FIG. 45. This result implies that the electroluminescence spectrum of the light-emitting element 8 corresponds to light emission due to the exciplex formed by 4,6mCzP2Pm and mer-Ir(pmb)$_3$. In the exciplex, the difference between the S1 level and the T1 level is small; thus, the light emission energy can be regarded as energy of each of the S1 level and the T1 level (2.25 eV). Furthermore, the excitation energy level of the exciplex formed by 4,6mCzP2Pm and mer-Ir(pmb)$_3$ is smaller than the energy difference between the LUMO level and the HOMO level of 4,6mCzP2Pm (i.e., 3.01 eV). Thus, when the exciplex is formed, a light-emitting element with low driving voltage can be obtained.

<Absorption Spectrum and Emission Spectrum of Compound>

Figure 46A:
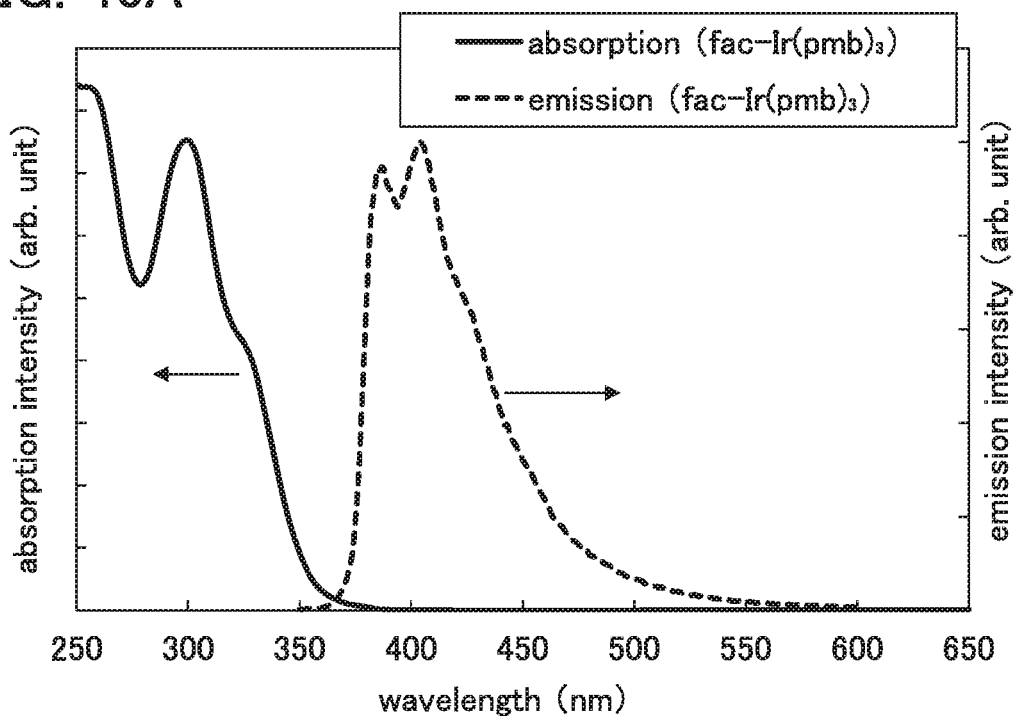
FIGS. 46A and 46B each show an absorption spectrum and an emission spectrum of a compound in Example.
Figure 46B:
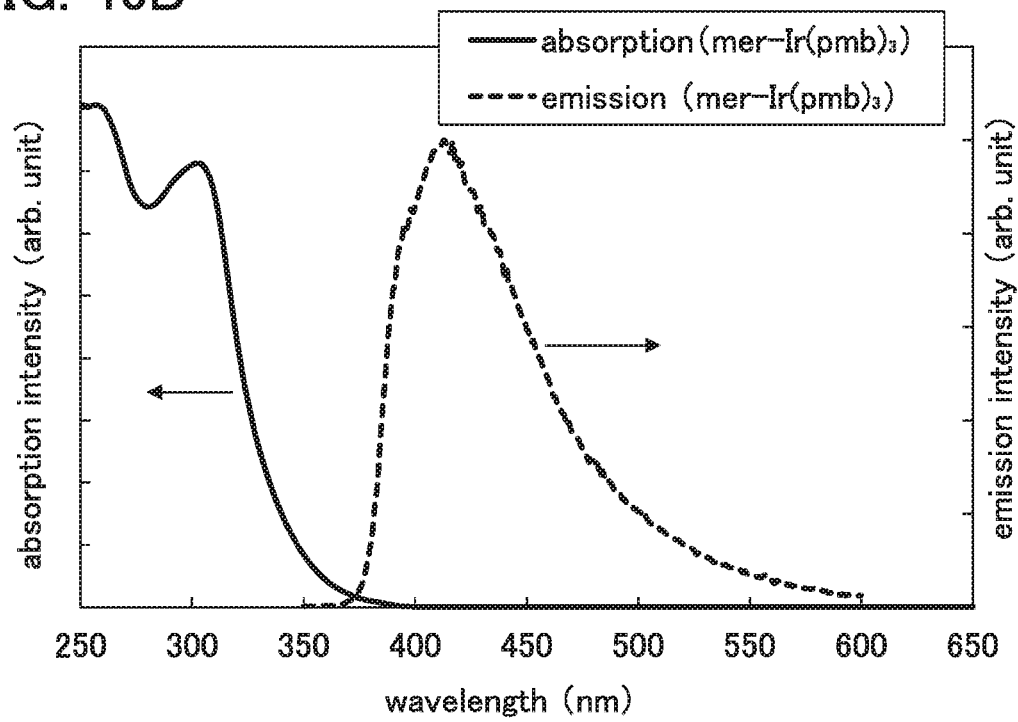

Next, FIGS. 46A and 46B show the measurement results of the absorption and emission spectra of fac-Ir(pmb)$_3$ and mer-Ir(pmb)$_3$.

For the measurement of the absorption and emission spectra, a dichloromethane solution in which fac-Ir(pmb)$_3$ or mer-Ir(pmb)$_3$ was dissolved was prepared, and a quartz cell was used. The absorption spectrum was measured using an ultraviolet-visible spectrophotometer (V-550, produced by JASCO Corporation). The absorption spectra of the quartz cell and dichloromethane were subtracted from the measured spectrum of the solution. Note that the emission spectrum of the solution was measured with a PL-EL measurement apparatus (produced by Hamamatsu Photonics K.K.). The measurement was performed at room temperature (in an atmosphere kept at 23° C.).

As shown in FIGS. 46A and 46B, an absorption edge on the lowest energy side (the longest wavelength side) of the absorption spectrum of each of fac-Ir(pmb)$_3$ and mer-Ir(pmb)$_3$ is at around 380 nm. The absorption edges were obtained from data of the absorption spectra, and transition energies were estimated on the assumption of direct transition, whereby transition energies of fac-Ir(pmb)$_3$ and mer-Ir(pmb)$_3$ were calculated to be 3.20 eV and 3.15 eV, respectively. Since fac-Ir(pmb)$_3$ and mer-Ir(pmb)$_3$ are each a phosphorescent compound, the absorption band on the lowest energy side is based on the transition to the triplet excited state. Therefore, the T1 levels of fac-Ir(pmb)$_3$ and mer-Ir(pmb)$_3$ are calculated to be 3.20 eV and 3.15 eV, respectively.

From the above measurement results, it is found that the T1 level of 4,6mCzP2Pm (2.70 eV) is lower than the T1 level of fac-Ir(pmb)$_3$ (3.20 eV), higher than the T1 level of the exciplex (2.31 eV) formed by 4,6mCzP2Pm and fac-Ir(pmb)$_3$, and is greater than the difference between the LUMO level of 4,6mCzP2Pm and the HOMO level of fac-Ir(pmb)$_3$ (2.61 eV). Thus, the exciplex formed by 4,6mCzP2Pm and fac-Ir(pmb)$_3$ can emit light efficiently.

Furthermore, it is found that the T1 level of 4,6mCzP2Pm (2.70 eV) is lower than the T1 level of mer-Ir(pmb)$_3$ (3.15 eV), higher than the T1 level of the exciplex (2.25 eV) formed by 4,6mCzP2Pm and mer-Ir(pmb)$_3$, and is greater than the difference between the LUMO level of 4,6mCzP2Pm and the HOMO level of mer-Ir(pmb)$_3$ (2.44 eV). Thus, the exciplex formed by 4,6mCzP2Pm and mer-Ir(pmb)$_3$ can emit light efficiently.

Moreover, the light-emitting element 8 was driven with higher efficiency and lower driving voltage than the light-emitting element 7. According to the above, the energy difference between either of the T1 levels of the first and second organic compounds, whichever is lower, and the T1 level of an exciplex formed by the first and second organic compounds is preferably large. Specifically, either of the T1 levels of the first and second organic compounds, whichever is lower, is preferably higher than the T1 level of the exciplex formed by the first and second organic compounds by 0.35 eV or more. In addition, the energy difference between either of the T1 levels of the first and second organic compounds, whichever is lower, and the difference between the lower LUMO level and the higher HOMO level of the first and second organic compounds is preferably large. Specifically, either of the T1 levels of the first and second organic compounds, whichever is lower, is preferably greater than the difference between the lower LUMO level and the higher HOMO level of the first and second organic compounds by 0.1 eV or more.

Non-Patent Document 1 discloses that the luminescence quantum yield of fac-Ir(pmb)$_3$ is 37% at room temperature. Thus, it is found that fac-Ir(pmb)$_3$ is a light-emitting material with a low luminescence quantum yield.

Each of the light-emitting elements 7 and 8 is a light-emitting element that emits light originating from the exciplex formed by the second organic compound (4,6mCzP2Pm) and the first organic compound (fac-Ir(pmb)$_3$ or mer-Ir(pmb)$_3$). The light-emitting elements 7 and 8 can have favorable element characteristics because each of the light-emitting elements 7 and 8 emits, in addition to light originating from singlet excitons generated by recombination of carriers (holes and electrons) injected from the pair of electrodes, light originating from triplet excitons or light originating from singlet excitons generated from triplet excitons by reverse intersystem crossing in the exciplex. That is, even when a compound with a low luminescence quantum yield is used, one embodiment of the present invention can provide a light-emitting element with high luminous efficiency.

With one embodiment of the present invention, a light-emitting element with high luminous efficiency can be provided. With one embodiment of the present invention, a light-emitting element with low driving voltage and low power consumption can be provided.

Example 5

In this example, examples of fabrication methods of the light-emitting element 3, which was the light-emitting element of one embodiment of the present invention, and a comparative light-emitting element 9 will be described. In the comparative light-emitting element 9, host materials that form an exciplex in a light-emitting layer and do not has a function of converting triplet excitation energy into light emission were used. The structure of each of the light-emitting elements fabricated in this example is the same as that illustrated in FIG. 1. Table 9 shows the details of the element structures. In addition, structures and abbreviations of compounds used here are given below. Note that Examples 1 to 4 are referred to for structures and abbreviations of other compounds.

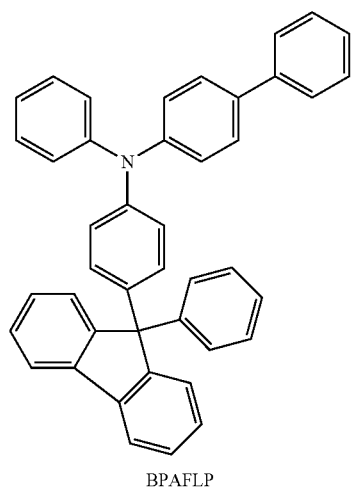

BPAFLP

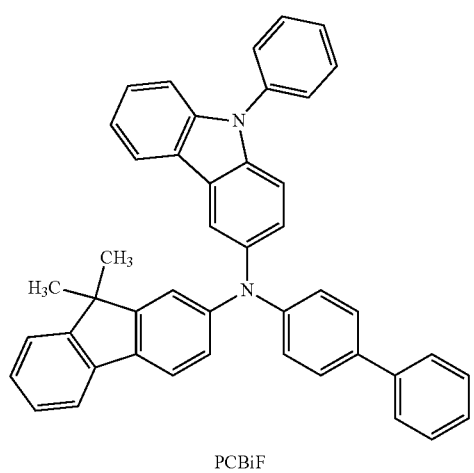

PCBiF

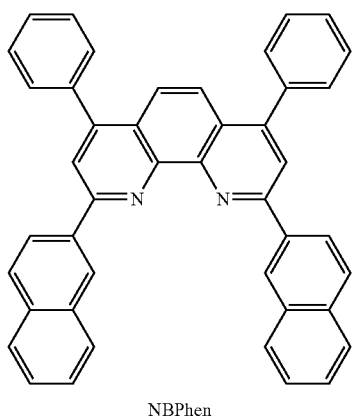

NBPhen

TABLE 9

| Layer | | Reference numeral | Thickness (nm) | Material | Weight ratio |
|---|---|---|---|---|---|
| Light-emitting element 3 | Electrode | 102 | 200 | Al | — |
| | Electron-injection layer | 119 | 1 | LiF | — |
| | Electron-transport layer | 118 (2) | 10 | BPhen | — |
| | | 118 (1) | 20 | 4,6mCzP2Pm | — |
| | Light-emitting layer | 130 | 40 | 4,6mCzP2Pm:Ir(ppz)$_3$ | 1:0.1 |
| | Hole-transport layer | 112 | 20 | mCzFLP | — |
| | Hole-injection layer | 111 | 60 | DBT3P-II:MoO$_3$ | 1:0.5 |
| | Electrode | 101 | 70 | ITSO | — |
| Comparative light-emitting element 9 | Electrode | 102 | 200 | Al | — |
| | Electron-injection layer | 119 | 1 | LiF | — |
| | Electron-transport layer | 118 (2) | 15 | NBPhen | — |
| | | 118 (1) | 20 | 4,6mCzP2Pm | — |
| | Light-emitting layer | 130 | 40 | 4,6mCzP2Pm:PCBiF | 0.8:0.2 |
| | Hole-transport layer | 112 | 20 | BPAFLP | — |
| | Hole-injection layer | 111 | 40 | DBT3P-II:MoO$_3$ | 1:0.5 |
| | Electrode | 101 | 70 | ITSO | — |

<Fabrication of Comparative Light-Emitting Element 9>

As the electrode 101, an ITSO film was formed to a thickness of 70 nm over a glass substrate. The electrode area of the electrode 101 was set to 4 mm$^2$ (2 mm×2 mm).

As the hole-injection layer 111, DBT3P-II and molybdenum oxide (MoO$_3$) were deposited to a thickness of 40 nm over the electrode 101 by co-evaporation at a weight ratio of 1:0.5 (DBT3P-II:MoO$_3$).

As the hole-transport layer 112, 4-phenyl-4'-(9-phenylfluoren-9-yl)triphenylamine (abbreviation: BPAFLP) was deposited over the hole-injection layer 111 by evaporation to a thickness of 20 nm.

As the light-emitting layer 130, 4,6mCzP2Pm and N-(4-biphenyl)-N-(9,9-dimethyl-9H-fluoren-2-yl)-9-phenyl-9H-carbazol-3-amine (abbreviation: PCBiF) were deposited to a thickness of 40 nm over the hole-transport layer 112 by co-evaporation at a weight ratio of 0.8:0.2 (4,6mCzP2Pm:PCBiF).

As the electron-transport layer 118, 4,6mCzP2Pm and 2,9-bis(naphthalen-2-yl)-4,7-diphenyl-1,10-phenanthroline (abbreviation: NBPhen) were sequentially deposited by evaporation to thicknesses of 20 nm and 15 nm, respectively, over the light-emitting layer 130. Then, as the electron-injection layer 119, LiF was deposited over the electron-transport layer 118 by evaporation to a thickness of 1 nm.

As the electrode 102, aluminum (Al) was formed over the electron-injection layer 119 to a thickness of 200 nm.

Next, in a glove box containing a nitrogen atmosphere, the electrodes and the EL layer were sealed by fixing a glass substrate for sealing to the glass substrate on which the organic materials were deposited using a sealant for an organic EL device. Specifically, after the sealant was applied so as to surround the organic materials deposited on the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above process, the comparative light-emitting element 9 was fabricated.

<Characteristics of Light-Emitting Elements>

Next, the characteristics of the fabricated light-emitting element 3 and comparative light-emitting element 9 were measured. Note that the measurement method was similar to that used in Example 1.

Figure 47:
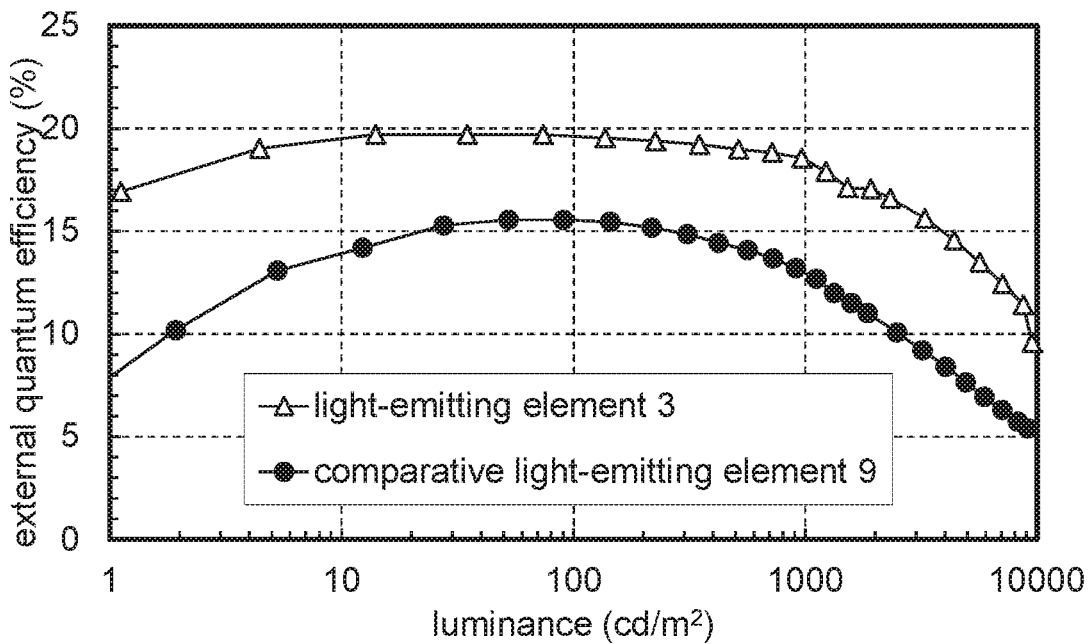
FIG. 47 shows the external quantum efficiency-luminance characteristics of light-emitting elements in Example.
Figure 48:
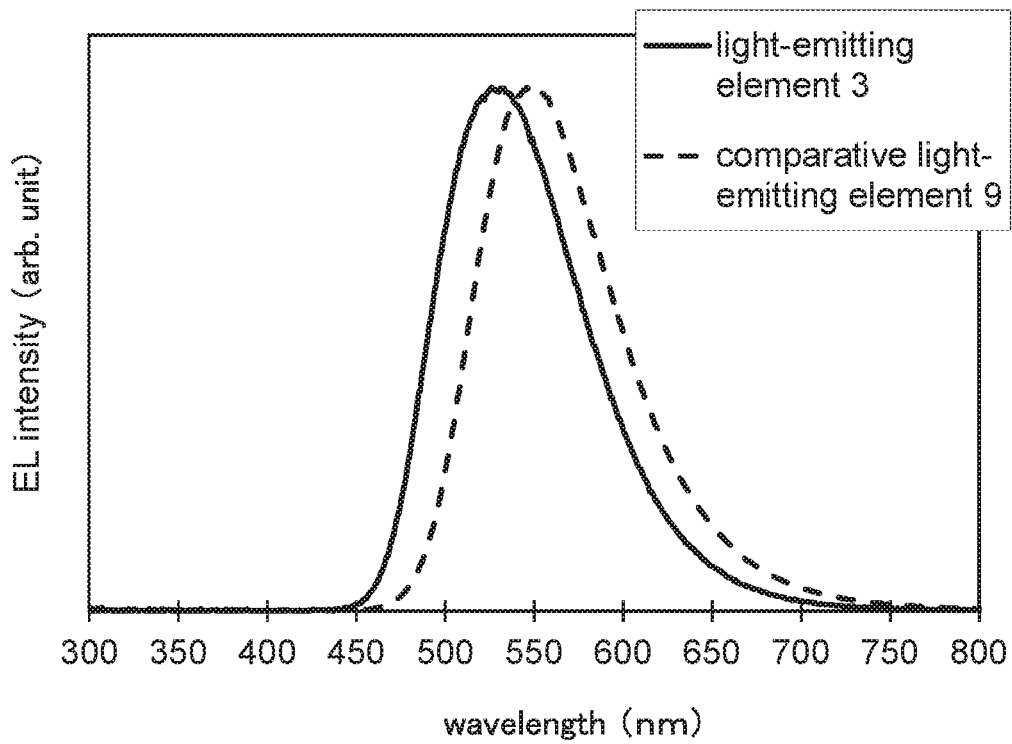
FIG. 48 shows electroluminescence spectra of light-emitting elements in Example.

FIG. 47 shows the external quantum efficiency-luminance characteristics of the light-emitting element 3 and the comparative light-emitting element 9. FIG. 48 shows the electroluminescence spectra obtained when a current at a current density of 2.5 mA/cm$^2$ was supplied to the light-emitting element 3 and the comparative light-emitting element 9. The measurements of the light-emitting elements were performed at room temperature (in an atmosphere kept at 23° C.).

Table 10 shows the element characteristics of the light-emitting element 3 and the comparative light-emitting element 9 at around 1000 cd/m$^2$.

TABLE 10

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 3 | 3.60 | 1.57 | (0.327, 0.580) | 970 | 61.3 | 53.5 | 18.6 |
| Comparative light-emitting element 9 | 3.60 | 2.05 | (0.402, 0.570) | 910 | 44.5 | 38.8 | 13.2 |

As shown in FIG. 48, the light-emitting element 3 and the comparative light-emitting element 9 have peaks at wavelengths of 526 nm and 548 nm, respectively, and have large full widths at half maximum are 95 nm and 91 nm, respectively. This indicates that the light-emitting element 3 and the comparative light-emitting element 9 emit yellow light. As described above, light emission obtained from the light-emitting element 3 is light emission from the exciplex formed by 4,6mCzP2Pm and Ir(ppz)$_3$.

The light emission energy calculated from the peak wavelength of light emission obtained from the comparative light-emitting element 9 is 2.26 eV. This value is substantially equal to the energy difference (2.38 eV) between the LUMO level of 4,6mCzP2Pm (−2.88 eV) and the HOMO level of PCBiF (−5.26 eV), which is calculated by the CV measurement described in Example 1. That is, it can be said that light emission obtained from the comparative light-emitting element 9 is light emission originating from the exciplex formed by 4,6mCzP2Pm and PCBiF in the light-emitting layer.

FIG. 47 and Table 10 show that the light-emitting element 3 has higher external quantum efficiency than the comparative light-emitting element 9. This is because a compound containing a heavy atom was used as one of compounds that form an exciplex in the light-emitting element 3. With one embodiment of the present invention, a light-emitting element with high luminous efficiency can be provided.

<Quantum Yield Measurement of Thin Film>

Next, the quantum yield of a mixed film of 4,6mCzP2Pm and Ir(ppz)$_3$ used in the light-emitting layer of the light-emitting element 3 was measured. To fabricate a measurement sample, 4,6mCzP2Pm and Ir(ppz)$_3$ were deposited by evaporation to have a thickness of 40 nm and a weight ratio (4,6mCzP2Pm:Ir(ppz)$_3$) of 1:0.1 over a quartz substrate and were sealed in a glove box containing a nitrogen atmosphere so as not to be exposed to the air. The measurement was performed with the use of an absolute PL quantum yield measurement system (C11347-01 produced by Hamamatsu Photonics K.K.) at room temperature.

The obtained quantum yield of the mixed film of 4,6mCzP2Pm and Ir(ppz)$_3$ was 64%. Assuming that the light extraction efficiency of glass is approximately 30%, the external quantum efficiency of the light-emitting element 3 is estimated to be approximately 19%. As shown in FIG. 47, the maximum external quantum efficiency of the light-emitting element 3 is 19.7%, which is substantially the same as the estimated value obtained from the measurement results of the quantum yield of the mixed film of 4,6mCzP2Pm and Ir(ppz)$_3$. This indicates that the loss of excitons generated in the light-emitting element is mostly due to the quantum efficiency of the mixed film of 4,6mCzP2Pm and Ir(ppz)$_3$. Accordingly, not only singlet excitons but also triplet excitons, that is, all generated excitons are considered to contribute to light emission. This is probably because a compound containing a heavy atom was used as one of the compounds that form an exciplex.

<Transient EL Measurement of Thin Films>

Figure 49:
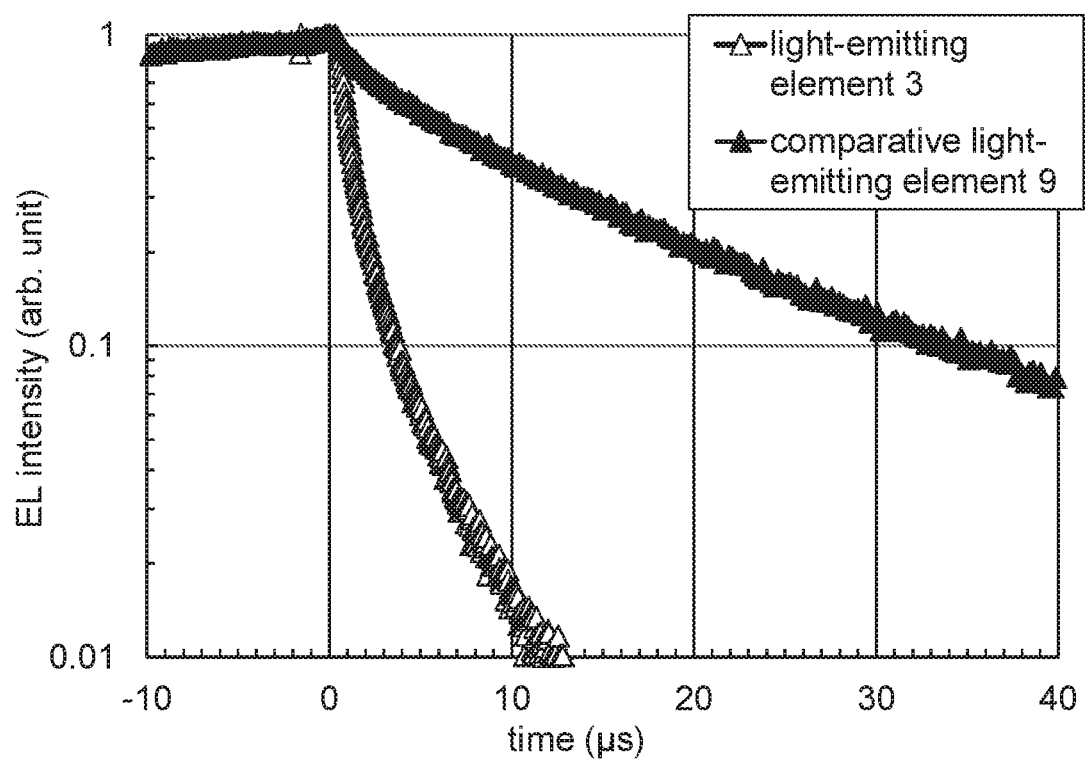
FIG. 49 shows transient EL curves of light-emitting elements in Example.

Next, the light-emitting element 3 and the comparative light-emitting element 9 were subjected to transient EL measurement. A picosecond fluorescence lifetime measurement system (manufactured by Hamamatsu Photonics K.K.) was used for the measurement. To measure the lifetimes of fluorescence in the light-emitting elements, a square wave pulse voltage was applied to the light-emitting elements, and time-resolved measurement of light, which was attenuated from the falling of the voltage, was performed using a streak camera. The pulse voltage was applied at a frequency of 10 Hz. By integrating data obtained by repeated measurement, data with a high S/N ratio was obtained. The measurement was performed at room temperature (300 K) under the conditions of a pulse voltage of approximately 3 V, a pulse time width of 100 μsec, a negative bias voltage of −5 V, and a measurement time of 20 μsec for the light-emitting element 3 and 50 μsec for the comparative light-emitting element 9. FIG. 49 shows the results.

As shown in FIG. 49, the comparative light-emitting element 9 contains a large proportion of delayed fluorescent components and the light emission lifetime is extremely long. In contrast, the proportion of delayed fluorescent components contained in the light-emitting element 3 is not large; however, the external quantum efficiency of the light-emitting element 3 is higher than that of the comparative light-emitting element 9 as shown in FIG. 47. In addition, as shown in FIG. 49, the light emission lifetime of the light-emitting element 3 is extremely short. This indicates that the excited state is deactivated to the ground state in a short time. Such a light-emitting element with a short light emission lifetime is highly reliable, which is preferable.

It is probable that, since the light-emitting element 3 contains Ir, which is a heavy atom, in the material used for the exciplex, the behavior of the exciplex in the light-emitting element 3 is different from those of the exciplex formed using normal host materials and the TADF material.

With one embodiment of the present invention, a light-emitting element with high luminous efficiency can be provided. In addition, with one embodiment of the present invention, a highly reliable light-emitting element can be provided.

This application is based on Japanese Patent Application serial no. 2016-093149 filed with Japan Patent Office on May 6, 2016, the entire contents of which are hereby incorporated by reference.

What is claimed is:

1. A light-emitting element comprising a light-emitting layer comprising a first organic compound and a second organic compound,
   wherein a LUMO level of one of the first organic compound and the second organic compound is higher than or equal to a LUMO level of the other of the first organic compound and the second organic compound,
   wherein a HOMO level of the one of the first organic compound and the second organic compound is higher than or equal to a HOMO level of the other of the first organic compound and the second organic compound,
   wherein a combination of the first organic compound and the second organic compound is capable of forming an exciplex,
   wherein the first organic compound is capable of converting triplet excitation energy into light emission,
   wherein the first organic compound has a luminescence quantum yield higher than or equal to 0% and lower than or equal to 40% at room temperature, and
   wherein light emitted from the light-emitting layer comprises light emitted from the exciplex.

2. The light-emitting element according to claim 1, wherein a lowest triplet excitation energy level of the first organic compound is higher than or equal to a lowest triplet excitation energy level of the second organic compound.

3. The light-emitting element according to claim 1, wherein the first organic compound comprises a ligand coordinated to Ir.

4. The light-emitting element according to claim 3, wherein the ligand comprises a nitrogen-containing five-membered heterocyclic skeleton.

5. The light-emitting element according to claim 1,
   wherein the second organic compound is capable of transporting an electron, and
   wherein the second organic compound comprises a π-electron deficient heteroaromatic skeleton.

6. The light-emitting element according to claim 1, wherein the exciplex is capable of emitting light with luminous efficiency higher than luminous efficiency of light emitted from the first organic compound.

7. A display device comprising:
   the light-emitting element according to claim 1; and
   at least one of a color filter and a transistor.

8. A light-emitting element comprising a light-emitting layer comprising a first organic compound and a second organic compound,
- wherein a LUMO level of one of the first organic compound and the second organic compound is higher than or equal to a LUMO level of the other of the first organic compound and the second organic compound,
- wherein a HOMO level of the one of the first organic compound and the second organic compound is higher than or equal to a HOMO level of the other of the first organic compound and the second organic compound,
- wherein a combination of the first organic compound and the second organic compound is capable of forming an exciplex,
- wherein the first organic compound is capable of not emitting fluorescence,
- wherein the first organic compound is capable of emitting phosphorescence,
- wherein the first organic compound has a luminescence quantum yield higher than or equal to 0% and lower than or equal to 40% at room temperature, and
- wherein light emitted from the light-emitting layer comprises light emitted from the exciplex.

9. The light-emitting element according to claim 8, wherein a lowest triplet excitation energy level of the first organic compound is higher than or equal to a lowest triplet excitation energy level of the second organic compound.

10. The light-emitting element according to claim 8, wherein the first organic compound comprises a ligand coordinated to Ir.

11. The light-emitting element according to claim 10, wherein the ligand comprises a nitrogen-containing five-membered heterocyclic skeleton.

12. The light-emitting element according to claim 8,
- wherein the second organic compound is capable of transporting an electron, and
- wherein the second organic compound comprises a π-electron deficient heteroaromatic skeleton.

13. The light-emitting element according to claim 8, wherein the exciplex is capable of emitting light with luminous efficiency higher than luminous efficiency of light emitted from the first organic compound.

14. A display device comprising:
the light-emitting element according to claim 8; and
at least one of a color filter and a transistor.

15. A light-emitting element comprising a light-emitting layer comprising a first organic compound and a second organic compound,
- wherein a LUMO level of one of the first organic compound and the second organic compound is higher than or equal to a LUMO level of the other of the first organic compound and the second organic compound,
- wherein a HOMO level of the one of the first organic compound and the second organic compound is higher than or equal to a HOMO level of the other of the first organic compound and the second organic compound,
- wherein a combination of the first organic compound and the second organic compound is capable of forming an exciplex,
- wherein the first organic compound comprises Ru, Rh, Pd, Os, Ir, or Pt,
- wherein the first organic compound has a luminescence quantum yield higher than or equal to 0% and lower than or equal to 40% at room temperature, and
- wherein light emitted from the light-emitting layer comprises light emitted from the exciplex.

16. The light-emitting element according to claim 15, wherein a lowest triplet excitation energy level of the first organic compound is higher than or equal to a lowest triplet excitation energy level of the second organic compound.

17. The light-emitting element according to claim 15, wherein the first organic compound comprises a ligand coordinated to Ir.

18. The light-emitting element according to claim 17, wherein the ligand comprises a nitrogen-containing five-membered heterocyclic skeleton.

19. The light-emitting element according to claim 15,
- wherein the second organic compound is capable of transporting an electron, and
- wherein the second organic compound comprises a π-electron deficient heteroaromatic skeleton.

20. The light-emitting element according to claim 15, wherein the exciplex is capable of emitting light with luminous efficiency higher than luminous efficiency of light emitted from the first organic compound.

21. A display device comprising:
the light-emitting element according to claim 15; and
at least one of a color filter and a transistor.

* * * * *